US012690372B2

(12) United States Patent
Mun et al.

(10) Patent No.: US 12,690,372 B2
(45) Date of Patent: Jul. 21, 2026

(54) DISPLAY DEVICE FOR IMPROVING DISPLAY QUALITY, AND METHOD FOR FABRICATION THEREOF

(71) Applicant: Samsung Display Co., LTD., Yongin-si (KR)

(72) Inventors: Hyo Young Mun, Yongin-si (KR); Young Ji Kim, Yongin-si (KR); Yong Seung Park, Yongin-si (KR); Yi Seul Um, Yongin-si (KR); So Young Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 458 days.

(21) Appl. No.: 18/307,458

(22) Filed: Apr. 26, 2023

(65) Prior Publication Data

US 2024/0099108 A1 Mar. 21, 2024

(30) Foreign Application Priority Data

Sep. 16, 2022 (KR) ........................ 10-2022-0117172

(51) Int. Cl.
*H10K 59/12* (2023.01)
*H10K 59/124* (2023.01)
*H10K 59/80* (2023.01)

(52) U.S. Cl.
CPC ..... *H10K 59/8731* (2023.02); *H10K 59/1201* (2023.02); *H10K 59/124* (2023.02)

(58) Field of Classification Search
CPC ........... H10K 59/8731; H10K 59/1201; H10K 59/124

USPC .......................................................... 257/72
See application file for complete search history.

(56) References Cited

U.S. PATENT DOCUMENTS

| | | | |
|---|---|---|---|
| 2019/0189967 A1* | 6/2019 | Lee ...................... | H10K 59/879 |
| 2020/0127231 A1* | 4/2020 | Yun ...................... | H10K 59/124 |
| 2021/0159446 A1* | 5/2021 | Xu ...................... | H01L 21/3213 |
| 2022/0149321 A1 | 5/2022 | Jeon et al. | |
| 2022/0263050 A1 | 8/2022 | Roh et al. | |
| 2024/0040830 A1 | 2/2024 | Yun et al. | |

FOREIGN PATENT DOCUMENTS

| | | |
|---|---|---|
| EP | 4 016 635 A1 | 6/2022 |
| KR | 10-2023-0160664 | 11/2023 |
| KR | 10-2024-0015219 | 2/2024 |

* cited by examiner

*Primary Examiner* — Phuc T Dang
(74) *Attorney, Agent, or Firm* — Womble Bond Dickinson (US) LLP

(57) ABSTRACT

A display device includes a substrate including a first surface, a second surface opposite to the first surface, a lateral side meeting the first surface, and an inclined surface between the lateral side and the second surface, a light-emitting element layer above the first surface of the substrate, dams surrounding the light-emitting element layer in plan view, an encapsulating layer covering the light-emitting element layer and the dams, and an organic planarization layer above the encapsulating layer, covering the encapsulating layer and the dams, extending to be adjacent to an edge of the substrate, and having a lateral side that forms an inclination, and that is spaced inwardly from the lateral side of the substrate, wherein a distance between the lateral side of the organic planarization layer and the lateral side of the substrate is less than a planar width of the inclined surface of the substrate.

16 Claims, 38 Drawing Sheets

DISPLAY DEVICE FOR IMPROVING DISPLAY QUALITY, AND METHOD FOR FABRICATION THEREOF

CROSS-REFERENCE TO RELATED APPLICATION

This application claims priority to, and the benefit of, Korean Patent Application No. 10-2022-0117172 filed on Sep. 16, 2022, in the Korean Intellectual Property Office, the contents of which in its entirety are herein incorporated by reference.

BACKGROUND

1. Field

The present disclosure relates to a display device and a method for fabricating thereof.

2. Description of the Related Art

As the information society develops, the demand for a display device for displaying an image is increasing in various forms. For example, the display device is applied to various electronic devices, such as a smart phone, a digital camera, a notebook computer, a navigation system, and a smart television. The display device may be a flat panel display device, such as a liquid crystal display device, a field emission display device, or an organic light-emitting display device. Among the flat panel display devices, the light-emitting display device includes a light-emitting element in which each pixel of the display panel may emit light by itself, so that an image may be displayed without a backlight unit for providing light to the display panel.

The display device includes a display area for displaying an image, and a non-display area arranged to surround the periphery of the display area, for example, the display area. Recently, the width of the non-display area is gradually decreasing to increase immersion in the display area, and to increase an aesthetics of the display device.

The display device may include a display layer for emitting light, an encapsulation layer for sealing the display layer, and a polarizing film located on the encapsulation layer to reduce or prevent reflection of external light. The encapsulation layer may have an inclined surface that is gently inclined at the periphery of the display device. When the polarizing film is attached along this inclined surface, external light may be reflected from the polarizing film and visually recognized by the user.

SUMMARY

Aspects of embodiments of the present disclosure provide a display device capable of improving display quality and a method for manufacturing the same.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to an aspect of the present disclosure, a display device includes a substrate including a first surface, a second surface opposite to the first surface, a lateral side meeting the first surface, and an inclined surface between the lateral side and the second surface, a light-emitting element layer above the first surface of the substrate, dams surrounding the light-emitting element layer in plan view, an encapsulating layer covering the light-emitting element layer and the dams, and an organic planarization layer above the encapsulating layer, covering the encapsulating layer and the dams, extending to be adjacent to an edge of the substrate, and having a lateral side that forms an inclination, and that is spaced inwardly from the lateral side of the substrate, wherein a distance between the lateral side of the organic planarization layer and the lateral side of the substrate is less than a planar width of the inclined surface of the substrate.

The substrate may include a display area in which the light-emitting element layer is located, a through hole in the display area, and a non-display area around the display area, wherein the edge of the substrate is at the non-display area or the through hole.

The encapsulating layer may include a first encapsulating inorganic film above the light-emitting element layer and the dams, an encapsulation organic layer above the first encapsulating inorganic layer, and a second encapsulating inorganic layer above the encapsulating organic layer.

The organic planarization layer may directly contact an upper surface of the second encapsulating inorganic layer, wherein an angle between a side of the organic planarization layer and the upper surface of the second encapsulating inorganic layer is about 90 degrees or less.

A planar width of the lateral side of the organic planarization layer may be in a range of about 10 μm to about 150 μm.

A distance between a point of the lateral side of the organic planarization layer and the lateral side of the substrate may be about 50 μm or less.

The display device may further include a polarizing film above the organic planarization layer, and directly attached to an upper surface of the organic planarization layer.

A distance between a point of the lateral side of the organic planarization layer and the lateral side of the substrate may be less than a distance between the lateral side of the substrate and one of the dams that is adjacent to the lateral side of the substrate.

The display device may further include a crack dam between the dams and the lateral side of the substrate, and covered by the organic planarization layer.

A distance between a point of the lateral side of the organic planarization layer and the lateral side of the substrate may be less than a distance between the crack dam and the lateral side of the substrate.

According to an aspect of the present disclosure, a display device includes a substrate defining a through hole, a light-emitting element layer above the substrate, dams surrounding the light-emitting element layer in plan view, an encapsulating layer covering the light-emitting element layer and the dams, and an organic planarization layer above the encapsulating layer, and protruding further than a lateral side of the substrate in the through hole.

The encapsulating layer may include a first encapsulating inorganic layer above the light-emitting element layer and the dams, an encapsulation organic layer above the first encapsulating inorganic layer, and a second encapsulating inorganic layer above the encapsulating organic layer, wherein the organic planarization layer directly contacts an upper surface of the second encapsulating inorganic layer.

A lateral side of the organic planarization layer may be inclined, wherein an angle between the lateral side of the organic planarization layer and a top surface of the second inorganic encapsulating layer is about 90 degrees or less.

A lateral side of the first encapsulating inorganic layer and a lateral side of the second encapsulating inorganic layer may protrude outward from the lateral side of the substrate.

A lateral side of the organic planarization layer and the lateral side of the second encapsulating inorganic layer may meet each other.

The display device may further include a thin film transistor layer between the substrate and the light-emitting element layer, and including a first buffer layer, a gate insulating layer, a first interlayer insulating layer, and a second interlayer insulating layer, wherein lateral sides of the first buffer layer, the gate insulating layer, the first interlayer insulating layer, and the second interlayer insulating layer protrude outwardly from the lateral side of the substrate.

According to an aspect of the present disclosure, a method for fabricating a display device includes forming display cells above a first surface of a mother substrate, forming an organic planarization layer above the mother substrate, removing a portion of the organic planarization layer by irradiating a first laser on the first surface of the mother substrate, forming first laser irradiation areas for cutting the display cells by irradiating a second laser on a second surface of the mother substrate that is opposite to the first surface of the mother substrate, forming second laser irradiation areas for forming a through hole in the display cells by irradiating a third laser onto the first surface of the mother substrate, and separating the display cells by spraying an etchant on the second surface of the mother substrate to cut the mother substrate along the first laser irradiation area and the second laser irradiation area.

An area from which the organic planarization layer is partially removed may correspond to the through hole of the display cells.

A processing speed of the second laser may be greater than a processing speed of the third laser.

A repetition rate of the second laser may be about 10 kHz to about 250 kHz, and a repetition rate of the third laser may be about 1 kHz to about 50 kHz.

A processing speed of the second laser may be about 10 mm/s to about 250 mm/s, and a processing speed of the third laser may be about 1 mm/s to about 50 mm/s.

A pulse energy of the second laser and a pulse energy of the third laser may range from about 10 uJ to about 300 uJ.

The method may further include attaching a protective film on the display cells before irradiating the second laser, and detaching the protective film from each of the display cells after extracting the display cells.

In the display device, and the method for manufacturing the same according to one or more embodiments, the upper polarizing film may be suitably attached by flattening the lower step, and reflection of external light resulting from the inclined surface of the polarizing film may be reduced or prevented by forming an organic planarization layer.

In addition, it is possible to increase the efficiency of the manufacturing process, because it is possible to reduce a thickness of a mother substrate, and to separate the substrates of each of the plurality of display cells from the mother substrate, as well as to form a through hole by using an etching process that sprays an etchant after laser irradiation.

In addition, it is possible to reduce or prevent the generation of foreign substances due to the organic planarization layer, and to reduce or prevent deformation of the organic planarization layer by removing the organic planarization layer at the edge of the substrate and the through hole area through laser ablation. In addition, the transmittance of the substrate may be increased, and the laser absorption rate in the laser-cutting process after laser ablation may be increased to improve processability by removing the organic planarization layer.

The aspects of the present disclosure are not limited to the aforementioned aspects, and various other aspects are included in the present specification.

BRIEF DESCRIPTION OF THE DRAWINGS

FIG. 16 is a cross-sectional view illustrating an example of the display panel taken along the line V-V' of FIG. 15.

FIGS. 21 to 35 are views for explaining a method of manufacturing a display device according to one or more embodiments.

DETAILED DESCRIPTION

Figure 1:
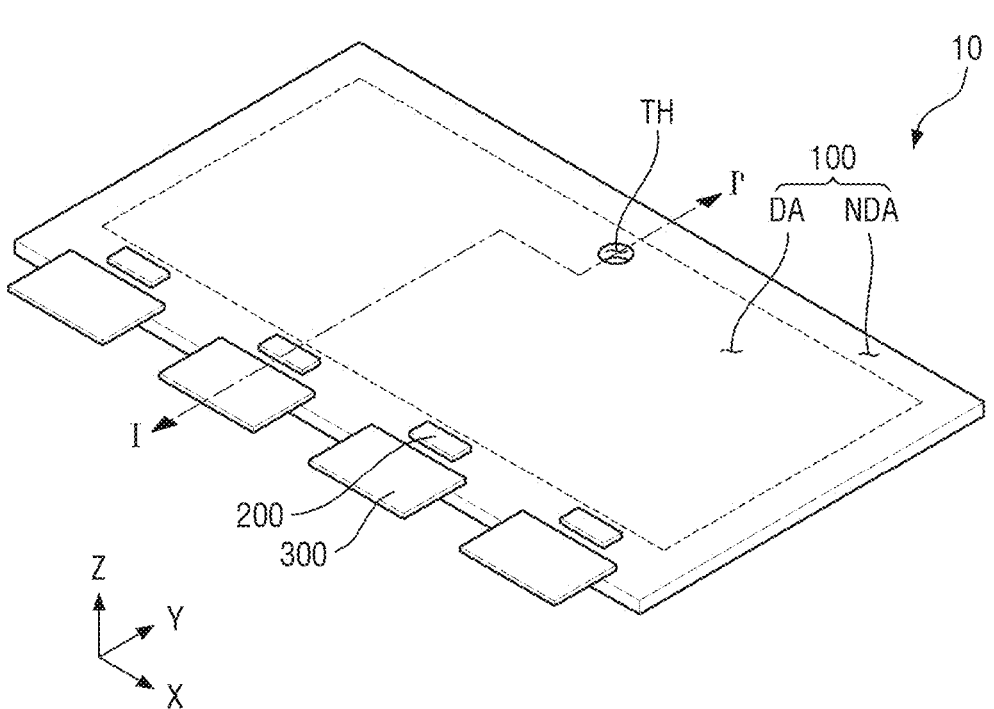
FIG. 1 is a perspective view illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
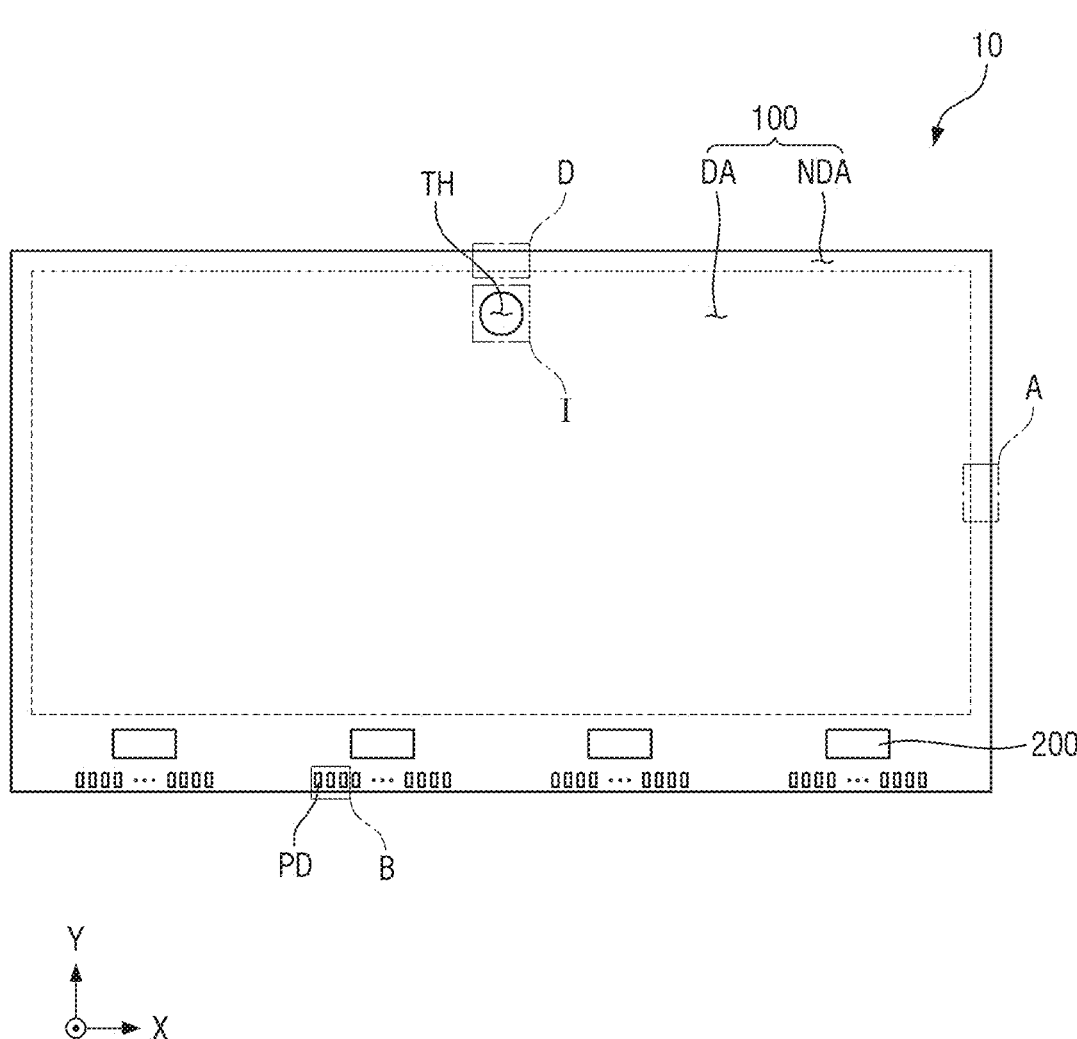
FIG. 2 is a plan view illustrating a display panel according to one or more embodiments.

FIG. 1 is a perspective view illustrating a display device according to one or more embodiments. FIG. 2 is a plan view illustrating a display panel according to one or more embodiments.

Referring to FIGS. 1 and 2, a display device 10 is a device for displaying a moving image or a still image. The display device may be used as a display screen of various products, such as televisions, laptop computers, monitors, billboards and the Internet of Things (IOT) as well as portable electronic devices, such as mobile phones, smart phones, tablet personal computer (tablet PC), smart watches, watch phones, mobile communication terminals, electronic note-books, electronic books, portable multimedia players (PMPs), navigation systems and ultra-mobile PCs (UMPCs).

The display device 10 according to one or more embodiments may be a light-emitting display device, such as an organic light-emitting display device using an organic light-emitting diode, a quantum dot light-emitting display including a quantum dot light-emitting layer, an inorganic light-emitting display device including an inorganic semiconductor, and a micro light-emitting display device using a micro or nano light-emitting diode (micro LED or nano LED). Hereinafter, the display device 10 has been mainly described as an organic light-emitting display device, but the present disclosure is not limited thereto.

The display device 10 according to one or more embodiments includes a display panel 100, a driving integrated circuit (IC) 200, and a circuit board 300.

The display panel 100 may be formed in a rectangular plane having a long side in a first direction (X-axis direction), and a short side in a second direction (Y-axis direction) intersecting the first direction (X-axis direction). A corner where the long side of the first direction (X-axis direction) and the short side of the second direction (Y-axis direction) meet may be formed at a right angle or rounded to have a curvature. The flat shape of the display panel 100 is not limited to a quadrangle, and may be formed in other polygons, circles, or ovals.

The display panel 100 may be formed to be flat, but is not limited thereto. For example, the display panel 100 is formed at left and right ends, and may include curved portions having a constant curvature or a varying curvature. In addition, the display panel 100 may be flexibly formed to be bent, folded, or rolled.

The display panel 100 may include a display area DA for displaying an image, and a non-display area NDA located around the display area DA.

The display area DA may occupy most of the area of the display panel 100. The display area DA may be located in the center of the display panel 100. Pixels each including a plurality of emission areas may be located in the display area DA to display an image.

The non-display area NDA may be located adjacent to the display area DA. The non-display area NDA may be an area outside the display area DA. The non-display area NDA may surround the display area DA (e.g., in plan view). The non-display area NDA may be an edge area of the display panel 100.

Display pads PD may be located in the non-display area NDA to be connected to the circuit boards 300. The display pads PD may be located on one edge of the display panel 100. For example, the display pads PD may be located on the lower edge of the display panel 100.

The driving integrated circuits ICs 200 may generate data voltages, power supply voltages, scan timing signals, and the like. The driving ICs 200 may output data voltages, power supply voltages, scan timing signals, and the like.

The driving ICs 200 may be located between the display pads PD and the display area DA in the non-display area NDA. Each of the driving ICs 200 may be attached to the non-display area NDA of the display panel 100 in a chip-on-glass (COG) method. Alternatively, each of the driving ICs 200 may be attached to the circuit board 300 using a chip-on-plastic (COP) method.

The circuit boards 300 may be located on the display pads PD located on one edge of the display panel 100. The circuit boards 300 may be attached to the display pads PD using an anisotropic conductive film and a conductive adhesive member, such as an anisotropic conductive adhesive. Accordingly, the circuit boards 300 may be electrically connected to signal lines of the display panel 100. The circuit boards 300 may be a flexible film, such as a flexible printed circuit board or a chip on film.

A bending area may be located between a driving IC 200 and the display area DA in the non-display area NDA. The bending area may be an area in which the driving IC 200 and the circuit board 300 are bent to be located under a substrate SUB. A through hole TH may be located at one side of the display area DA. The through hole TH is a hole that may transmit light, and may be an area in which an optical device is located.

Figure 3:
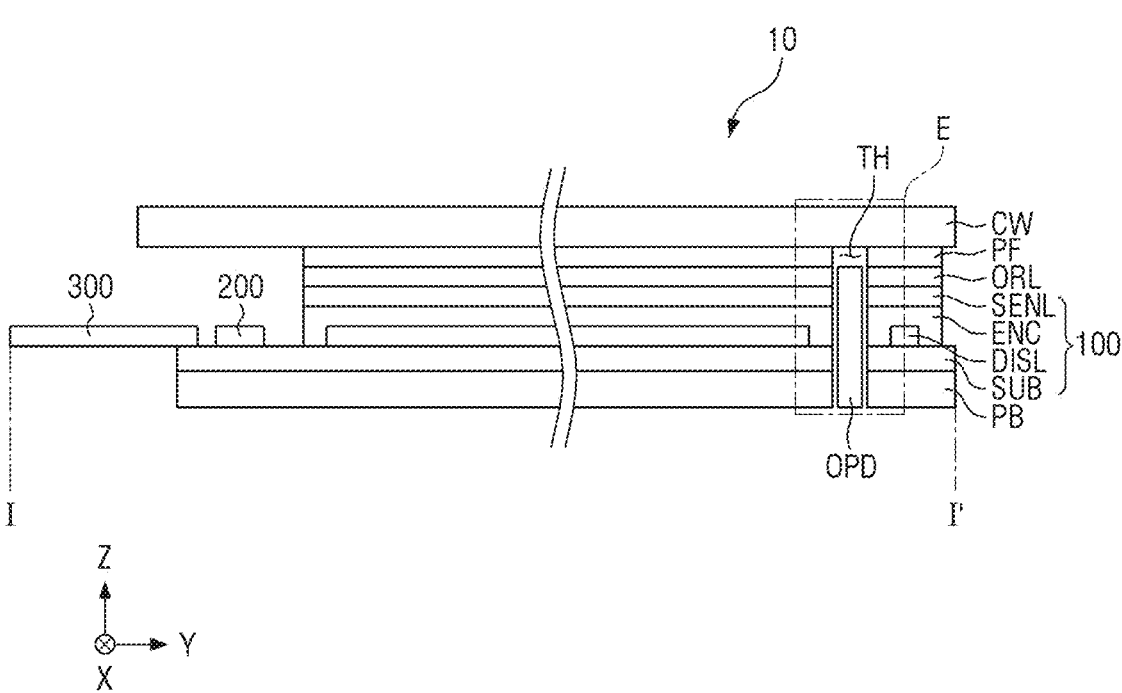
FIG. 3 is a cross-sectional view illustrating an example of a display device taken along the line I-I' of FIG. 1.
Figure 4:
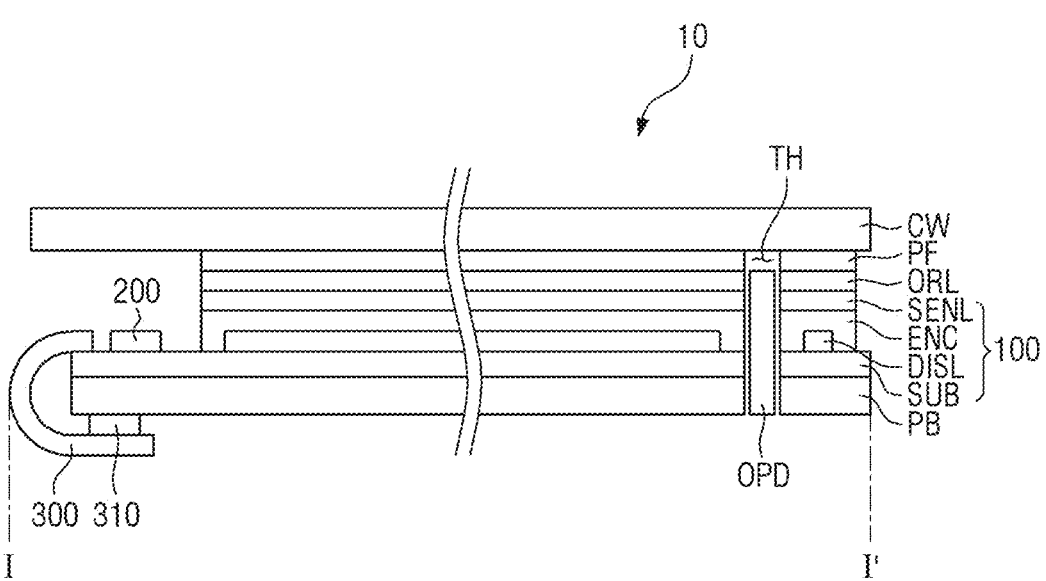
FIG. 4 is a cross-sectional view illustrating an example of a display device in which the circuit board is bent in FIG. 3.

FIG. 3 is a cross-sectional view illustrating an example of a display device taken along the line I-I' of FIG. 1. FIG. 4 is a cross-sectional view illustrating an example of a display device in which the circuit board is bent in FIG. 3.

Referring to FIG. 3, the display device 10 according to one or more embodiments may include the display panel 100, a polarizing film PF, a cover window CW, and a panel bottom cover PB. The display panel 100 may include the substrate SUB, a display layer DISL, an encapsulating layer ENC, a sensor electrode layer SENL, and an organic planarization layer ORL.

The substrate SUB is a substrate having a rigid characteristic, and may be, for example, a glass substrate.

The display layer DISL may be located on the first surface of the substrate SUB. The display layer DISL may be a layer that displays an image. The display layer DISL may include a thin film transistor layer (TFTL in FIG. 5) in which thin film transistors are formed, and a light-emitting element layer (EML in FIG. 5) in which light-emitting elements that emit light are located in the light-emitting areas.

In the display area DA of the display layer DISL, scan lines, data lines, power lines, etc. for the emission areas to emit light may be located. In the non-display area NDA of the display layer DISL, a scan-driving circuit for outputting scan signals to the scan lines, and fan-out lines connecting the data lines and the driving IC 200 may be located.

The encapsulating layer ENC may be a layer for encapsulating the light-emitting element layer of the display layer DISL to reduce or prevent oxygen or moisture from penetrating into the light-emitting element layer of the display layer DISL. The encapsulating layer ENC may be located on the display layer DISL. The encapsulating layer ENC may be located on the upper surface and side surfaces of the display layer DISL. The encapsulating layer ENC may cover the display layer DISL.

The sensor electrode layer SENL may be located on the display layer DISL. The sensor electrode layer SENL may include sensor electrodes. The sensor electrode layer SENL may sense a user's touch using sensor electrodes.

The organic planarization layer ORL may be located on the sensor electrode layer SENL. The organic planarization layer ORL may planarize the lower step, so that the upper polarizing film PF may be suitably attached, and visual recognition of the reflection of external light due to the polarizing film PF may be reduced or prevented.

The polarizing film PF may be located on the display panel 100 to reduce reflection of external light. The polarizing film PF may include a first base member, a linear polarizing plate, a phase delay film, such as a λ/4 plate (quarter-wave plate), and a second base member. The first base member, the phase delay film, the linear polarizing plate, and the second base member of the polarizing film PF may be sequentially stacked on the display panel 100.

The cover window CW may be located on the polarizing film PF. The cover window CW may be attached to the polarizing film PF by a transparent adhesive member, such as an optically clear adhesive (OCA) film.

The panel bottom cover PB may be located on the second surface of the substrate SUB of the display panel 100. The second surface of the substrate SUB may be opposite to the first surface. The panel bottom cover PB may be attached to the second surface of the substrate SUB of the display panel 100 through the adhesive member. The adhesive member may be a pressure sensitive adhesive (PSA).

The panel bottom cover PB may include at least one of a light-blocking member for absorbing light incident from the outside, a buffer member for absorbing an impact from the outside, and/or a heat dissipation member for efficiently dissipating heat of the display panel 100.

The light-blocking member may be located under the display panel 100. The light-blocking member blocks light transmission to reduce or prevent visibility (e.g., from above the display panel 100) of components located under the light-blocking member, for example, the display circuit board 300. The light-blocking member may include a light-absorbing material, such as a black pigment or a black dye.

The buffer member may be located under the light-blocking member. The buffer member absorbs an external shock to reduce or prevent damage to the display panel 100. The buffer member may be formed of a single layer or a plurality of layers. For example, the buffer member is formed of a polymer resin, such as polyurethane, polycarbonate, polypropylene, polyethylene, or the like, or may include a material having elasticity, such as rubber, a urethane-based material, or a sponge formed by foam molding an acrylic-based material.

The heat dissipation member may be located under the buffer member. The heat dissipation member may include a first heat dissipation layer including graphite or carbon nanotubes, and a second heat dissipation layer formed of a thin metal film, such as copper, nickel, ferrite, or silver, which may shield electromagnetic waves and has excellent thermal conductivity.

The driving IC 200 and the circuit board 300 may be bent under the display panel 100. The circuit board 300 may be attached to the lower surface of the panel bottom cover PB by an adhesive member 310. The adhesive member 310 may be a pressure-sensitive adhesive.

The through hole TH may be located in the display device 10 according to one or more embodiments. The through hole TH is a hole that allows light to pass through, and may be a physical hole penetrating through the panel bottom cover PB and the polarizing film PF as well as the display panel 100. However, the present disclosure is not limited thereto, and the through hole TH may pass through the panel bottom cover PB while not passing through the display panel 100 and the polarizing film PF. The cover window CW may cover the through hole TH.

The through hole TH may pass through the substrate SUB, the display layer DISL, the encapsulating layer ENC, and the sensor electrode layer SENL of the display panel 100.

The electronic device including the display device 10 according to one or more embodiments may further include an optical device OPD located in the through hole TH. The optical device OPD may be spaced apart from the display panel 100, the panel bottom cover PB, and the polarizing film PF. The optical device OPD may be an optical sensor that detects light incident through the through hole TH, such as a proximity sensor, an illuminance sensor, and a camera sensor.

Figure 5:
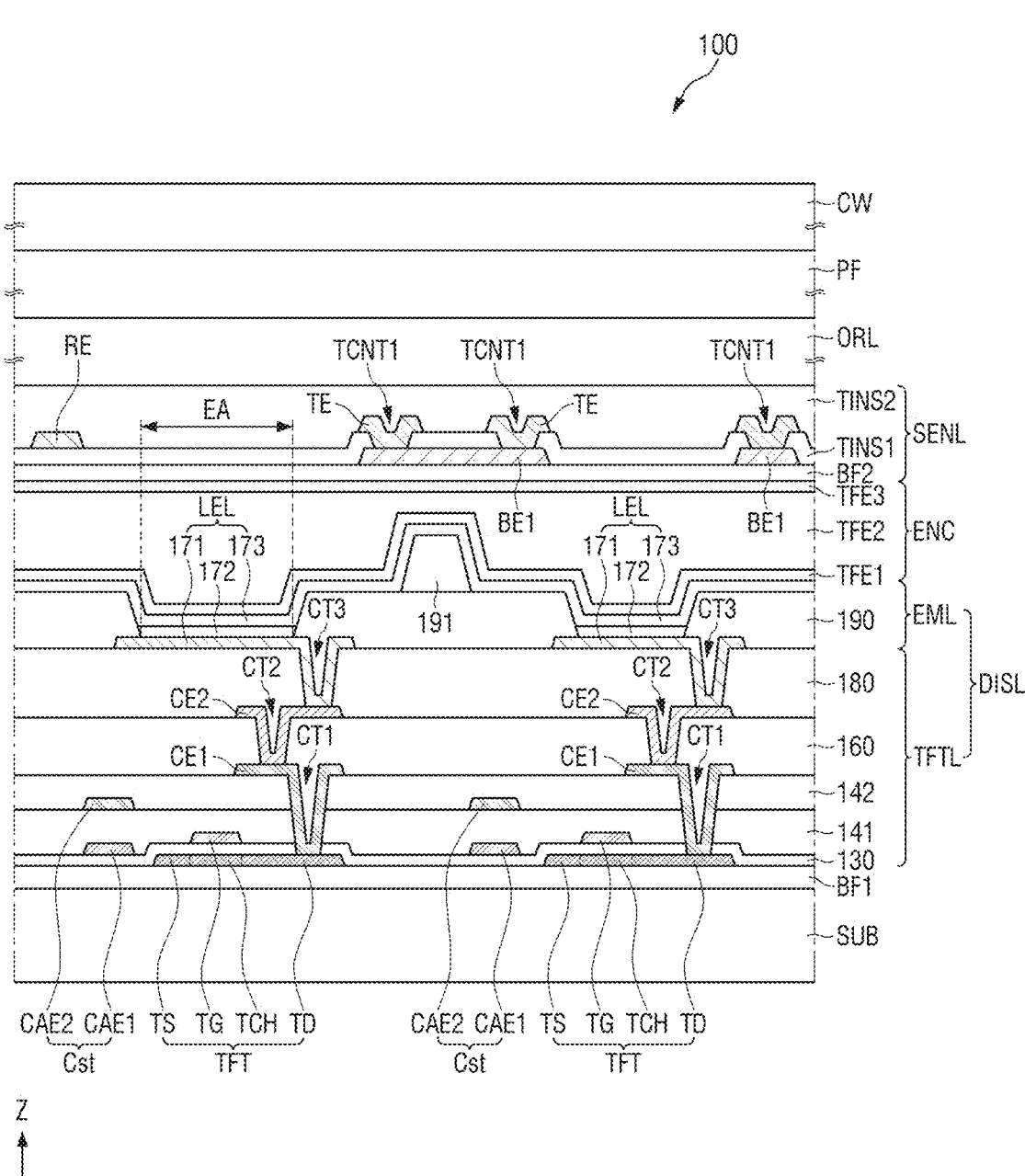
FIG. 5 is a cross-sectional view illustrating an example of a display area of a display panel according to one or more embodiments.

FIG. 5 is a cross-sectional view illustrating an example of a display area of a display panel according to one or more embodiments.

Referring to FIG. 5, the display panel 100 according to one or more embodiments may be an organic light-emitting display panel including a light-emitting element LEL including an organic light-emitting layer 172.

The display layer DISL may include a thin film transistor layer TFTL including a plurality of thin film transistors, and a light-emitting element layer EML including a plurality of light-emitting elements.

A first buffer layer BF1 may be located on the substrate SUB. The first buffer layer BF1 may be formed of an inorganic material, such as a silicon nitride layer, a silicon oxynitride layer, a silicon oxide layer, a titanium oxide layer, and an aluminum oxide layer. Alternatively, the first buffer layer BF1 may be formed as a multilayer in which a plurality of layers of a silicon nitride layer, a silicon oxynitride layer, a silicon oxide layer, a titanium oxide layer, and an aluminum oxide layer are alternately stacked.

An active layer including a channel area TCH, a source area TS, and a drain area TD of the thin film transistor TFT may be located on the first buffer layer BF1. The active layer may be formed of polycrystalline silicon, single crystal silicon, low temperature polycrystalline silicon, amorphous silicon, or an oxide semiconductor material. When the active layer includes polycrystalline silicon or an oxide semiconductor material, the source area TS and the drain area TD in the active layer may be conductive areas doped with ions or impurities to have conductivity.

A gate insulating layer 130 may be located on the active layer of the thin film transistor TFT. The gate insulating layer 130 may be formed of an inorganic layer, for example, a silicon nitride layer, a silicon oxynitride layer, a silicon oxide layer, a titanium oxide layer, or an aluminum oxide layer.

A first gate metal layer including a gate electrode TG of the thin film transistor TFT, a first capacitor electrode CAE1 of the capacitor Cst, and scan lines may be located on the gate insulating layer 130. The gate electrode TG of the thin film transistor TFT may overlap the channel area TCH in the third direction (Z-axis direction). The first gate metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A first interlayer insulating layer 141 may be located on the first gate metal layer. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

A second gate metal layer including a second capacitor electrode CAE2 of the capacitor Cst may be located on the first interlayer insulating layer 141. The second capacitor electrode CAE2 may overlap the first capacitor electrode CAE1 in the third direction (Z-axis direction). Therefore, the capacitor Cst may be formed by the first capacitor electrode CAE1, the second capacitor electrode CAE2, and an inorganic insulating dielectric layer located therebetween and serving as a dielectric layer. The second gate metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A second interlayer insulating layer 142 may be located on the second gate metal layer. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers.

A first data metal layer including a first connection electrode CE1 and data lines may be located on the second interlayer insulating layer 142. The first connection electrode CE1 may be connected to the drain area TD through a first contact hole CT1 penetrating the gate insulating layer 130, the first interlayer insulating layer 141, and the second interlayer insulating layer 142. The first data metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A first organic layer 160 for flattening a step difference due to a thin film transistors TFT may be located on the first connection electrode CE1. The first organic layer 160 may be formed of an organic layer, such as acryl resin, epoxy resin, phenolic resin, polyamide resin, polyimide resin, etc.

A second data metal layer including a second connection electrode CE2 may be located on the first organic layer 160. The second data metal layer may be connected to the first connection electrode CE1 through a second contact hole CT2 penetrating the first organic layer 160. The second data metal layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

A second organic layer 180 may be located on the second connection electrode CE2. The second organic layer 180 may be formed of an organic layer, such as acryl resin, epoxy resin, phenolic resin, polyamide resin, polyimide resin, etc.

Meanwhile, the second data metal layer and the second organic layer 180 including the second connection electrode CE2 may be omitted.

The light-emitting element layer EML is located on the thin film transistor layer TFTL. The light-emitting element layer EML may include light-emitting elements LEL and a bank 190.

Each of the light-emitting elements LEL may include a pixel electrode 171, a light-emitting layer 172, and a common electrode 173. Each of the emission areas EA represents an emission area where holes from the pixel electrode 171 and electrons from the common electrode 173 are combined with each other in the light-emitting layer 172 to emit light by sequentially stacking the pixel electrode 171, the light-emitting layer 172, and the common electrode 173. In this case, the pixel electrode 171 may be an anode electrode, and the common electrode 173 may be a cathode electrode.

A pixel electrode layer including the pixel electrode 171 may be formed on the second organic layer 180. The pixel electrode 171 may be connected to the second connection electrode CE2 through a third contact hole CT3 penetrating the second organic layer 180. The pixel electrode layer may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

In a top emission structure that emits light in the direction of the common electrode 173 based on the light-emitting layer 172, the pixel electrode 171 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/AI/ITO), APC alloy, a stacked structure of APC alloy, and ITO (ITO/APC/ITO) to increase reflectivity. The APC alloy is an alloy of silver (Ag), palladium (Pd), and copper (Cu).

The bank 190 serves to define the emission areas EA of the pixels. To this end, the bank 190 may be formed to expose a partial area of the pixel electrode 171 on the second organic layer 180. The bank 190 may cover the edge of the pixel electrode 171. The bank 190 may be located in the third contact hole CT3. That is, the third contact hole CT3 may be filled by the bank 190. The bank 190 may be formed of an organic layer, such as an acrylic resin, an epoxy resin, a phenolic resin, a polyamide resin, or a polyimide resin.

A spacer 191 may be located on the bank 190. The spacer 191 may serve to support a mask during the process of manufacturing a light-emitting layer 172. The spacer 191 may be formed of an organic layer, such as an acrylic resin, an epoxy resin, a phenolic resin, a polyamide resin, or a polyimide resin.

The light-emitting layer 172 is formed on the pixel electrode 171. The light-emitting layer 172 may include an organic material to emit a color (e.g., predetermined color). For example, the light-emitting layer 172 may include a hole-transporting layer, an organic material layer, and an electron-transporting layer. The organic material layer may include a host and a dopant. The organic material layer may include a material for emitting light (e.g., predetermined light), and may be formed using a phosphorescent material or a fluorescent material.

The common electrode 173 is formed on the light-emitting layer 172. The common electrode 173 may be formed to cover the light-emitting layer 172. The common electrode 173 may be a common layer commonly formed in the light-emitting areas EA1, EA2, EA3, and EA4. A capping layer may be formed on the common electrode 173.

In the upper emission structure, the common electrode 173 may be formed of a transparent conductive material (TCO), such as ITO or IZO that may transmit light, or a semi-transmissive conductive material, such as magnesium (Mg), silver (Ag), or an alloy of magnesium (Mg) and silver (Ag). When the common electrode 173 is formed of a transflective metal material, light output efficiency may be increased by a micro cavity.

The encapsulating layer ENC may be located on the light-emitting element layer EML. The encapsulating layer ENC may include at least one inorganic layer TFE1 and/or TFE3 to reduce or prevent oxygen or moisture from penetrating into the light-emitting element layer EML. Also, the encapsulating layer ENC may include at least one organic layer TFE2 to protect the light-emitting element layer EML from foreign substances, such as dust. For example, the encapsulating layer ENC may include a first encapsulating inorganic layer TFE1, an encapsulating organic layer TFE2, and a second encapsulating inorganic layer TFE3.

The first encapsulating inorganic layer TFE1 may be located on the common electrode 173, the encapsulating organic layer TFE2 may be located on the first encapsulating inorganic layer TFE1, and the second encapsulating inorganic layer TFE3 may be located on the encapsulating organic layer TFE2. The first encapsulating inorganic layer TFE1 and the second encapsulating inorganic layer TFE3 may be formed as a multilayer in which one or more inorganic layers of a silicon nitride layer, a silicon oxynitride layer, a silicon oxide layer, a titanium oxide layer, and an aluminum oxide layer are alternately stacked. The encapsulating organic layer TFE2 may be an organic film, such as an acrylic resin, an epoxy resin, a phenolic resin, a polyamide resin, or a polyimide resin.

The sensor electrode layer SENL may be located on the encapsulating layer ENC. The sensor electrode layer SENL may include sensor electrodes TE and RE.

A second buffer layer BF2 may be located on the encapsulating layer ENC. The second buffer layer BF2 may include at least one inorganic layer. For example, the second buffer layer BF2 may be formed as a multilayer in which one or more inorganic layers of a silicon nitride layer, a silicon oxynitride layer, a silicon oxide layer, a titanium oxide layer, and/or an aluminum oxide layer are alternately stacked. The second buffer layer BF2 may be omitted.

A first connection parts BE1 may be located on the second buffer layer BF2. The first connection parts BE1 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/AI/ITO), APC alloy, a stacked structure of APC alloy, and ITO (ITO/APC/ITO).

A first sensor insulating layer TINS1 may be located on the first connection parts BE1. The first sensor insulating layer TINS1 may be formed of an inorganic layer, for example, a silicon nitride layer, a silicon oxynitride layer, a silicon oxide layer, a titanium oxide layer, or an aluminum oxide layer.

The sensor electrodes, that is, a driving electrodes TE and sensing electrodes RE, may be located on the first sensor insulating layer TINS1. In addition, dummy patterns may be located on the first sensor insulating layer TINS1. The driving electrodes TE, the sensing electrodes RE, and the dummy patterns do not overlap the emission areas EA. The driving electrodes TE, the sensing electrodes RE, and the dummy patterns may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/AI/ITO), APC alloy, a stacked structure of APC alloy, and/or ITO (ITO/APC/ITO).

A second sensor insulating layer TINS2 may be located on the driving electrodes TE, the sensing electrodes RE, and the dummy patterns. The second sensor insulating layer TINS2 may include at least one of an inorganic layer and/or an organic layer. The inorganic layer may be a silicon nitride layer, a silicon oxynitride layer, a silicon oxide layer, a titanium oxide layer, or an aluminum oxide layer. The organic layer may be an acrylic resin, an epoxy resin, a phenolic resin, a polyamide resin, or a polyimide resin.

The organic planarization layer ORL may be located on the sensor electrode layer SENL. The organic planarization layer ORL may planarize the lower step, so that the upper polarizing film PF may be suitably attached, and visual recognition of the reflection of external light due to the polarizing film PF may be reduced or prevented.

The organic planarization layer ORL is made of an organic material, for example, acrylic resin, epoxy resin, phenolic resin, polyamide resin, polyimide resin and the like.

Figure 6:
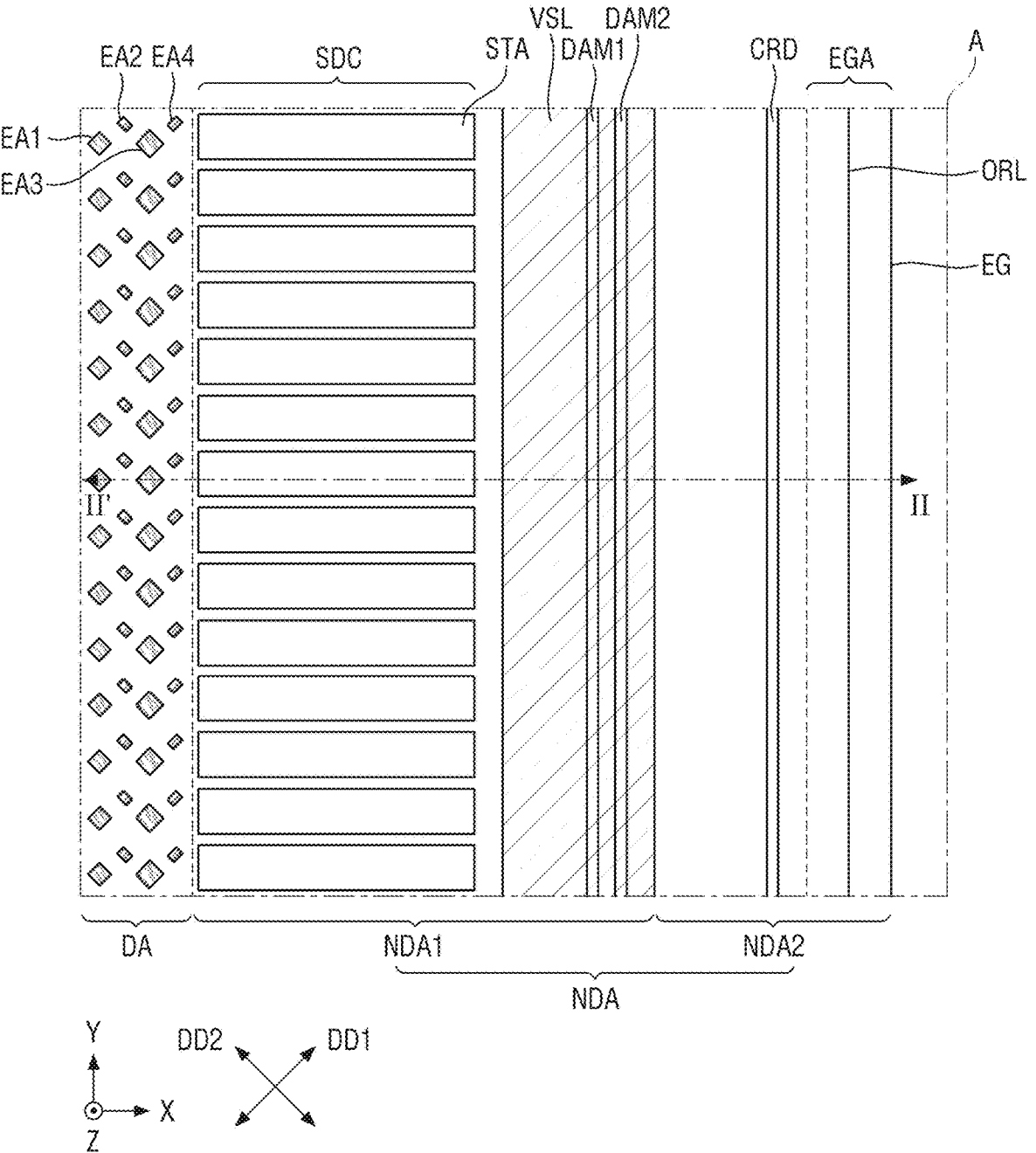
FIG. 6 is a layout diagram illustrating an example of area A of FIG. 2 in detail.

FIG. 6 is a layout diagram illustrating an example of area A of FIG. 2 in detail. FIG. 6 is a layout diagram illustrating a display area DA and a non-display area NDA located on the right side of the display panel 100 according to one or more embodiments.

Referring to FIG. 6, the display area DA may include a plurality of light-emitting areas EA1, EA2, EA3, and EA4. The plurality of light-emitting areas EA1, EA2, EA3, and EA4 include a first light-emitting area EA1 for emitting light of a first color, a second light-emitting area EA2 and a fourth light-emitting area for emitting light of a second color, and a third light-emitting area EA3 for emitting light of a third color. For example, the light of the first color is light in a red wavelength band of about 600 nm to about 750 nm, the light of the second color is light in a green wavelength band of about 480 nm to about 560 nm, and the light of the light of third color is light in a blue wavelength band of about 370 nm to about 460 nm, but embodiments of the present specification are not limited thereto.

FIG. 6 illustrates that the second light-emitting area EA2 and the fourth light-emitting area EA4 emit light of the same color, that is, light of the second color, but the present disclosure is not limited thereto. The second light-emitting area EA2 and the fourth light-emitting area EA4 may emit light of different respective colors. For example, the second light-emitting area EA2 may emit light of a second color, and the fourth light-emitting area EA4 may emit light of a fourth color.

Also, although FIG. 6 illustrated that each of the first light-emitting areas EA1, the second light-emitting areas EA2, the third light-emitting areas EA3, and the fourth light-emitting areas EA4 has a rectangular planar shape, the embodiments of the present specification are not limited thereto. Each of the first light-emitting areas EA1, the second light-emitting areas EA2, the third light-emitting areas EA3, and the fourth light-emitting areas EA4 may have a polygonal, circular, or elliptical plane other than a quadrangle.

In addition, as shown in FIG. 6, the area of the third light-emitting area EA3 may be the largest, and the area of the second light-emitting area EA2 and the area of the fourth light-emitting area EA4 may be the smallest. The area of the second light-emitting area EA2 and the area of the fourth light-emitting area EA4 may be the same.

The second light-emitting areas EA2 and the fourth light-emitting areas EA4 may be alternately located in the first direction (X-axis direction). The second light-emitting areas EA2 may be located in columns extending is the second direction (Y-axis direction). The fourth light-emitting areas EA4 may be located in columns extending in the second direction (Y-axis direction). Each of the fourth light-emitting areas EA4 has a long side in the first diagonal direction DD1 and a short side in the second diagonal direction DD2, while each of the second light-emitting areas EA2 may have a long side in the second diagonal direction DD2 and a short side in the first diagonal direction DD1. The first diagonal direction DD1 indicates a diagonal direction between the first direction (X-axis direction) and the second direction (Y-axis direction), and the second diagonal direction DD2 may be orthogonal to the first diagonal direction DD1.

The first light-emitting areas EA1 and the third light-emitting areas EA3 may be alternately located in the first direction (X-axis direction). The first light-emitting areas EA1 may be located in columns extending in the second direction (Y-axis direction). The third light-emitting areas EA3 may be located in columns extending in the second direction (Y-axis direction). Each of the first light-emitting areas EA1 and the third light-emitting areas EA3 may have a square planar shape, but embodiments of the present specification are not limited thereto. In this case, each of the first light-emitting areas EA1 and the third light-emitting areas EA3 may include two sides parallel to each other in the first diagonal direction DD1 and two sides parallel to each other in the second diagonal direction DD2.

The non-display area NDA includes a first non-display area NDA1 and a second non-display area NDA2. The first non-display area NDA1 may be an area in which structures for driving pixels of the display area DA are located. The second non-display area NDA2 may be located outside the first non-display area NDA1. The second non-display area NDA2 may be an edge area of the non-display area NDA. Also, the second non-display area NDA2 may be an edge area of the display panel 100.

The first non-display area NDA1 may include a scan-driving circuit SDC, a first power supply line VSL, a first dam DAM1, and a second dam DAM2.

The scan-driving circuit SDC may include a plurality of stages STA. The plurality of stages STA may be respectively connected to the scan lines SL of the display area DA extending in the first direction (X-axis direction). That is, the plurality of stages STA may be one-to-one connected to the scan lines SL of the display area DA extending in the first direction (X-axis direction). The plurality of stages STA may sequentially apply scan signals to the plurality of scan lines SL.

The first power supply line VSL may be located outside the scan-driving circuit SDC. That is, the first power supply line VSL may be located closer to an edge EG of the display panel 100 than the scan-driving circuit SDC. The first power supply line VSL may extend in the second direction (Y-axis direction) in the non-display area NDA on the side of the display panel 100.

The first power supply line VSL may be electrically connected to the common electrode 173, so that the common electrode 173 may receive the first power supply voltage from the first power supply line VSL.

The first dam DAM1 and the second dam DAM2 are structures for reducing or preventing overflow of the encapsulating organic layer TFE2 of the encapsulating layer ENC to the edge EG of the display panel 100. The first dam DAM1 and the second dam DAM2 may extend in the second direction (Y-axis direction) in the non-display area NDA on the side of the display panel 100. The second dam DAM2 may be located outside the first dam DAM1. The first dam DAM1 may be located closer to the scan-driving circuit SDC than the second dam DAM2, and the second dam DAM2 may be located closer to the edge EG of the display panel 100 than the first dam DAM1.

FIG. 6 illustrates that the first dam DAM1 and the second dam DAM2 are located on the first power supply line VSL, but the present disclosure is not limited thereto. For example, any one of the first dam DAM1 and/or the second dam DAM2 may not be located on the first power supply line VSL. Alternatively, neither the first dam DAM1 nor the second dam DAM2 may be located on the first power supply line VSL. In this case, the first dam DAM1 and the second dam DAM2 may be located outside the first power supply line VSL.

Also, although FIG. 6 illustrates that the display panel 100 includes two dams DAM1 and DAM2 according to one or more embodiments, the present disclosure is not limited thereto. That is, the display panel 100 according to one or more embodiments may include three or more dams.

The second non-display area NDA2 may include a crack dam CRD and an edge area EGA.

The crack dam CRD may be a structure for reducing or preventing the likelihood of cracks occurring in the process of cutting the substrate SUB during the manufacturing process of the display device 10. The crack dam CRD may be an outermost structure located on the outermost side of the display panel 100. The crack dam CRD may extend in the second direction (Y-axis direction) in the non-display area NDA on the side of the display panel 100.

The edge area EGA may be located along the edge EG of the display panel 100. The edge area EGA may be an area in which machining marks generated in the process of cutting the substrate SUB are generated.

The organic planarization layer ORL may extend from the display area DA to an upper portion of the crack dam CRD of the non-display area NDA. The organic planarization layer ORL may at least cover the display area DA and may cover structures, such as the dams DAM1 and DAM2 and the crack dam CRD of the non-display area NDA to be planarized.

Figure 7:
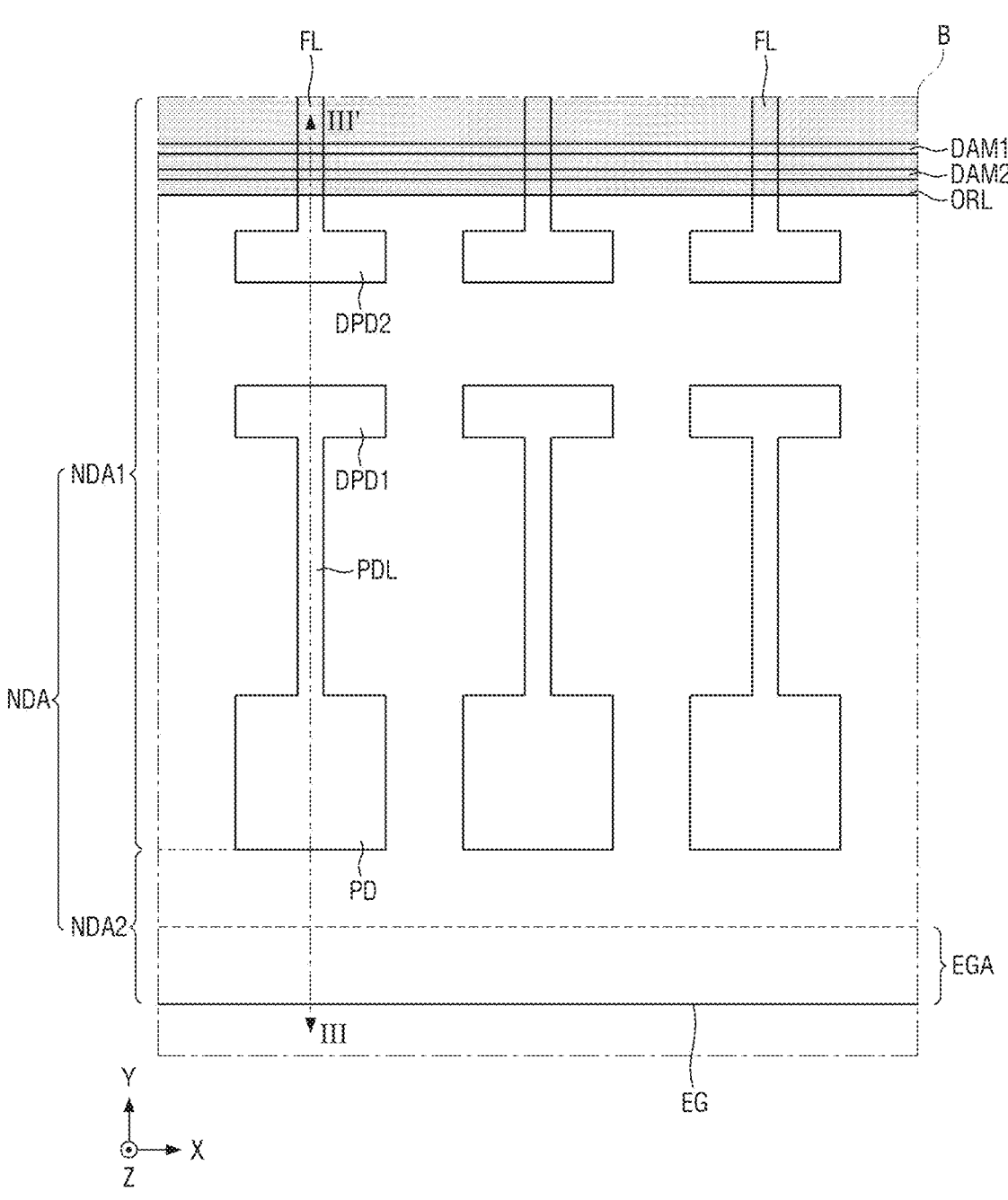
FIG. 7 is a layout diagram illustrating an example of area B of FIG. 2 in detail.

FIG. 7 is a layout diagram illustrating an example of area B of FIG. 2 in detail. FIG. 7 is a layout diagram illustrating a non-display area NDA located below the display panel 100 according to one or more embodiments.

Referring to FIG. 7, the first non-display area NDA1 may include a plurality of display pads PD, a plurality of first driving pads DPD1, a plurality of second driving pads DPD2, a plurality of pad lines, a plurality of fan-out lines, the first dam DAM1, and the second dam DAM2.

The plurality of display pads PD may be electrically connected to the circuit board 300 through the conductive adhesive member, such as the anisotropic conductive film and the anisotropic conductive adhesive. Each of the plurality of display pads PD may be connected to the pad line PDL. The pad line PDL may connect the display pad PD and a first driving pad DPD1.

The plurality of first driving pads DPD1 and the plurality of second driving pads DPD2 may be electrically connected to the driving IC 200 through the conductive adhesive member, such as the anisotropic conductive film and the anisotropic conductive adhesive. The plurality of first driving pads DPD1 may be input pads for the driving IC 200 to receive signals (e.g., digital video data, data timing control signal, etc.) of the circuit board 300. The plurality of second driving pads DPD2 may be output pads for outputting signals (e.g., data voltages) of the driving IC 200. Each of the plurality of second driving pads DPD2 may be connected to the fan-out line FL. The fan-out line FL may connect the second driving pad DPD2 and the data line of the display area DA.

Each of the plurality of first driving pads DPD1 may be located closer to the display area DA in the second direction (Y-axis direction) than the display pad PD connected thereto. That is, among the display pad PD and the first driving pad DPD1 that are connected to each other, the display pad PD may be located closer to the edge EG of the display panel 100 in the second direction (Y-axis direction) than the first driving pad DPD1.

Each of the plurality of second driving pads DPD2 may be located closer to the display area DA in the second direction (Y-axis direction) than any one of the plurality of first driving pads DPD1. That is, the first driving pad DPD1 may be located closer to the edge EG of the display panel 100 in the second direction (Y-axis direction) than any one of the second driving pads DPD2 among the plurality of second driving pads DPD.

The first dam DAM1 and the second dam DAM2 may cross the fan-out line FL. The first dam DAM1 and the second dam DAM2 may extend in the first direction (X-axis direction) in the non-display area NDA at a side of (under/below) the display panel 100. The second dam DAM2 may be located outside the first dam DAM1. The first dam DAM1 may be located closer to a display area DA2 than the second dam DAM2, and the second dam DAM2 may be located closer to the edge EG of the display panel 100 than the first dam DAM1.

The organic planarization layer ORL may extend from the display area DA to the non-display area NDA. The organic planarization layer ORL may cover the dams DAM1 and DAM2. The organic planarization layer ORL may be spaced apart from the first driving pad DPD1 and the second driving pad DPD2, so that the first driving pad DPD1 and the second driving pad DPD2 may be electrically connected to the driving IC 200.

Figure 8:
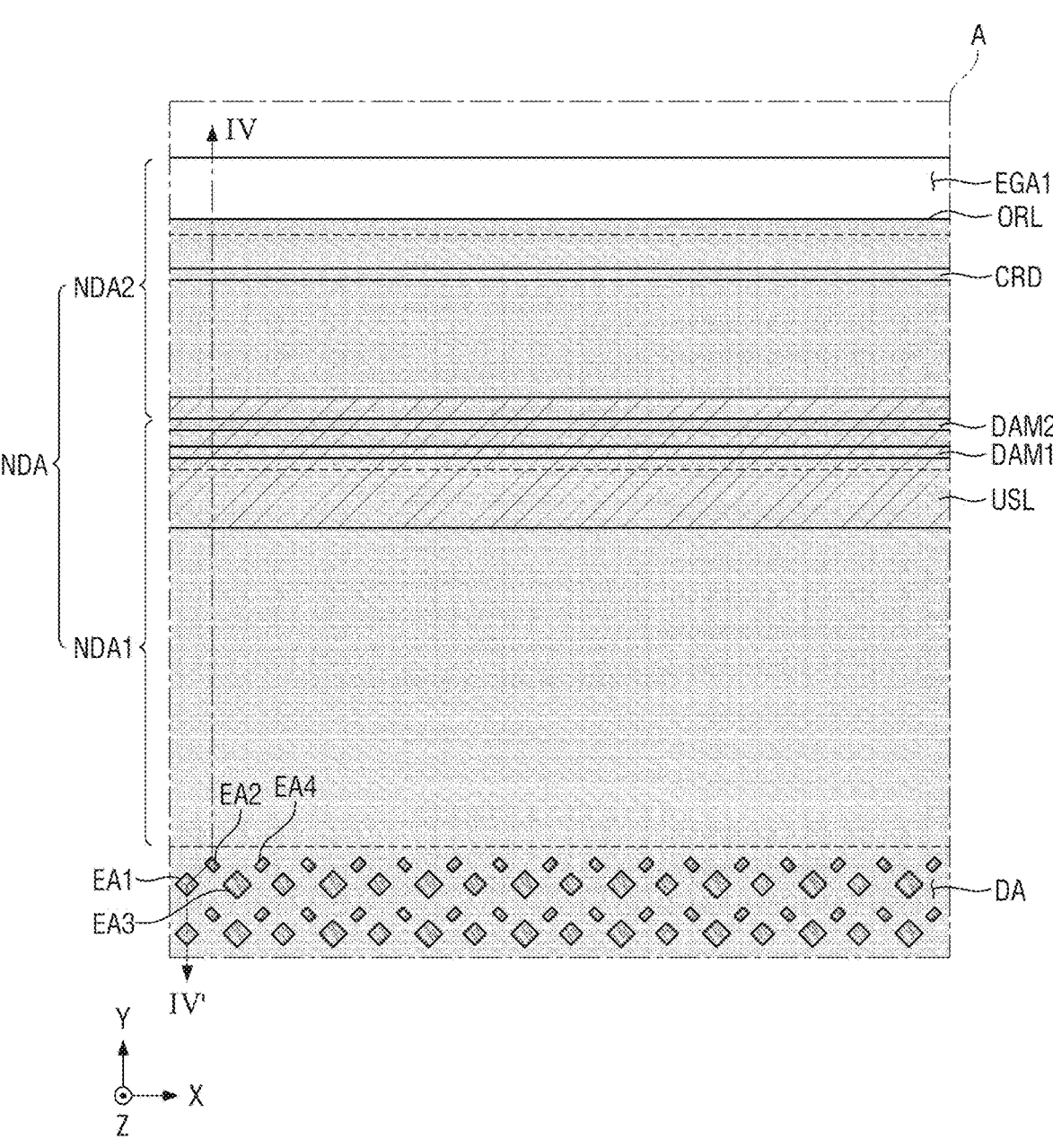
FIG. 8 is a layout diagram illustrating an example of area A of FIG. 2 in detail.

FIG. 8 is a layout diagram illustrating an example of area A of FIG. 2 in detail. FIG. 8 is a layout diagram illustrating the display area DA and the non-display area NDA located above the display panel 100 according to one or more embodiments.

Referring to FIG. 8, the first non-display area NDA1 may include the first power supply line VSL, the first dam DAM1, and the second dam DAM2. The first non-display area NDA1 may not include the scan-driving circuit SDC.

The first power supply line VSL may extend in the first direction (X-axis direction) in the non-display area NDA on the upper side of the display panel 100. The first power supply line VSL may be electrically connected to the common electrode 173, so that the common electrode 173 may receive the first power supply voltage from the first power supply line VSL.

The first dam DAM1 and the second dam DAM2 may extend in the first direction (X-axis direction) in the non-display area NDA on the upper side of the display panel 100. The second dam DAM2 may be located outside the first dam DAM1. The first dam DAM1 may be located closer to the display area DA than the second dam DAM2, and the second dam DAM2 may be located closer to the edge EG of the display panel 100 than the first dam DAM1.

FIG. 8 illustrates that the first dam DAM1 and the second dam DAM2 are located on the first power supply line VSL, but the present disclosure is not limited thereto. For example, any one of the first dam DAM1 and/or the second dam DAM2 may not be located on the first power supply line VSL in one or more embodiments. Alternatively, neither the first dam DAM1 nor the second dam DAM2 may be located on the first power supply line VSL. In this case, the first dam DAM1 and the second dam DAM2 may be located outside the first power supply line VSL.

The second non-display area NDA2 may include the crack dam CRD and the edge area EGA.

The crack dam CRD may be an outermost structure located on the outermost side of the display panel 100. The crack dam CRD may extend in the first direction (X-axis direction) in the non-display area NDA on the upper side of the display panel 100.

The edge area EGA may be located along the edge EG of the display panel 100. The edge area EGA may be an area in which machining marks generated in the process of cutting the substrate SUB are generated.

The organic planarization layer ORL may extend from the display area DA to an upper portion of the crack dam CRD of the non-display area NDA. The organic planarization layer ORL may cover at least the display area DA and cover structures, such as the dams DAM1 and DAM2 and the crack dam CRD of the non-display area NDA to planarize the structure.

Figure 9:
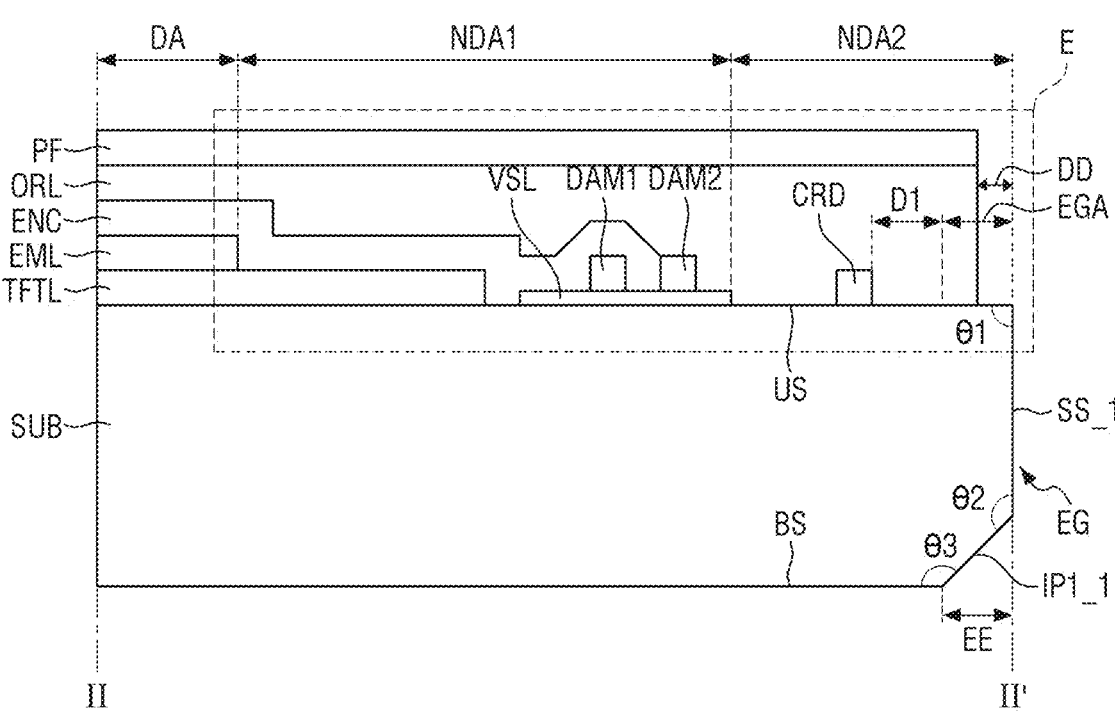
FIG. 9 is a cross-sectional view illustrating an example of a display panel taken along the line II-II' of FIG. 6.
Figure 10:
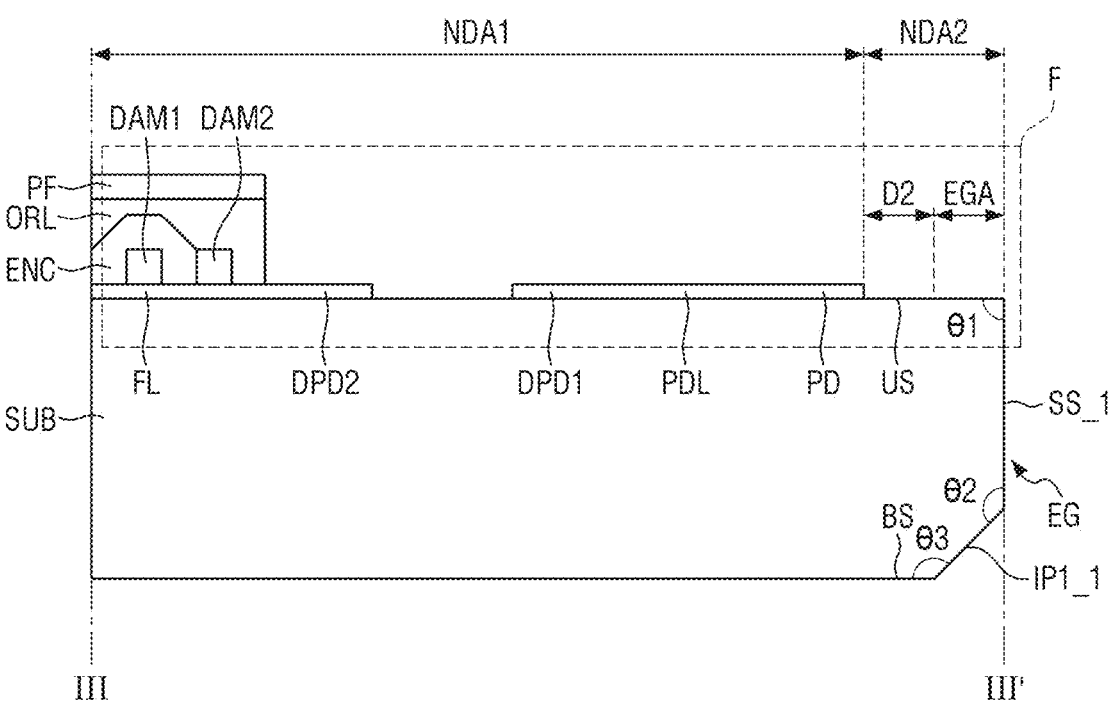
FIG. 10 is a cross-sectional view illustrating an example of the display panel taken along the line III-III' of FIG. 7.
Figure 11:
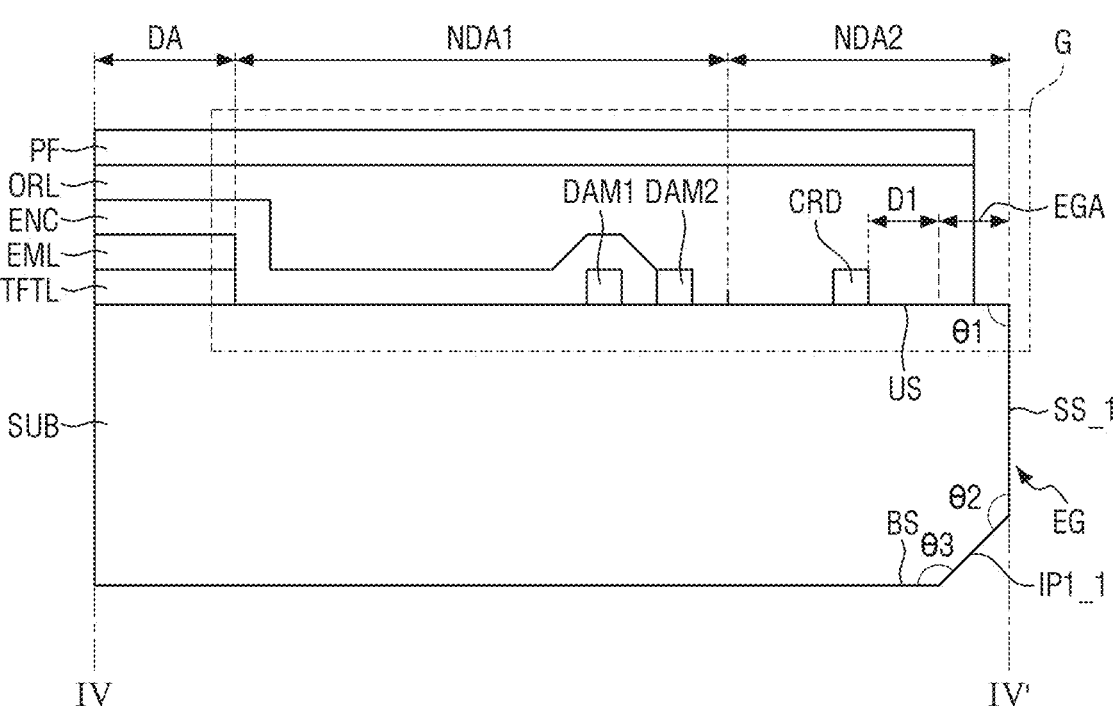
FIG. 11 is a cross-sectional view illustrating an example of the display panel taken along the line IV-IV' of FIG. 8.

FIG. 9 is a cross-sectional view illustrating an example of a display panel taken along the line II-II' of FIG. 6. FIG. 10 is a cross-sectional view illustrating an example of the display panel taken along the line III-III' of FIG. 7. FIG. 11 is a cross-sectional view illustrating an example of the display panel taken along the line IV-IV' of FIG. 8.

FIGS. 9 to 11 show cross-sections of the edge EG of the display panel 100 when the substrate SUB of the display panel 100 is cut by irradiating a laser and then by spraying an etchant.

Referring to FIGS. 9 to 11, the edge area EGA may be an area in which a processing trace is formed on an upper surface US of the substrate SUB by an etchant when cutting the substrate SUB by spraying the etchant after irradiating the laser. The edge area EGA may be within about 30 μm.

The edge area EGA may include a first inclined surface IP1_1 formed by spraying the etchant after irradiating the laser. The angle θ1 between a side surface SS_1 and the upper surface US may be about 90 degrees. That is, the angle between the side surface SS_1 and the upper surface US may be substantially close to a right angle. An angle θ2 formed between the side surface SS_1 and the first inclined surface IP1_1, and an angle 83 formed between the first inclined surface IP1_1 and the lower surface BS, may be respective obtuse angles. The machining trace formed on the upper surface UP of the substrate SUB may overlap the first inclined surface IP1_1 in the third direction (Z-axis direction).

The crack dam CRD may be a structure for reducing or preventing the likelihood of cracks occurring in the process of cutting the substrate SUB during the manufacturing process of the display device 10. The crack dam CRD may be an outermost structure located on the outermost side of the display panel 100. A distance D1 between the crack dam CRD and the edge area EGA may be about 70 μm or less.

A minimum distance from the crack dam CRD to the edge EG of the display panel 100 may be the sum of the width of the edge area EGA and a minimum distance D1 from the crack dam CRD to the edge area EGA. When the substrate SUB is cut by spraying the etchant after laser irradiation, the minimum distance between the crack dam CRD and the edge EG of the display panel 100 may vary depending on the one-side tolerance of the laser. For example, when the one-side tolerance of the laser is about 50 μm, the distance D1 between the crack dam CRD and the edge area EGA may be at least about 50 μm or at most about 150 μm.

The minimum distance from the display pad PD to the edge of the substrate SUB may be the sum of the width of the edge area EGA and a minimum distance D2 from the display pad PD to the edge area EGA. When the substrate SUB is cut by spraying the etchant after laser irradiation, the minimum distance from the display pad PD to the edge of the substrate SUB may vary depending on the one-side tolerance of the laser. For example, when the laser one-side tolerance is about 50 μm, the distance D2 between the crack dam CRD and the edge area EGA may be at least about 50 μm or at most about 150 μm.

In addition, when the substrate SUB of the display panel 100 is cut by irradiating the laser during the manufacturing process of the display panel 100 and then spraying the etchant, the side surface SS and the first inclined surface IP1 of the display panel 100 may be etched by an etchant. In this case, the roughness of the side surface SS of the display panel 100 and the first inclined surface IP1 may be about 50 μm or less. When the substrate SUB of the display panel 100 is cut by spraying the etchant after irradiating the laser, the roughness of the side surface SS and the first inclined surface IP1 of the display panel 100 may be less than the roughness of the side surface SS, the first inclined surface IP1, and the second inclined surface IP2 of the display panel 100 in a case when the polishing process is performed.

When the substrate SUB of the display panel 100 is cut by spraying the etchant after irradiating the laser, the minimum distance from the crack dam CRD to the edge EG of the display panel 100 may be reduced. Therefore, when the substrate SUB of the display panel 100 is cut by spraying the etchant after irradiating the laser, the width of the second non-display area NDA2 may be greatly reduced. That is, the width of the non-display area NDA may be reduced or minimized.

The organic planarization layer ORL may extend from the display area DA to the non-display area NDA. The organic planarization layer ORL may planarize the lower step, so that the upper polarizing film PF is suitably attached, and visual recognition of the reflection of external light due to the polarizing film PF may be reduced or prevented.

The organic planarization layer ORL may cover the first dam DAM1, the second dam DAM2, and the crack dam CRD in the non-display area NDA. For example, as shown in FIGS. 9 and 11, the organic planarization layer ORL may extend to the second non-display area NDA2 in which the crack dam CRD and the edge area EGA are located.

A lateral side of the organic planarization layer ORL may be inwardly spaced apart from the lateral side of the sub-strate SUB. Because the organic planarization layer ORL is first removed through a laser ablation process before the cutting process of the substrate SUB, the lateral side of the organic planarization layer ORL may be spaced apart from the lateral side of the substrate SUB. A distance DD between the lateral side of the organic planarization layer ORL and the lateral side of the substrate SUB may be less than an in-plane width EE of the first inclined surface IP1_1 of the substrate SUB. The planar width EE of the first inclined surface IP1_1 may be a distance between a bottom surface BS and the side surface SS_1 of the planar substrate SUB (e.g., measured in the X-axis direction). Because the sub-strate SUB is etched by the etchant, the planar width EE of the first inclined surface IP1_1 may be formed to be rela-tively wide. On the other hand, because the organic planar-ization layer ORL is relatively precisely removed by laser ablation, the distance DD between the lateral side of the organic planarization layer ORL and the lateral side of the substrate SUB may be formed to be relatively small. Accord-ingly, the distance DD between the lateral sides of the organic planarization layer ORL and the lateral side of the substrate SUB may be less than the in-plane width EE of the first inclined surface IP1_1 of the substrate SUB.

As shown in FIG. 10, in an area where the crack dam CRD is not located, the organic planarization layer ORL may cover the first dam DAM1 and the second dam DAM2, and may be spaced apart from the edge area EGA. For example, the organic planarization layer ORL may extend from the display area DA to an area between the dams DAM1 and DAM2 and the second driving pad DPD2.

The height of the organic planarization layer ORL may be uniformly located throughout. Here, the height of the organic planarization layer ORL may be a distance from the upper surface US of the substrate SUB to the upper surface of the organic planarization layer ORL. That is, the organic planarization layer ORL may be completely flatly located over the display area DA and the non-display area NDA.

The polarizing film PF may be located on the organic planarization layer ORL. The polarizing film PF may be attached to a planar organic planarization layer ORL to be completely flat. Accordingly, because a slope is not formed on the polarizing film PF, it is possible to reduce or prevent external light that would otherwise be reflected by the inclined surface of the polarizing film PF and recognized by a user.

Figure 12:
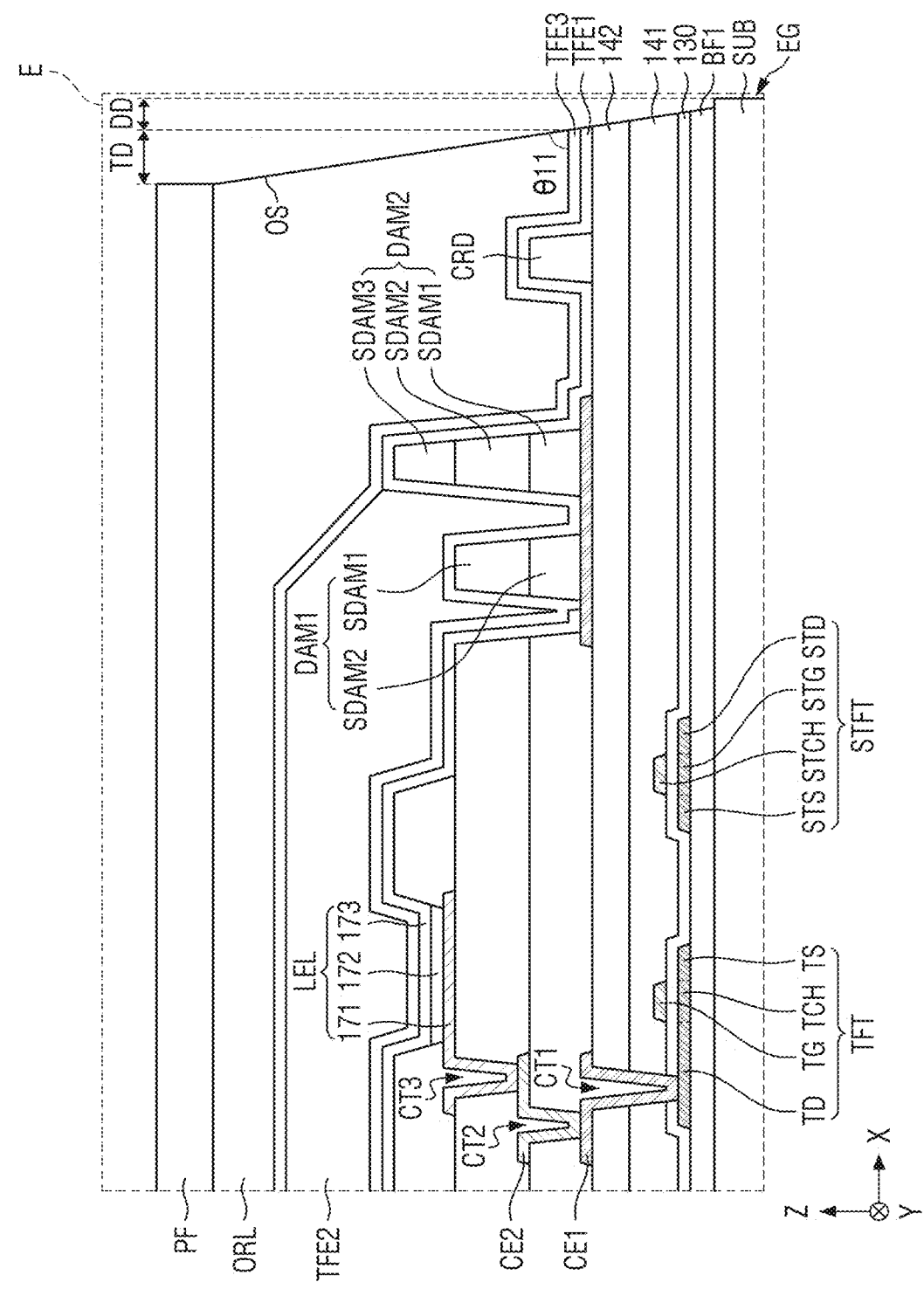
FIG. 12 is an enlarged cross-sectional view illustrating an example of area E of FIG. 9 in detail.

FIG. 12 is an enlarged cross-sectional view illustrating an example of area E of FIG. 9 in detail.

Referring to FIG. 12, the crack dam CRD may include the same material as the first organic layer 160, and may be located on/at the same layer. The crack dam CRD may be located on the second interlayer insulating layer 142. The crack dam CRD may be formed of an organic film, such as acryl resin, epoxy resin, phenolic resin, polyamide resin, polyimide resin, etc.

FIG. 12 illustrates that the crack dam CRD includes one organic layer, but the present disclosure is not limited thereto. For example, the crack dam CRD may further include another organic layer including the same material as the second organic layer 180. Alternatively, the crack dam CRD may further include another organic layer including the same material as the bank 190. Alternatively, the crack dam CRD may further include another organic layer includ-ing the same material as the spacer 191.

The first power supply line VSL may include the same material as the first data metal layer including the first connection electrode CE1 and the data lines, and may be located on/at the same layer. The first power supply line VSL may be located on the second interlayer insulating layer 142. The first power supply line VSL may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

The first dam DAM1 and the second dam DAM2 may be located on the first power supply line VSL. The first dam DAM1 may include a first sub-dam SDAM1 and a second sub-dam SDAM2, and the second dam DAM2 may include a first sub-dam SDAM1, a second sub-dam SDAM2, and a third sub-dam SDAM3. The first sub-dam SDAM1 may include the same material as the first organic layer 160, and may be located on/at the same layer. The second sub-dam SDAM2 may include the same material as the second organic layer 180, and may be located on/at the same layer. The third sub-dam SDAM3 may include the same material as the bank 190, and may be located on/at the same layer.

The height of the first dam DAM1 may be lower than the height of the second dam DAM2, but the present disclosure is not limited thereto. The height of the first dam DAM1 may be substantially the same as the height of the second dam DAM2 or may be higher than the height of the second dam DAM2.

The common electrode 173 may be connected to the first organic layer 160, the second organic layer 180, and the first power supply line VSL that is not covered by the first dam DAM1 and that is exposed. Accordingly, the common electrode 173 may receive the first power supply voltage of the first power supply line VSL.

The first encapsulating inorganic layer TFE1 may cover the first dam DAM1, the second dam DAM2, and the crack dam CRD in the non-display area NDA on the side of the display panel 100. The first encapsulating inorganic layer TFE1 may extend adjacent to the edge EG of the display panel 100 in the non-display area NDA under the display panel 100. The first encapsulating inorganic layer TFE1 may be spaced apart from the lateral side of the substrate SUB inward.

The encapsulating organic layer TFE2 may cover the upper surface of the first dam DAM1 while not covering the upper surface of the second dam DAM2. However, the embodiments of the present specification are not limited thereto. The encapsulating organic layer TFE2 may not cover both the upper surface of the first dam DAM1 and the upper surface of the second dam DAM2. The encapsulating organic layer TFE2 may not overflow to the edge EG of the display panel 100 due to the first dam DAM1 and the second dam DAM2.

The second encapsulating inorganic layer TFE3 may cover the first dam DAM1, the second dam DAM2, and the crack dam CRD in the non-display area NDA under the display panel 100. The second encapsulating inorganic layer TFE3 may extend adjacent to the edge EG of the display panel 100 in the non-display area NDA under the display panel 100. The second encapsulating inorganic layer TFE3 may be inwardly spaced from the lateral side of the substrate SUB.

An inorganic encapsulating area in which the first encapsulating inorganic layer TFE1 and the second encapsulating inorganic layer TFE3 contact each other may be formed from the second dam DAM2 to the edge EG of the display panel 100. The inorganic encapsulating area may surround the crack dam CRD.

The organic planarization layer ORL may cover the upper surface of the second encapsulating inorganic layer TFE3. The organic planarization layer ORL may be located in direct contact with the upper surface of the second encapsulating inorganic layer TFE3. The lateral side of the organic planarization layer ORL may be inwardly spaced from the lateral side of the substrate SUB. Because the organic planarization layer ORL is first removed through the laser ablation process before the cutting process of the substrate SUB, the lateral side of the organic planarization layer ORL may be spaced apart from the lateral side of the substrate SUB. A distance DD between the lateral side of the organic planarization layer ORL and the lateral side of the substrate SUB may be less than a distance between the lateral side of the second dam DAM2 and the lateral side of the substrate SUB. Also, the distance DD between the lateral side of the organic planarization layer ORL and the lateral side of the substrate SUB may be less than the distance between the lateral side of the crack dam CRD and the lateral side of the substrate SUB. A distance DD between the lateral sides of the organic planarization layer ORL may be about 50 μm or less between the lateral sides of the substrate SUB.

When the laser ablation process of the organic planarization layer ORL is not performed, and when the cutting process of the substrate SUB is performed, the organic planarization layer ORL is lifted or physically damaged at the edge of the substrate SUB, thereby causing a foreign matter issue. In the present disclosure, it is possible to reduce or prevent the likelihood of the organic planarization layer ORL being lifted or physically damaged at the edge of the substrate SUB by cutting the substrate SUB after the laser ablation process of the organic planarization layer ORL is performed.

The organic planarization layer ORL may have a side inclined surface OS by the laser ablation process. That is, the lateral side of the organic planarization layer ORL may be the inclined surface OS. The inclined surface OS of the organic planarization layer ORL may form an angle (e.g., predetermined angle) and a width (e.g., predetermined width) with respect to the upper surface of the substrate SUB. An angle θ11 between the inclined surface OS of the organic planarization layer ORL and the upper surface of the substrate SUB, or the upper surface of the second encapsulating inorganic layer TFE3, may be less than or equal to about 90 degrees. In addition, the width TD of the inclined surface OS of the organic planarization layer ORL (e.g., a difference in position between the top of the inclined surface OS and the bottom of the inclined surface OS in the X-axis direction) may be in a range of about 10 μm to about 150 μm.

According to the laser ablation process, not only the organic planarization layer ORL, but also the second encapsulating inorganic layer TFE3, the first encapsulating inorganic layer TFE1, the second interlayer insulating layer 142, the first interlayer insulating layer 141, the gate insulating layer 130, and even the first buffer layer BF1 located under the organic planarizing layer ORL may be removed. However, the present disclosure is not limited thereto, and the first buffer layer BF1 may remain and extend to the side surface of the substrate SUB.

Meanwhile, in FIG. 12, a scan thin film transistor STFT of the scan-driving circuit SDC is illustrated. Because the scan thin film transistor STFT is substantially the same as the thin film transistor TFT described with reference to FIG. 5, a description of the scan thin film transistor STFT will be omitted.

Figure 13:
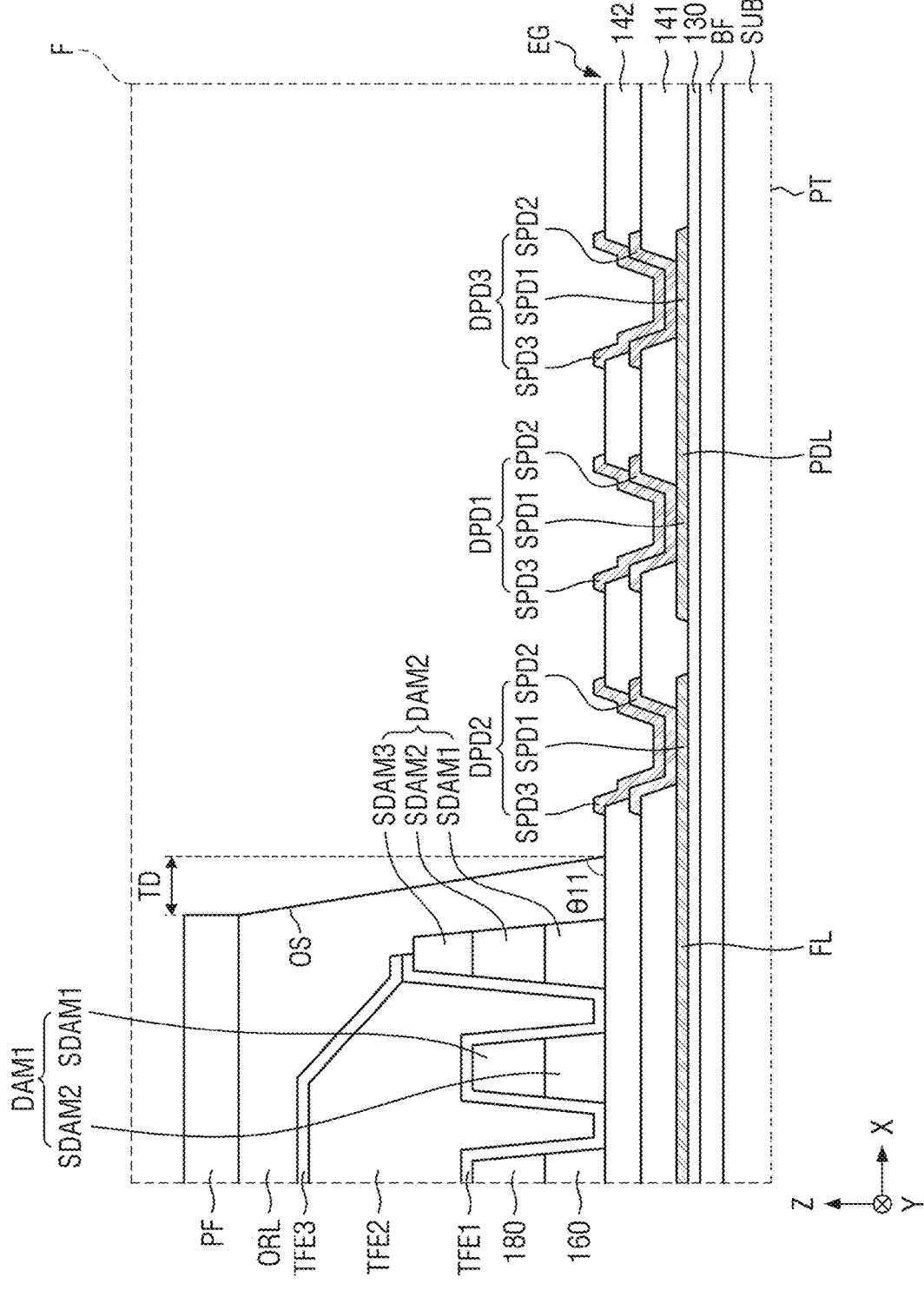
FIG. 13 is an enlarged cross-sectional view illustrating an example of area F of FIG. 10 in detail.

FIG. 13 is an enlarged cross-sectional view illustrating an example of area F of FIG. 10 in detail.

Referring to FIG. 13, each of the display pad PD, the first driving pad DPD1, and the second driving pad DPD2 may include a first sub pad SPD1, a second sub pad SPD2, and a third sub pad SPD3.

The first sub pad SPD1 may include the same material as the first gate metal layer including the gate electrode TG, the first capacitor electrode CAE1 of the capacitor Cst, and the scan lines, and may be located on/at the same layer. The first sub pad SPD1 may be located on the gate insulating layer 130. The first sub pad SPD1 may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

The second sub pad SPD2 may include the same material as the second gate metal layer including the second capacitor electrode CAE2 and may be located on/at the same layer. The second sub pad SPD2 may be located on the first interlayer insulating layer 141. The second sub pad SPD2 may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

The third sub pad SPD3 may include the same material as the first data metal layer including the first connection electrode CE1 and the data lines and may be located on/at the same layer. The third sub pad SPD3 may be located on the second interlayer insulating layer 142. The third sub pad SPD3 may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

Figure 24:
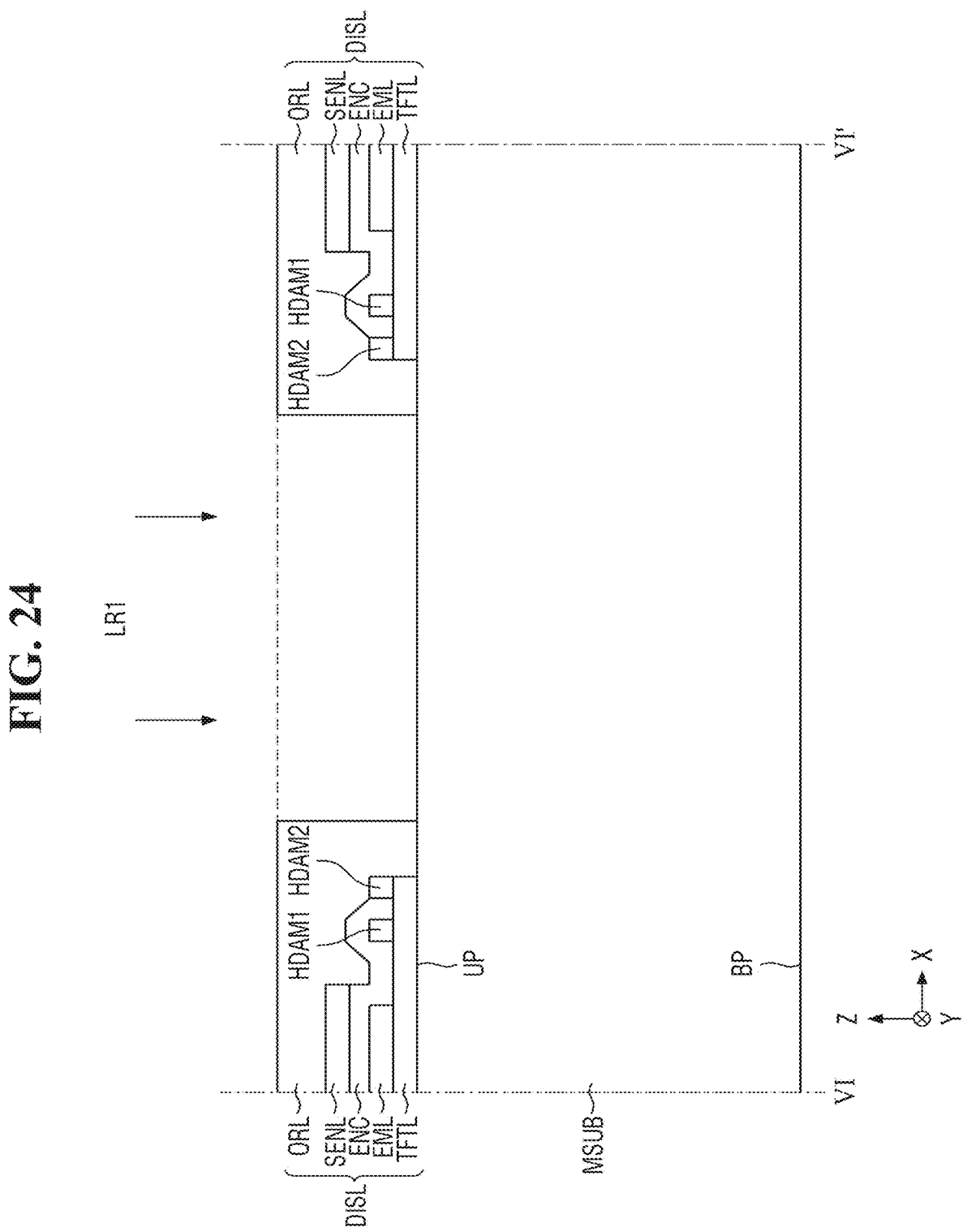

The third sub pad SPD3 of the display pad PD may be electrically connected to the circuit board 300 through the conductive adhesive member, such as the anisotropic conductive film or the anisotropic conductive adhesive. The third sub pad SPD3 of the first driving pad DPD1 may be electrically connected to an input bump of the driving IC 200 through the conductive adhesive member, such as the anisotropic conductive film or the anisotropic conductive adhesive. The third sub pad SPD3 of the second driving pad DPD2 may be electrically connected to an output bump of the driving IC 200 through the conductive adhesive member, such as the anisotropic conductive film or the anisotropic conductive adhesive. In FIG. 24, the driving IC 200 and the circuit board 300 are omitted for convenience of description.

The first encapsulating inorganic layer TFE1 and the second encapsulating inorganic layer TFE2 may cover the first dam DAM1, and may partially cover the second dam DAM2. For example, the first encapsulating inorganic layer TFE1 and the second encapsulating inorganic layer TFE2 might not cover a portion of the upper surface of the second dam DAM2. Alternatively, the first encapsulating inorganic layer TFE1 and the second encapsulating inorganic layer TFE2 may be covered, but in this case, the third sub pad SPD3 of the second driving pad DPD2 might not be covered. That is, the first encapsulating inorganic layer TFE1 and the second encapsulating inorganic layer TFE2 may not extend to the display pad PD, the first driving pad DPD1, and the second driving pad DPD2 adjacent the edge EG of the display panel 100.

The organic planarization layer ORL may cover the upper surface of the second encapsulating inorganic layer TFE3. The organic planarization layer ORL may cover the first dam DAM1, but may only partially cover a portion of the second dam DAM2. However, the present disclosure is not limited thereto, and the organic planarization layer ORL may completely cover the second dam DAM2. The organic planarization layer ORL may extend between the second driving pad DPD2 and the second dam DAM2. The organic planarization layer ORL may be located in direct contact with the upper surface of the second interlayer insulating layer 142.

The lateral side of the organic planarization layer ORL may be spaced inwardly from the lateral side of the substrate SUB. In addition, the organic planarization layer ORL may have the side inclined surface OS by the laser ablation process. The angle 811 between the inclined surface OS of the organic planarization layer ORL and the upper surface of the substrate SUB, or between the inclined surface OS of the organic planarization layer ORL and the upper surface of the second interlayer insulating layer 142, may be less than or equal to about 90 degrees. In addition, the width TD of the inclined surface OS of the organic planarization layer ORL (e.g., a difference in position between the top of the inclined surface OS and the bottom of the inclined surface OS in the X-axis direction) may be in a range of about 10 μm to about 150 μm.

Figure 14:
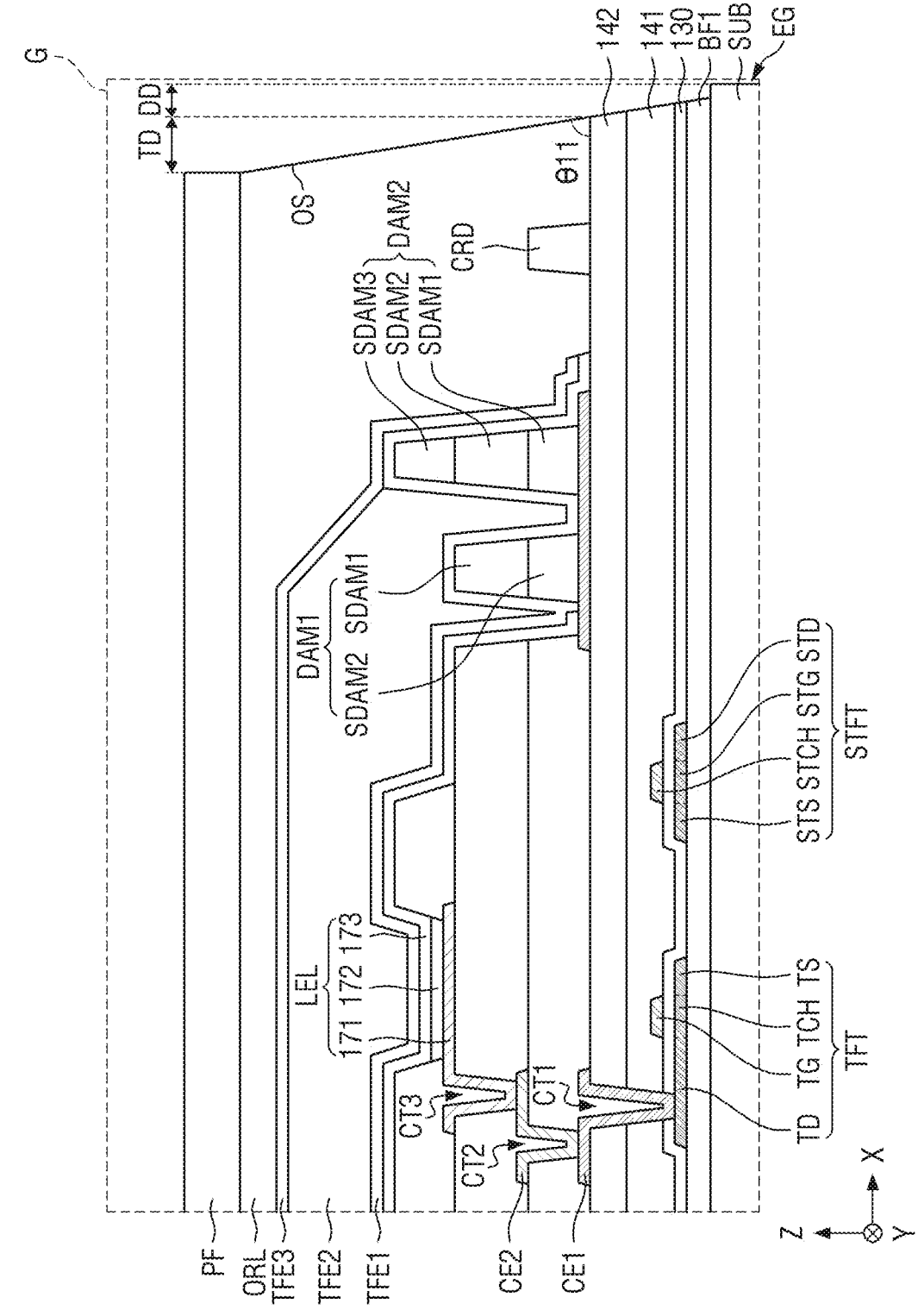
FIG. 14 is an enlarged cross-sectional view illustrating an example of area G of FIG. 11 in detail.

FIG. 14 is an enlarged cross-sectional view illustrating an example of area G of FIG. 11 in detail.

Referring to FIG. 14, the first encapsulating inorganic layer TFE1 and the second encapsulating inorganic layer TFE3 might not cover the crack dam CRD in the non-display area NDA on the upper side of the display panel 100. That is, in the non-display area NDA of the upper side of the display panel 100, the first encapsulating inorganic layer TFE1 and the second encapsulating inorganic layer TFE3 may not extend to the edge EG of the display panel 100.

In addition, in the non-display area NDA on the upper side of the display panel 100 and in the non-display area NDA on the left and right sides of the display panel 100, the first encapsulating inorganic layer TFE1 and the second encapsulating inorganic layer TFE3 might not cover the crack dam CRD. That is, in the non-display area NDA on the upper side of the display panel 100, as well as in the non-display area NDA on the left and right sides of the display panel 100, the first encapsulating inorganic layer TFE1 and the second encapsulating inorganic layer TFE3 might not extend to the edge EG of the display panel 100.

The organic planarization layer ORL may cover the upper surface of the second encapsulating inorganic layer TFE3 and the crack dam CRD. The organic planarization layer ORL may be located in direct contact with the upper surface of the second interlayer insulating layer 142. The lateral side of the organic planarization layer ORL may be inwardly spaced from the lateral side of the substrate SUB. The distance DD between the lateral sides of the organic planarization layer ORL may be about 50 μm or less between the lateral sides of the substrate SUB.

In addition, the organic planarization layer ORL may have the side inclined surface OS by the laser ablation process. The angle 811 between the inclined surface OS of the organic planarization layer ORL and the upper surface of the substrate SUB, or between the inclined surface OS of the organic planarization layer ORL and the upper surface of the second interlayer insulating layer 142, may be less than or equal to about 90 degrees. Also, the width TD of the inclined surface OS of the organic planarization layer ORL (e.g., a difference in position between the top of the inclined surface OS and the bottom of the inclined surface OS in the X-axis direction) may be in a range of about 10 μm to about 150 μm.

Figure 15:
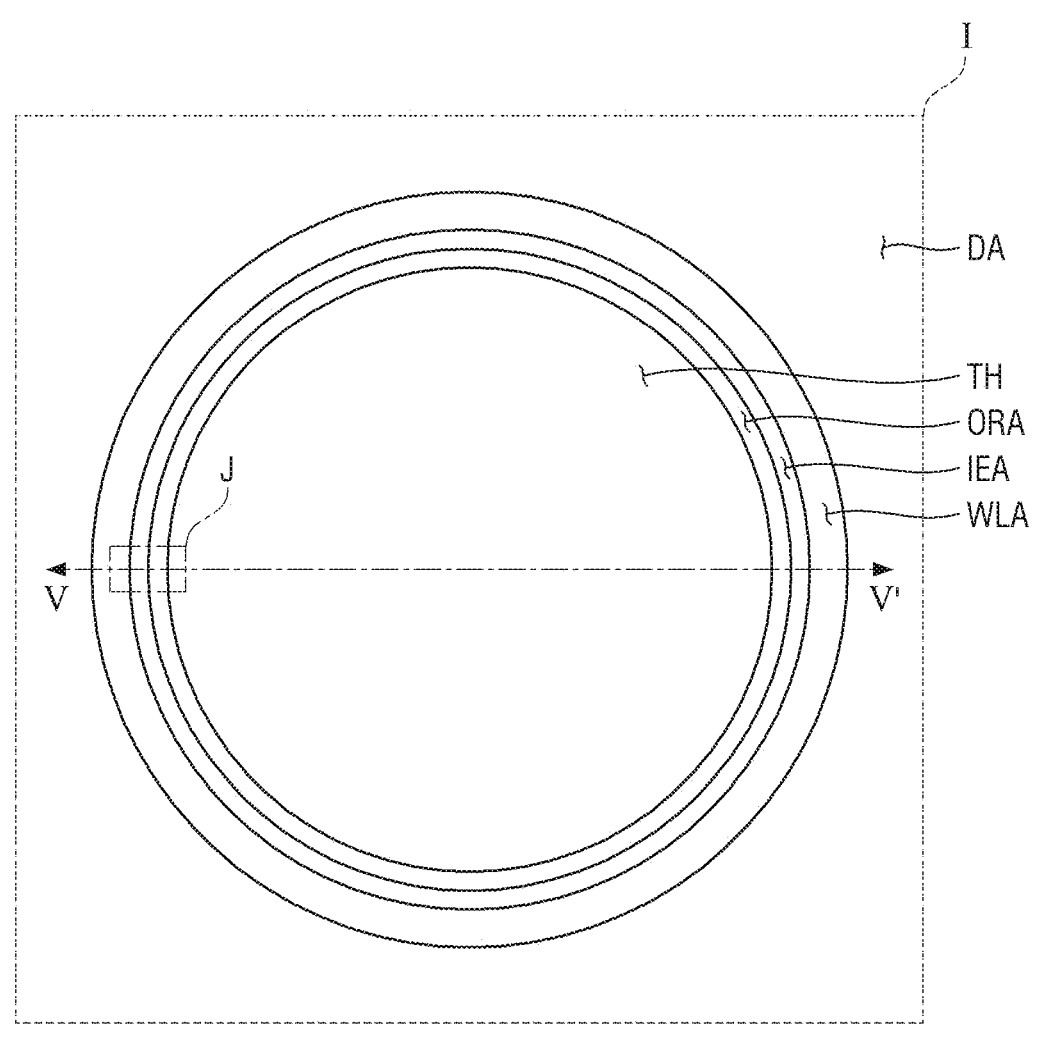
FIG. 15 is a layout diagram illustrating an example of a through hole, an inorganic encapsulation area, a wiring area, and a display area of a display panel according to one or more embodiments.
Figure 16:
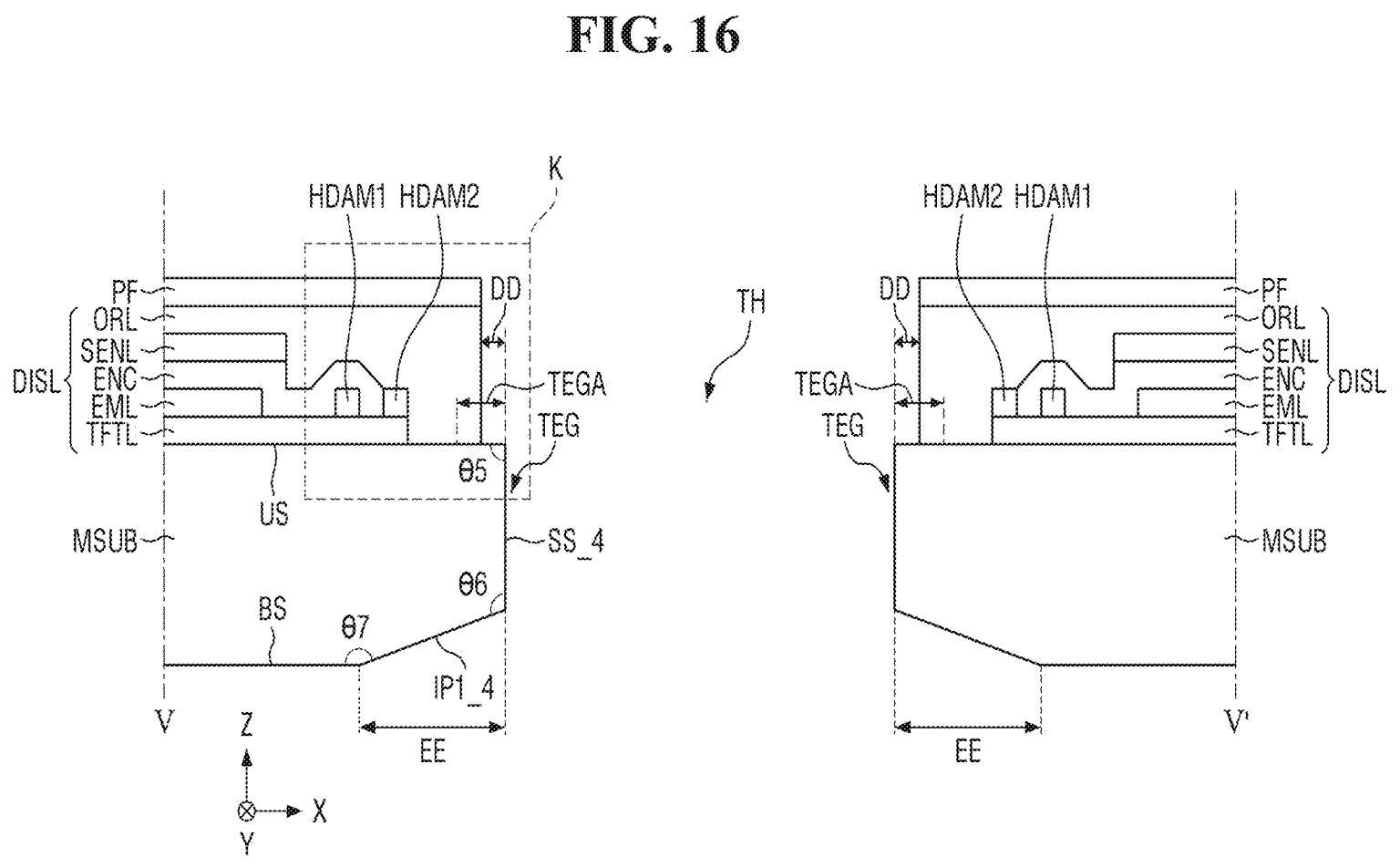
Figure 17A:
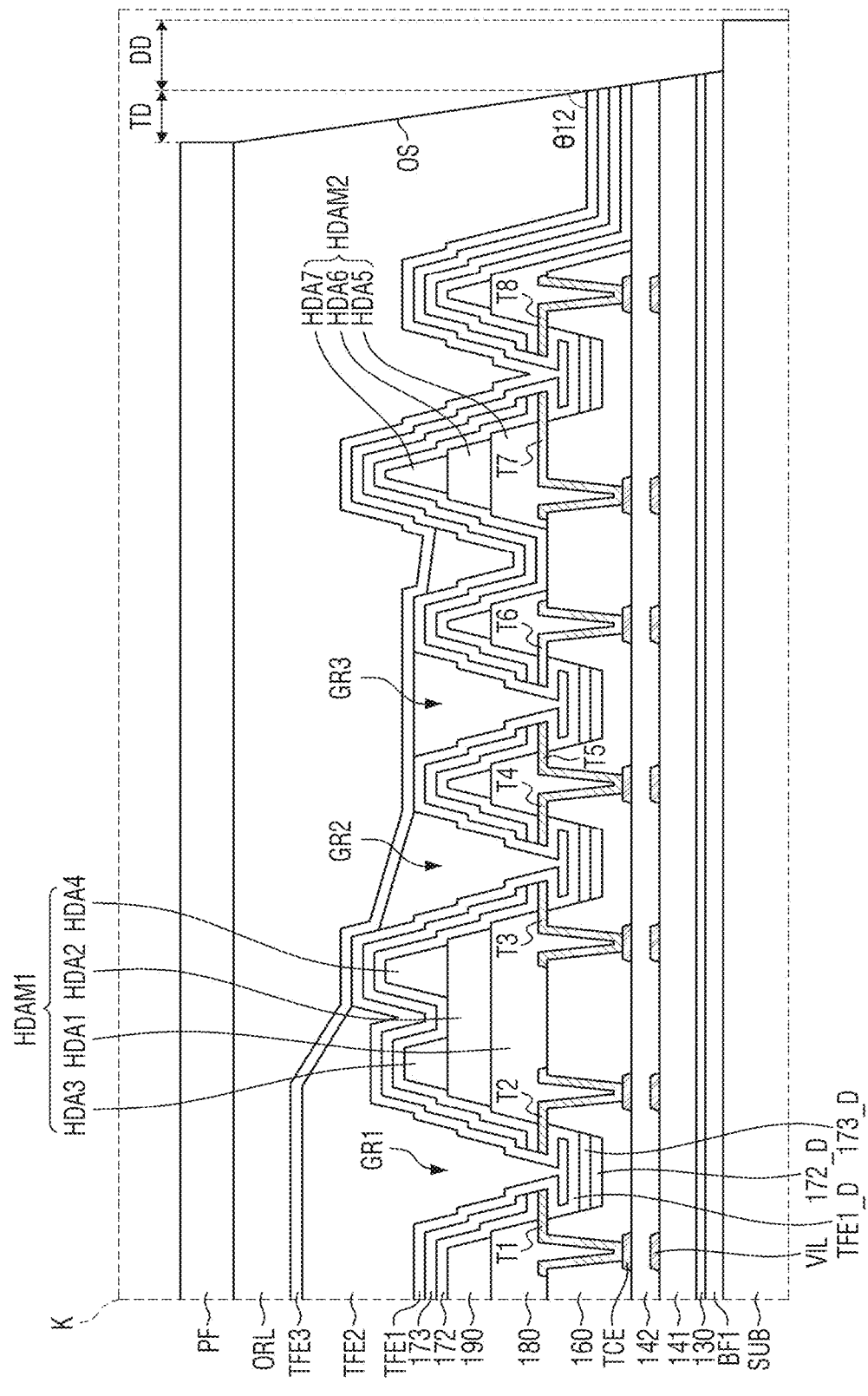
FIGS. 17A and 17B are enlarged cross-sectional views illustrating in detail examples of an area K of FIG. 16.
Figure 17B:
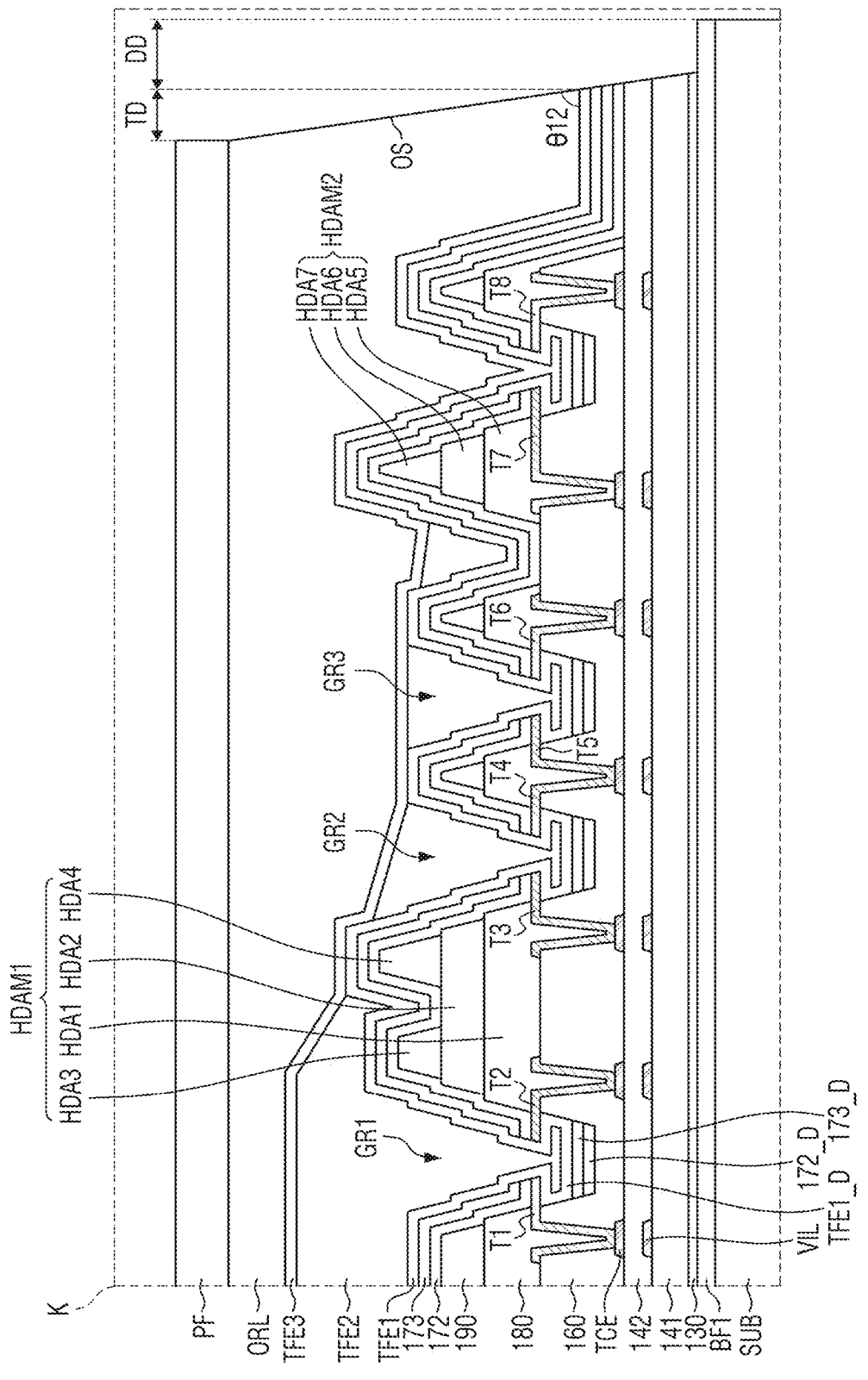

FIG. 15 is a layout diagram illustrating an example of a through hole, an inorganic encapsulation area, a line area, and a display area of a display panel according to one or more embodiments. FIG. 16 is a cross-sectional view illustrating an example of the display panel taken along the line V-V' of FIG. 15. FIGS. 17A and 17B are enlarged cross-sectional views illustrating in detail examples of an area K of FIG. 16.

Referring to FIGS. 15 to 17B, the display panel 100 according to one or more embodiments includes an organic planarization area ORA surrounding the through hole TH, an inorganic encapsulating area IEA, and a line area WLA surrounding the inorganic encapsulating area IEA.

The organic planarization area ORA may be an area in which the organic planarization layer ORL is formed on the substrate SUB to planarize the step difference therebetween. The organic planarization area ORA may be the same as the area in which the polarizing film PF is located.

In the inorganic encapsulating area IEA, the first encapsulating inorganic layer TFE1 and the second encapsulating inorganic layer TFE3 of the encapsulating layer ENC contact each other, and thus the inorganic encapsulating area IEA may be a layer for reducing or preventing oxygen or moisture from penetrating into the light-emitting element layer EML of the display layer DISL due to the through hole TH.

The inorganic encapsulating area IEA may include at least one dam, at least one tip, and at least one groove. For example, the inorganic encapsulating area IEA may include a first dam HDAM1, a second dam HDAM2, first to eighth tips T1 to T8, and first to third grooves GR1 to GR3 as shown in FIGS. 17A and 17B, which will be described later.

The first tip T1 and the second tip T2 may be located closer to the line area WLA than the first dam HDAM1. The first tip T1 may be located closer to the line area WLA than the second tip T2. The second tip T2 may be located between the first tip T1 and the first dam HDAM1.

The third tip T3, the fourth tip T4, the fifth tip T5, and the sixth tip T6 may be located between the first dam HDAM1 and the second dam HDAM2. At least a portion of the third tip T3 may overlap the first dam HDAM1 in the third direction (Z-axis direction).

The seventh tip T7 and the eighth tip T8 may be located closer to the through hole TH than the second dam HDAM2. At least a portion of the seventh tip T7 may overlap the second dam HDAM2 in the third direction (Z-axis direction). A distance between the eighth tip T8 and the through hole TH may be about 50 μm.

The first groove GR1 may be located between the first tip T1 and the second tip T2. The second groove GR2 may be located between the third tip T3 and the fourth tip T4. The third groove GR3 may be located between the fifth tip T5 and the sixth tip T6.

The line area WLA may be an area in which bypass lines, which are suitable due to the through hole TH, are located. Some of the bypass lines may be connected to the data lines, and others of the bypass lines may be connected to a second power line to which a second power voltage, which is greater than the first power voltage, is applied. Still, some of the bypass lines may be connected to the scan lines. The line area WLA may be surrounded by the display area DA.

In FIG. 16, when the substrate SUB of the display panel 100 is cut by spraying the etchant after irradiating the laser, a cross section of the edge TEG of the through hole TH is shown after the organic planarization layer ORL is partially removed by laser ablation.

Referring to FIG. 16, a through hole edge area TEGA is an area in which processing marks are formed on the upper surface US of the substrate SUB by the etchant when the substrate SUB is cut by spraying the etchant after irradiating the laser. The through hole edge area TEGA may be within about 30 μm.

The through hole edge area TEGA may include a first inclined surface IP1_4 formed by spraying the etchant after irradiating the laser. An angle 85 between a side surface SS_4 and the upper surface US may be about 90 degrees. That is, the angle between the side surface SS_4 and the upper surface US may be substantially close to vertical. An angle θ6 formed between the side surface SS_4 and the first inclined surface IP1_4, and an angle θ7 formed between the first inclined surface IP1_4 and the bottom surface BS, may be respective obtuse angles. The processing trace formed on the upper surface UP of the substrate SUB may overlap the first inclined surface IP1_4 in the third direction (Z-axis direction).

The angle θ5 between the side surface SS_4 and the first inclined surface IP1_4, and the angle θ6 between the first inclined surface IP1_4 and the bottom surface BS, may vary depending on the depth of the laser irradiation area, which is formed by the laser, when the substrate SUB of the display panel 100 is cut by spraying the etching solution after irradiating the laser. The depth of the laser irradiation area formed by the laser to cut along the edge EG of the display panel 100 may be different from the depth of the laser irradiation area formed by the laser to cut along the edge TEG of the through hole TH.

Referring to FIGS. 17A and 17B, a third power supply line VIL may include the same material as the second gate metal layer including the second capacitor electrode CAE2 of the capacitor Cst, and may be located on/at the same layer. For example, the third power supply line VIL may be located on the first interlayer insulating layer 141. The third power supply line VIL may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

The third power supply line VIL may have a voltage that is different from the first power supply voltage and the second power supply voltage. For example, the third power supply line VIL may be an initialization voltage for initializing the pixels of the display area DA.

A tip connection electrode TCE may include the same material as the first data metal layer including the first connection electrode CE1, and the data lines and may be located on/at the same layer. For example, the tip connection electrode TCE may be located on the second interlayer insulating layer 142. The tip connection electrode TCE may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

The tip connection electrode TCE may overlap the third power supply line VIL in the third direction (Z-axis direction).

The first to eighth tips T1 to T8 may include the same material as the second data metal layer including the second connection electrode CE2, and may be located on/at the same layer. For example, the first to eighth tips T1 to T8 may be located on the first organic layer 160. The first to eighth tips T1 to T8 may be formed of a single layer or multiple layers made of any one of molybdenum (Mo), aluminum (Al), chromium (Cr), gold (Au), titanium (Ti), nickel (Ni), neodymium (Nd), and/or copper (Cu), or an alloy thereof.

Each of the first to eighth tips T1 to T8 may be connected to the respective tip connection electrode TCE through the respective contact hole penetrating the first organic layer 160. Each of the first to eighth tips T1 to T8 may include an eaves structure in which the upper and bottom surfaces are not covered by, and are exposed by, the first organic layer 160, the second organic layer 180, the first dam HDAM1, and the second dam HDAM2. The fourth tip T4 and the fifth tip T5 may be integrally formed.

A distance from the eighth tip T8 to the edge TEG of the through hole TH may be about 300 μm. The through hole edge area TEGA may be located between the eighth tip T8 and the edge TEG of the through hole TH.

The first groove GR1 may be formed between the first tip T1 and the second tip T2, the second groove GR2 may be formed between the third tip T3 and the fourth tip T4, and the third groove GR3 may be formed between the fifth tip T5 and the sixth tip T6. The first groove GR1 may have eaves structures formed by the first tip T1 and the second tip T2, the second groove GR2 may have eaves structures formed by the third tip T3 and the fourth tip T4, and the third groove GR3 may have eaves structures formed by the fifth tip T5 and the sixth tip T6.

The light-emitting layer 172 is deposited by evaporation and the common electrode 173 is deposited by sputtering. As a result, a step coverage is low, and thus the first to third grooves GR1, GR2, and GR3 may be located apart from each other. In contrast, the first encapsulating inorganic layer TFE1 and the second encapsulating inorganic layer TFE3 are deposited by chemical vapor deposition and atomic layer deposition. As a result, the step coverage is high, and thus the first to third grooves GR1, GR2, and GR3 may be continuously connected without being cut off. The step coverage refers to a ratio of the degree of coating the thin film on the inclined portion to the degree of coating the thin film on the flat portion. In each of the first to third grooves GR1, GR2, and GR3, the light-emitting layer 172, the light-emitting layer remnant 172_D, the common electrode 173, and the broken common electrode remnant 173_D may be located.

The first dam HDAM1 may include first to fourth sub-dams HDA1, HDA2, HDA3, and HDA4. The first sub-dam HDA1 may be located on the first organic layer 160 and may include the same material as the second organic layer 180. The first sub-dam HDA1 may be located on the second tip T2 and the third tip T3. The second sub-dam HDA2 may be located on the first sub-dam HDA1, and may include the same material as the bank 190. The third sub-dam HDA3 and the fourth sub-dam HDA4 may be located on the second sub-dam HDA2, and may include the same material as the spacer 191 but are not limited thereto. The fourth sub-dam HDA4 may be located closer to the through hole TH than the third sub-dam HDA3. A thickness of the fourth sub-dam HDA4 may be greater than a thickness of the third sub-dam HDA3.

The second dam HDAM2 may include fifth to seventh sub-dams HDA5, HDA6, and HDA7. The fifth sub-dam HDA5 may be located on the first organic layer 160, and may include the same material as the second organic layer 180. The fifth sub-dam HDA5 may be located on the seventh tip T7. The sixth sub-dam HDA6 may be located on the fifth sub-dam HDA5, and may include the same material as the bank 190. The seventh sub-dam HDA7 may be located on the sixth sub-dam HDA6, and may include the same material as the spacer 191 but is not limited thereto.

The first dam HDAM1 and the second dam HDAM2 may reduce or prevent the likelihood of the encapsulating organic layer TFE2 overflowing into the through hole TH.

As shown in FIGS. 17A and 17B, because the light-emitting layer 172 and the common electrode 173 are cut off in each of the first to third grooves GR1, GR2, and GR3 formed by the first to eighth tips T1 to T8, it is possible to reduce or prevent the likelihood of the light-emitting layer 172 and the common electrode 173 exposed to the through hole TH becoming a path through which oxygen, moisture, and the like penetrate.

Again, referring to FIGS. 16, 17A, and 17B, the organic planarization layer ORL may be located on the sensor electrode layer SENL. Due to the organic planarization layer ORL, the polarizing film PF may be suitably attached on the organic planarization layer ORL.

The organic planarization layer ORL may be inwardly spaced from the edge TEG of the through hole TH. For example, the substrate SUB may protrude beyond the organic planarization layer ORL in the through hole TH. The organic planarization layer ORL may be located on at least a portion of the through hole edge area TEGA. The organic planarization layer ORL may cover at least a portion of the machining trace of the through hole edge area TEGA. The distance between the end of the organic planarization layer ORL and the eighth tip T8 may be about 100 μm or more. The distance between the organic planarization layer ORL and the edge TEG of the through hole TH may be within about 50 μm.

In addition, as shown in FIG. 17A, the first buffer layer BF1, the gate insulating layer 130, the first interlayer insulating layer 141, the second interlayer insulating layer 142, the light-emitting layer 172, and the common electrode 173 may be spaced apart from the edge TEG of the through hole TH. For example, the substrate SUB may protrude more than the first buffer layer BF1, the gate insulating layer 130, the first interlayer insulating layer 141, the second interlayer insulating layer 142, the light-emitting layer 172, the common electrode 173, and the organic planarization layer ORL. That is, the first buffer layer BF1, the gate insulating layer 130, the first interlayer insulating layer 141, the second interlayer insulating layer 142, the light-emitting layer 172, and the common electrode 173 may be spaced apart from the side of the substrate SUB inward. The first buffer layer BF1, the gate insulating layer 130, the first interlayer insulating layer 141, the second interlayer insulating layer 142, the light-emitting layer 172, and the common electrode 173 may be located on at least a portion of the through hole edge area TEGA. The first buffer layer BF1, the gate insulating layer 130, the first interlayer insulating layer 141, the second interlayer insulating layer 142, the light-emitting layer 172, and the common electrode 173 may cover at least a portion of the machining trace of the through hole edge area TEGA.

The organic planarization layer ORL may have the side inclined surface OS by the laser ablation process. That is, the side of the organic planarization layer ORL may be the inclined surface OS. The inclined surface OS of the organic planarization layer ORL may form an angle (e.g., predetermined angle) and a width (e.g., predetermined width) with respect to the upper surface of the substrate SUB. An angle 812 between the inclined surface OS of the organic planarization layer ORL and the upper surface of the substrate SUB, or between the inclined surface OS of the organic planarization layer ORL and the upper surface of the second encapsulating inorganic layer TFE3, may be less than or equal to about 90 degrees. In addition, the width TD of the inclined surface OS of the organic planarization layer ORL (e.g., a difference in position between the top of the inclined surface OS and the bottom of the inclined surface OS in the X-axis direction) may be in a range of about 10 μm to about 150 μm.

Also, the first encapsulating inorganic layer TFE1 and the second encapsulating inorganic layer TFE3 may be spaced apart from each other inwardly from the edge TEG of the through hole TH. For example, the lateral side of each of the first encapsulating inorganic layer TFE1 and the second encapsulating inorganic layer TFE3 may be inwardly spaced from the lateral side of the substrate SUB. The lateral side of the organic planarization layer ORL, that is, the inclined surface, may be inwardly spaced from the lateral side of the second encapsulating inorganic layer TFE3. That is, the lateral side of the organic planarization layer ORL may be spaced apart from the lateral side of the second encapsulating inorganic layer TFE3, inwardly.

As shown in FIGS. 16 and 17A, the lateral side of the organic planarization layer ORL may be inwardly spaced from the lateral side of the substrate SUB. Because the organic planarization layer ORL is first removed through the laser ablation process before the cutting process of the substrate SUB, the lateral side of the organic planarization layer ORL may be spaced apart from a side of the substrate SUB. The distance DD between the lateral sides of the organic planarization layer ORL and the substrate SUB may be less than the in-plane width EE of the first inclined surface IP1_4 of the substrate SUB. The planar width EE of the first inclined surface IP1_4 may be a distance between the bottom surface BS and the side surface SS_4 of the planar substrate SUB (e.g., as measured with respect to the X-axis direction). Because the substrate SUB is etched by the etchant, the planar width EE of the first inclined surface IP1_4 may be formed to be relatively wide. On the other hand, because the organic planarization layer ORL is precisely removed by laser ablation, the distance DD between the lateral side of the organic planarization layer ORL and the lateral side of the substrate SUB may be formed to be relatively small. Accordingly, the distance DD between the lateral side of the organic planarization layer ORL and the lateral side of the substrate SUB may be less than the in-plane width EE of the first inclined surface IP1_4 of the substrate SUB.

Referring to FIG. 17B in conjunction with FIG. 16, in one or more other embodiments, the first buffer layer BF1 may be located in contact with the edge TEG of the substrate SUB. The first buffer layer BF1 may remain without being removed by the laser ablation process of the organic planarization layer ORL. For example, the lateral side of the first buffer layer BF1 may be aligned with, and may coincide with, the lateral side SS_4 of the substrate SUB. However, the present disclosure is not limited thereto, and the lateral side of the first buffer layer BF1 may be inwardly spaced from the lateral side SS_4 of the substrate SUB, and may protrude from the lateral side of the organic planarization layer ORL.

Figure 18:
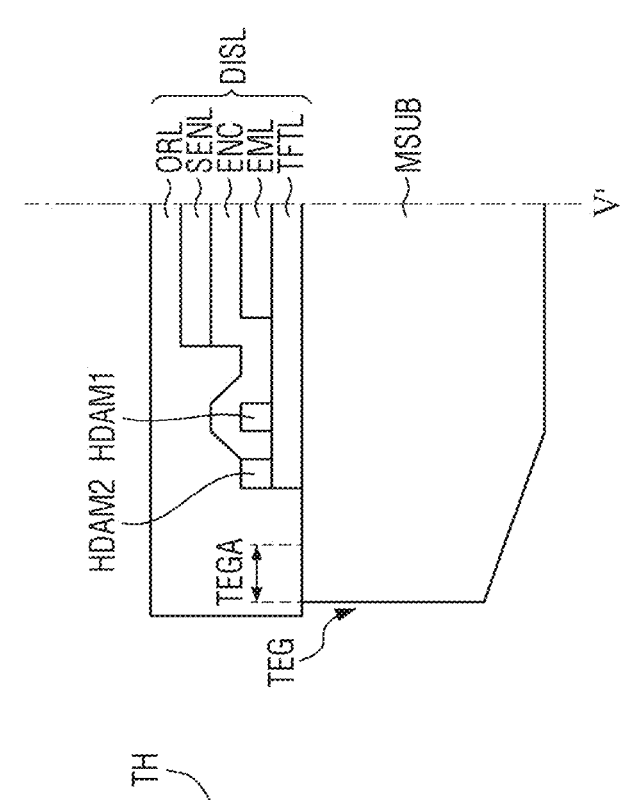
FIG. 18 is a cross-sectional view illustrating another example of the display panel taken along the line V-V' of FIG. 15.
Figure 18:
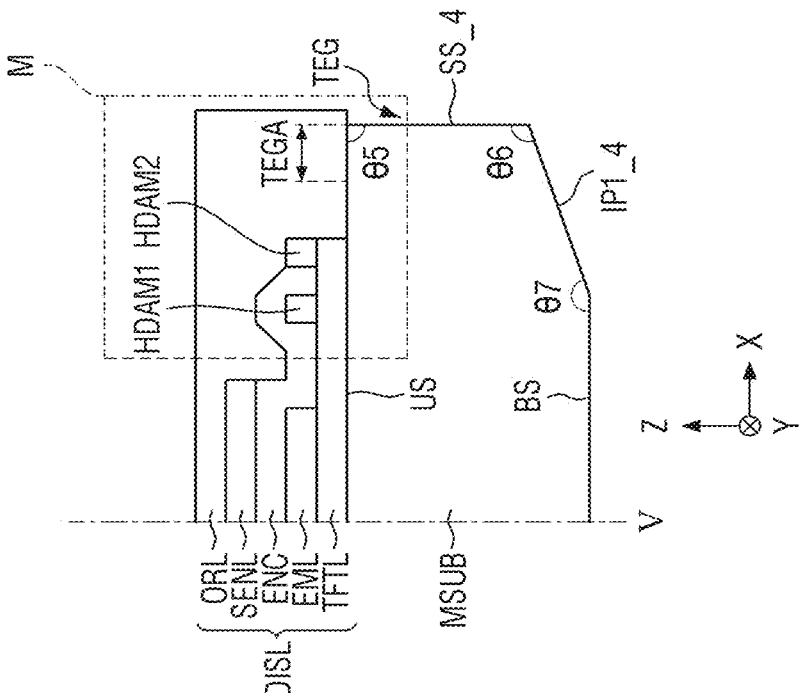
Figure 19:
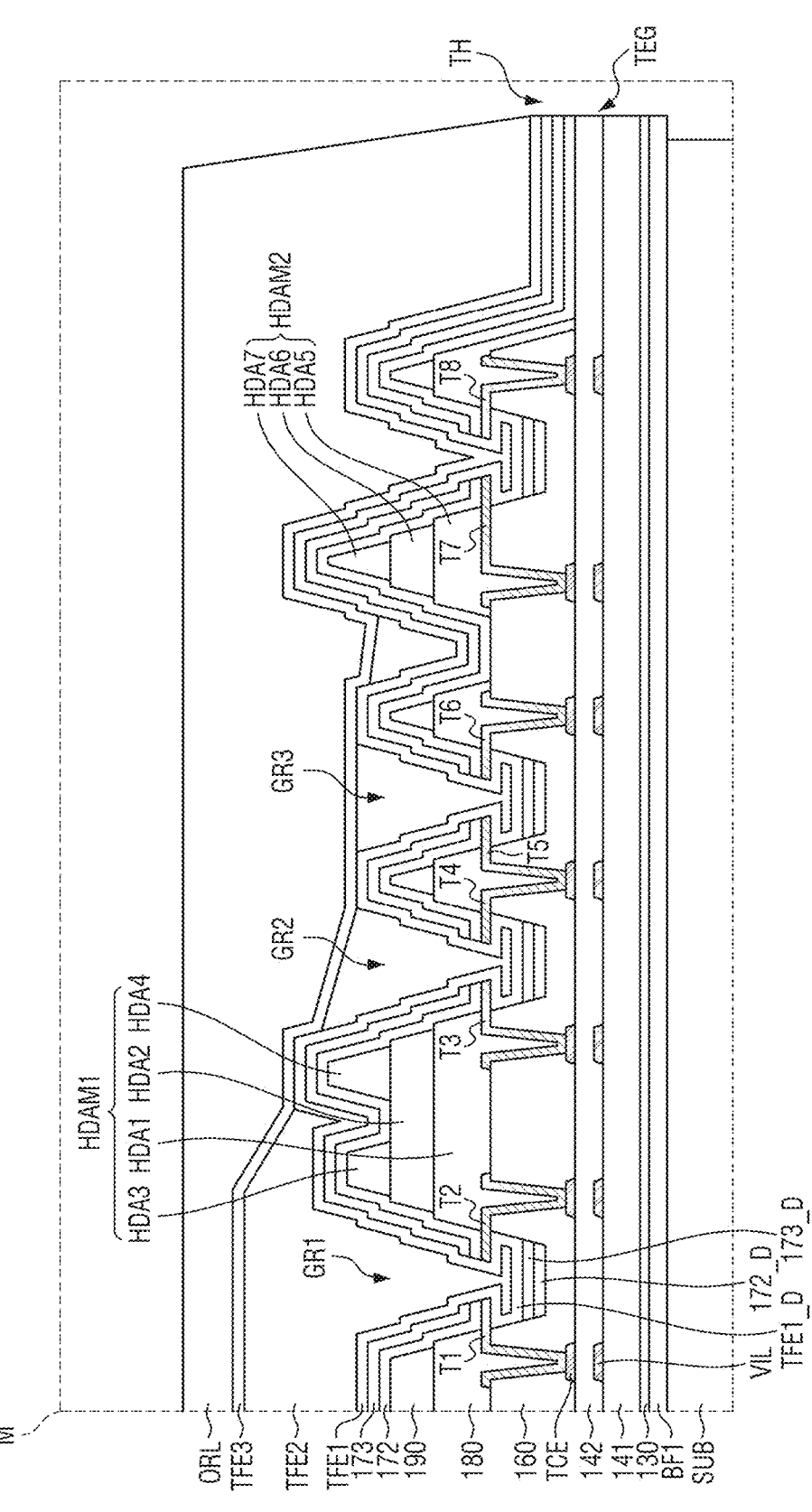
FIG. 19 is an enlarged cross-sectional view illustrating an example of the area M of FIG. 18 in detail.

FIG. 18 is a cross-sectional view illustrating another example of the display panel taken along the line V-V' of FIG. 15. FIG. 19 is an enlarged cross-sectional view illustrating an example of the area M of FIG. 18 in detail.

Referring to FIGS. 18 and 19, the organic planarization layer ORL may be located apart from the edge TEG of the through hole TH. For example, the lateral side of the organic planarization layer ORL may be formed to protrude outwardly from the lateral side of the substrate SUB from the through hole TH. The organic planarization layer ORL may protrude outwardly from the edge TEG of the through hole TH in the through hole TH. The organic planarization layer ORL may cover the machining traces of the through hole edge area TEGA.

In addition, the first buffer layer BF1, the gate insulating layer 130, the first interlayer insulating layer 141, and the second interlayer insulating layer 142 may be located apart from the edge TEG of the through hole TH. For example, the first buffer layer BF1, the gate insulating layer 130, the first interlayer insulating layer 141, and the second interlayer insulating layer 142 may protrude toward the through hole TH farther than the substrate SUB. The first buffer layer BF1, the gate insulating layer 130, the first interlayer insulating layer 141, and the second interlayer insulating layer 142 may be located in the through hole edge area TEGA. The first buffer layer BF1, the gate insulating layer 130, the first interlayer insulating layer 141, and the second interlayer insulating layer 142 may cover the processing traces of the through hole edge area TEGA.

In addition, the first encapsulating inorganic layer TFE1 and the second encapsulating inorganic layer TFE3 may be located apart from the edge TEG of the through hole TH. For example, the lateral side of each of the first encapsulating inorganic layer TFE1 and the second encapsulating inorganic layer TFE3 may protrude outwardly farther than the lateral side of the substrate SUB. The inclined surfaces of the organic planarization layer ORL may encounter the lateral side surfaces of the second encapsulating inorganic layer TFE3 to meet each other.

Meanwhile, whether the organic planarization layer ORL protrudes as compared to the substrate SUB shown in FIGS. 18 and 19 may vary depending on a difference in the order of the removal of the organic planarization layer ORL and the laser process of the substrate SUB, as will be described later.

Hereinafter, a method of manufacturing the above-described display device will be described with reference to other drawings.

Figure 20:
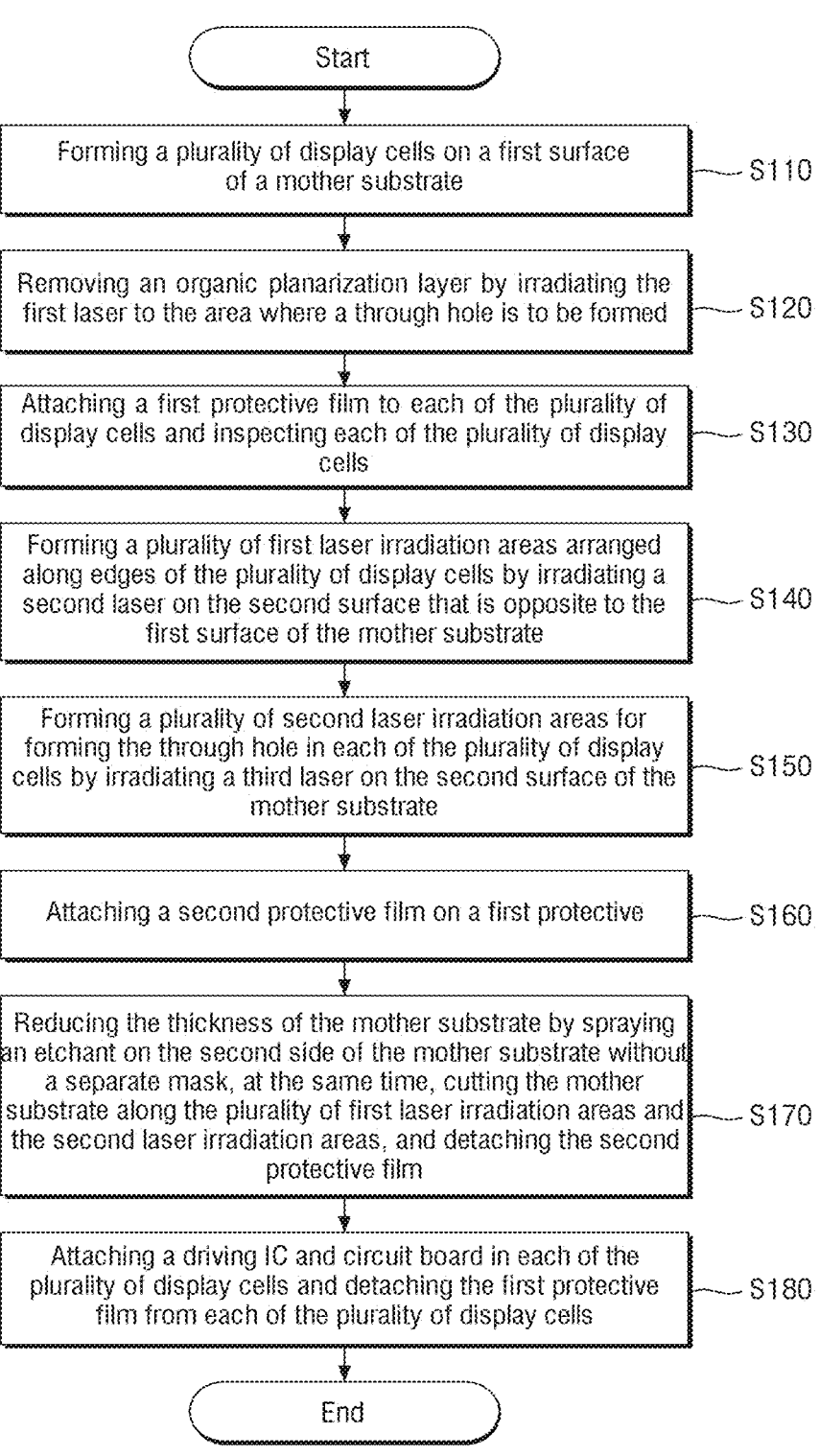
FIG. 20 is a flowchart illustrating a method of manufacturing a display device according to one or more embodiments.

FIG. 20 is a flowchart illustrating a method of manufacturing a display device according to one or more embodiments. FIGS. 21 to 35 are views for explaining a method of manufacturing a display device according to one or more embodiments.

Figure 21:
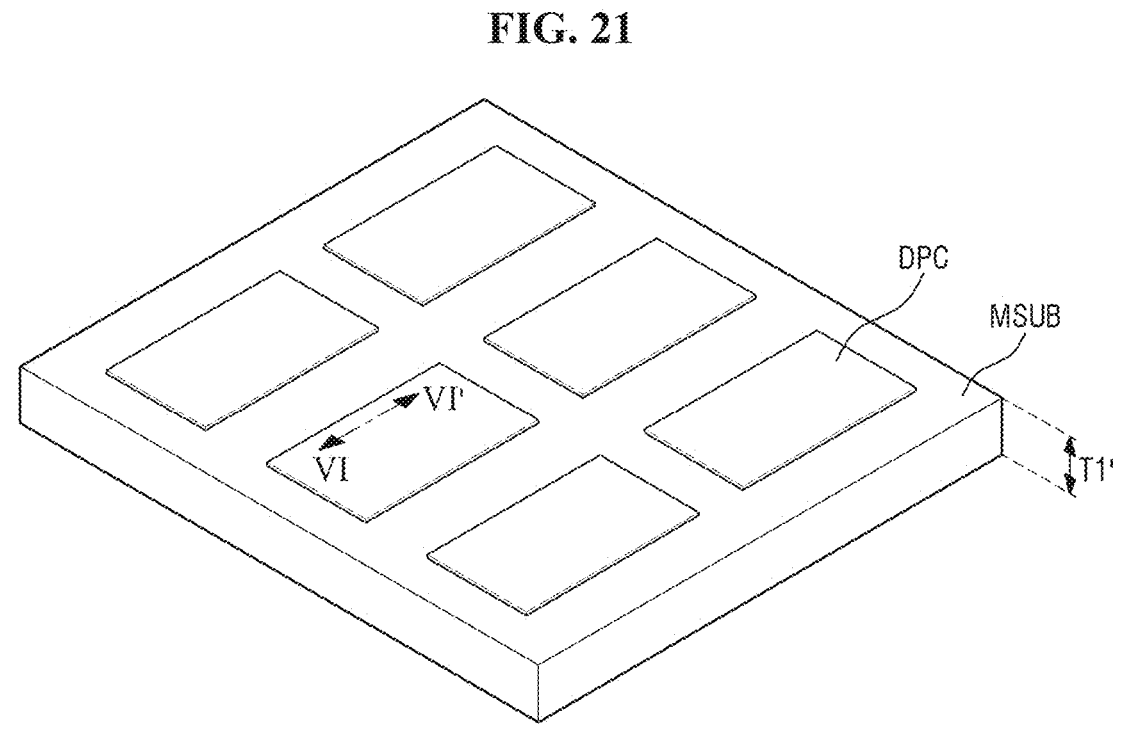
Figure 35:
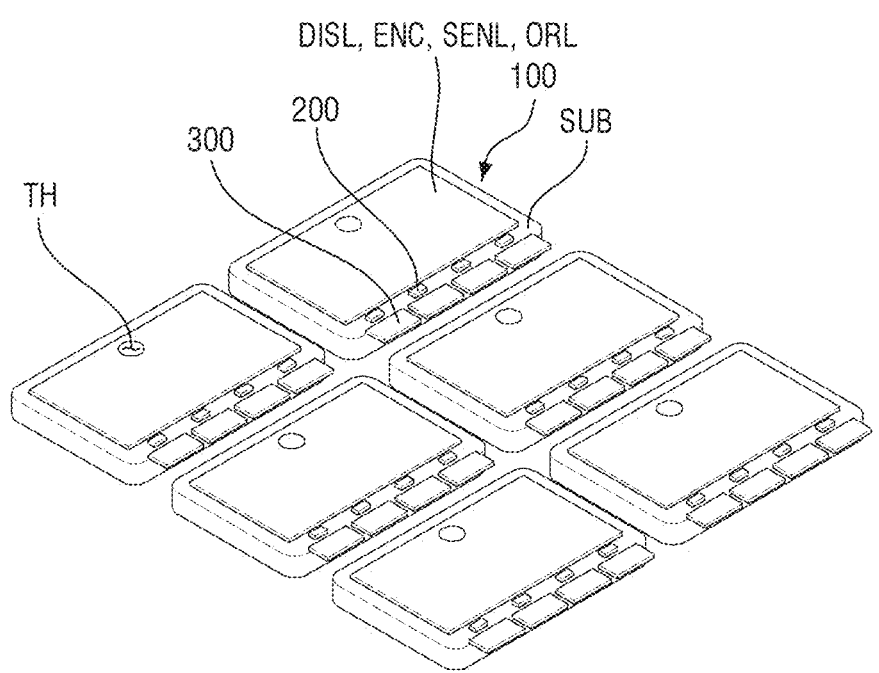

First, as shown in FIGS. 21 and 35, a plurality of display cells DPC is formed on the first surface of the mother substrate MSUB. (S110 in FIG. 20)

The display layer DISL of each of the plurality of display cells DPC is formed on the first surface of the mother substrate MSUB. The display layer DISL includes the thin film transistor layer TFTL, the light-emitting element layer EML, the encapsulating layer ENC, the sensor electrode layer SENL, and the organic planarization layer ORL. The organic planarization layer ORL may be continuously located on adjacent display cells DPC.

Figure 22:
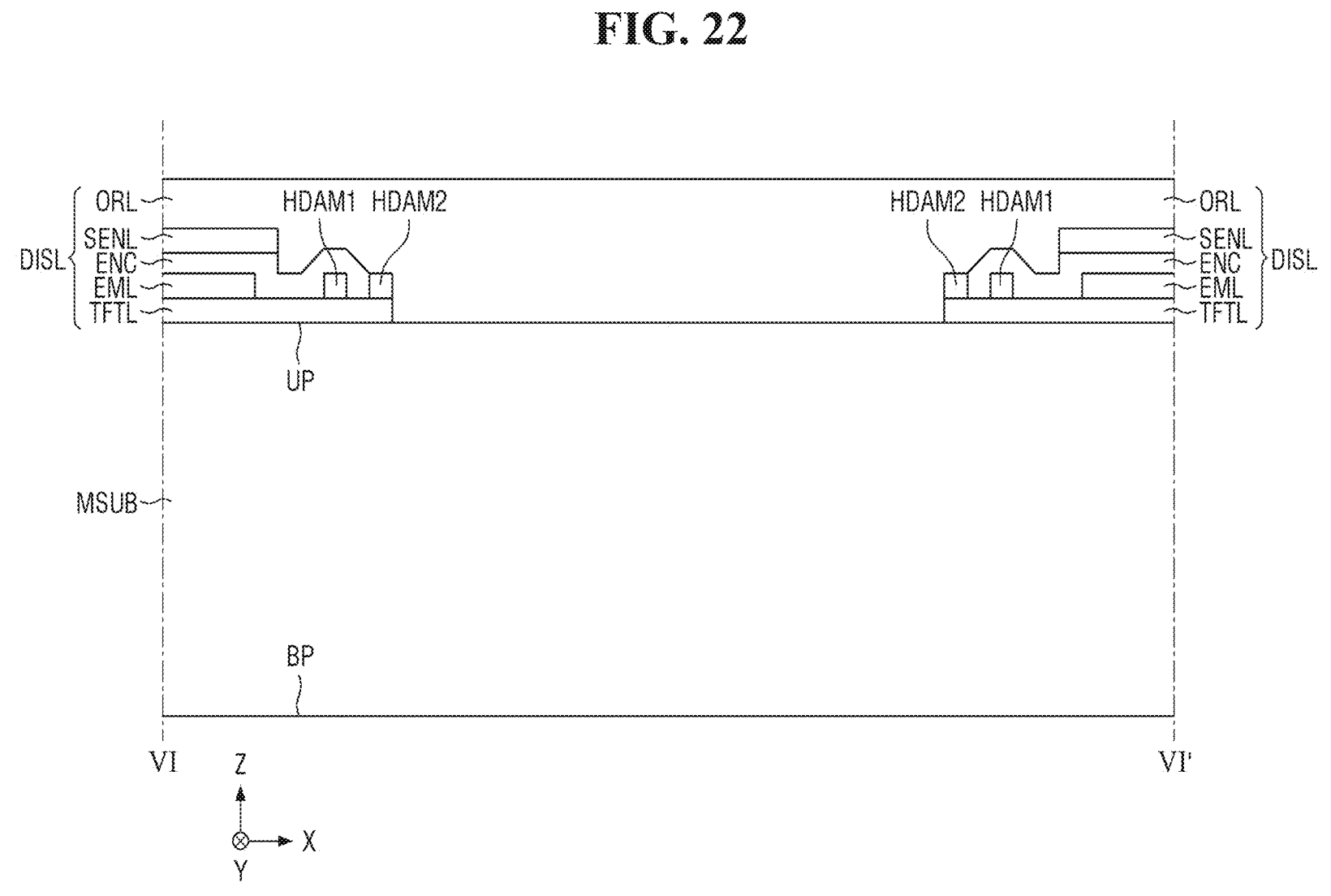
Figure 23:
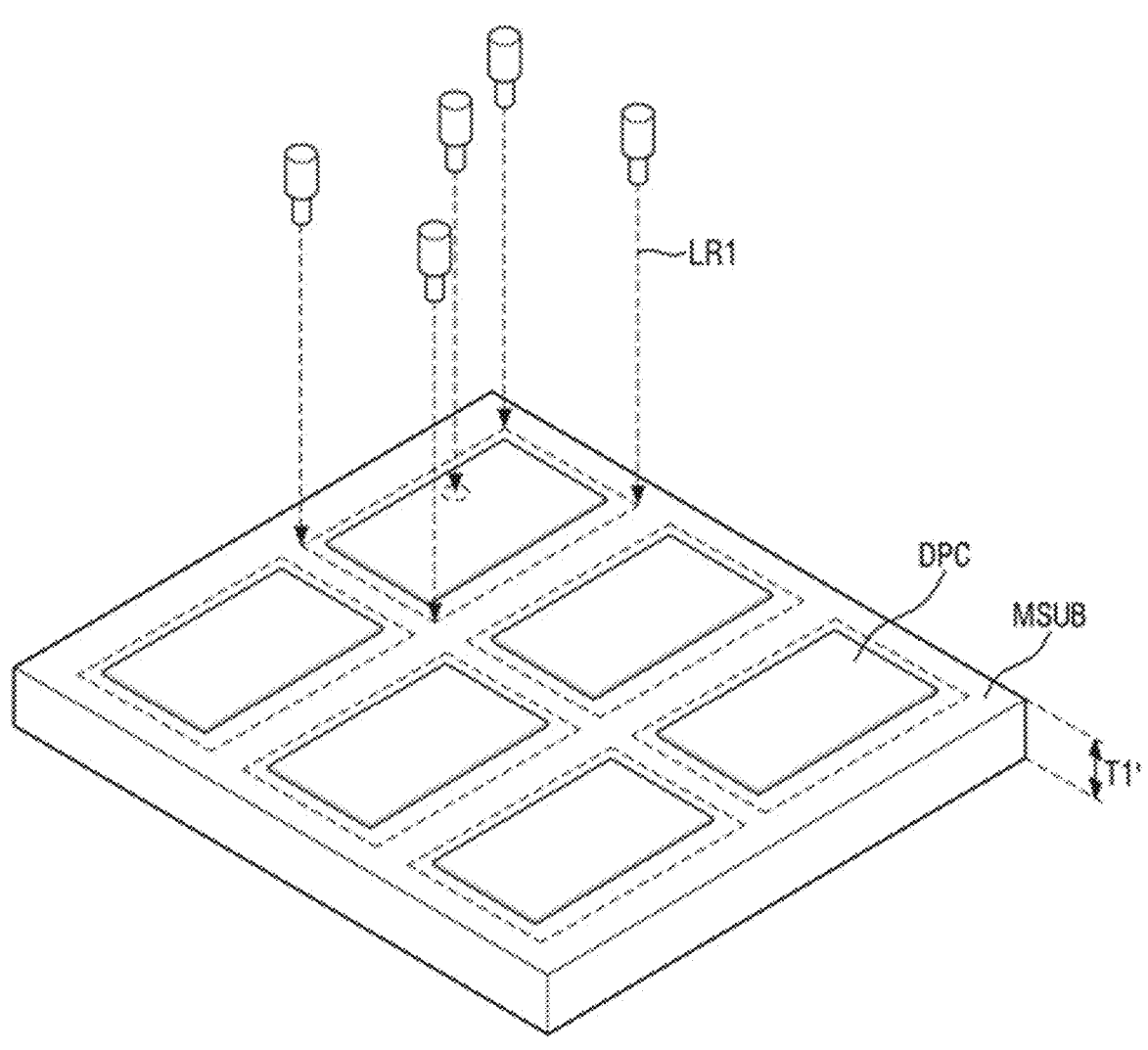

Second, as shown in FIGS. 22 to 24, the organic planarization layer ORL is partially removed by irradiating the first laser onto the second surface that is opposite to the first surface of the mother substrate MSUB (S120 in FIG. 20).

The organic planarization layer ORL may be removed through laser ablation by irradiating the first laser LR1 onto the second surface of the mother substrate MSUB. In this case, inorganic layers of the first encapsulating inorganic layer TFE1, the second encapsulating inorganic layer TFE3, and the thin film transistor layer TFTL may also be removed. That is, the layers located under the removed organic planarization layer ORL may be removed to expose the mother substrate MSUB. However, the present disclosure is not limited thereto, and the above-described first buffer layer BF1 may remain.

If the organic planarization layer ORL is not partially removed, the organic planarization layer ORL may be lifted or deformed by subsequent lasers, and the foreign material removed from the organic planarization layer ORL may be generated. In addition, when the mother substrate MSUB divided from the through hole TH is taken out, a crack may occur in the organic planarization layer ORL, or a foreign material detached from the organic planarization layer ORL may be generated as the organic planarization layer ORL is physically divided. In this case, as shown in FIGS. 18 and 19, the substrate SUB may protrude from the through hole TH more inwardly than the organic planarization layer ORL.

Figure 25:
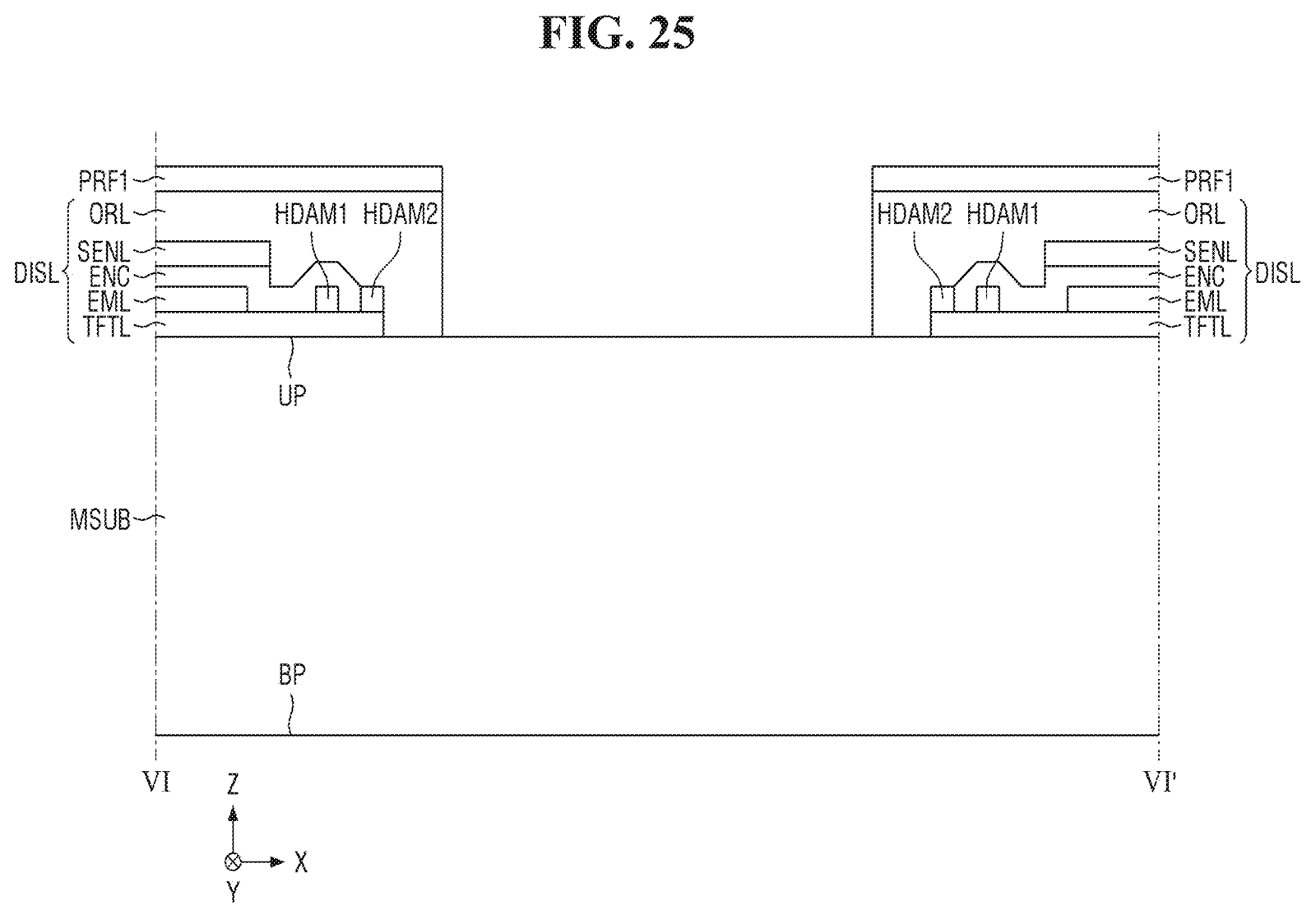

Third, as shown in FIG. 25, a plurality of first protective films PRF1 are attached on the plurality of display cells DPC, and the plurality of display cells DPC is inspected. (S130 in FIG. 20)

First, a first protective film layer is attached to cover the plurality of display cells DPC, and to cover the mother substrate MSUB located between the plurality of display cells DPC. Then, the plurality of first protective films PRF1 may be respectively located on the plurality of display cells DPC by removing a portion of the first protective film layer located on the mother substrate MSUB. That is, a portion of the first protective film layer may be removed, and the remaining portions may be the plurality of first protective films PRF1. Therefore, the plurality of first protective films PRF1 may be respectively located on the plurality of display cells DPC. That is, the plurality of first protective films PRF1 may correspond to the plurality of display cells DPC on a one-to-one basis.

Each of the plurality of first protective films PRF1 may be a buffer film for protecting the plurality of display cells DPC from external impact. The plurality of first protective films PRF1 may be made of a transparent material.

Figure 26:
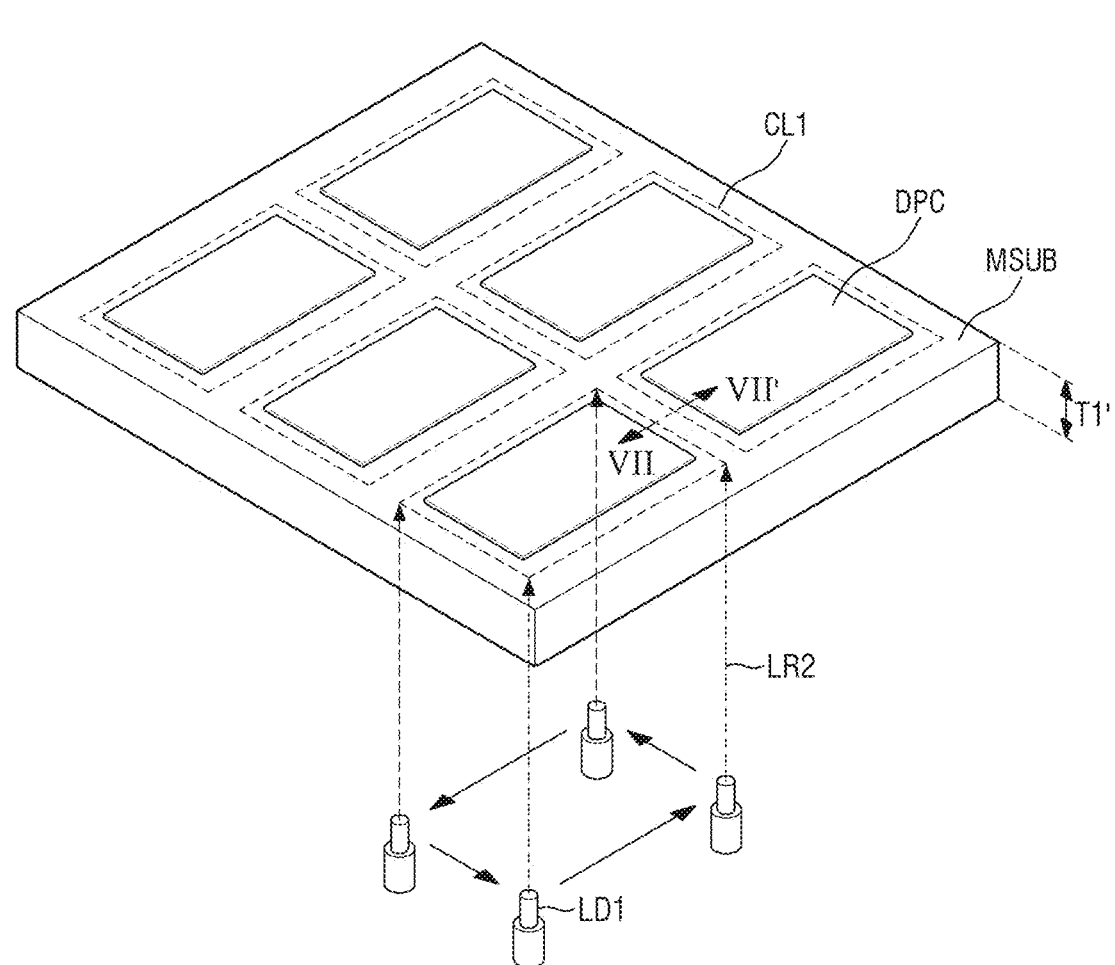
Figure 27:
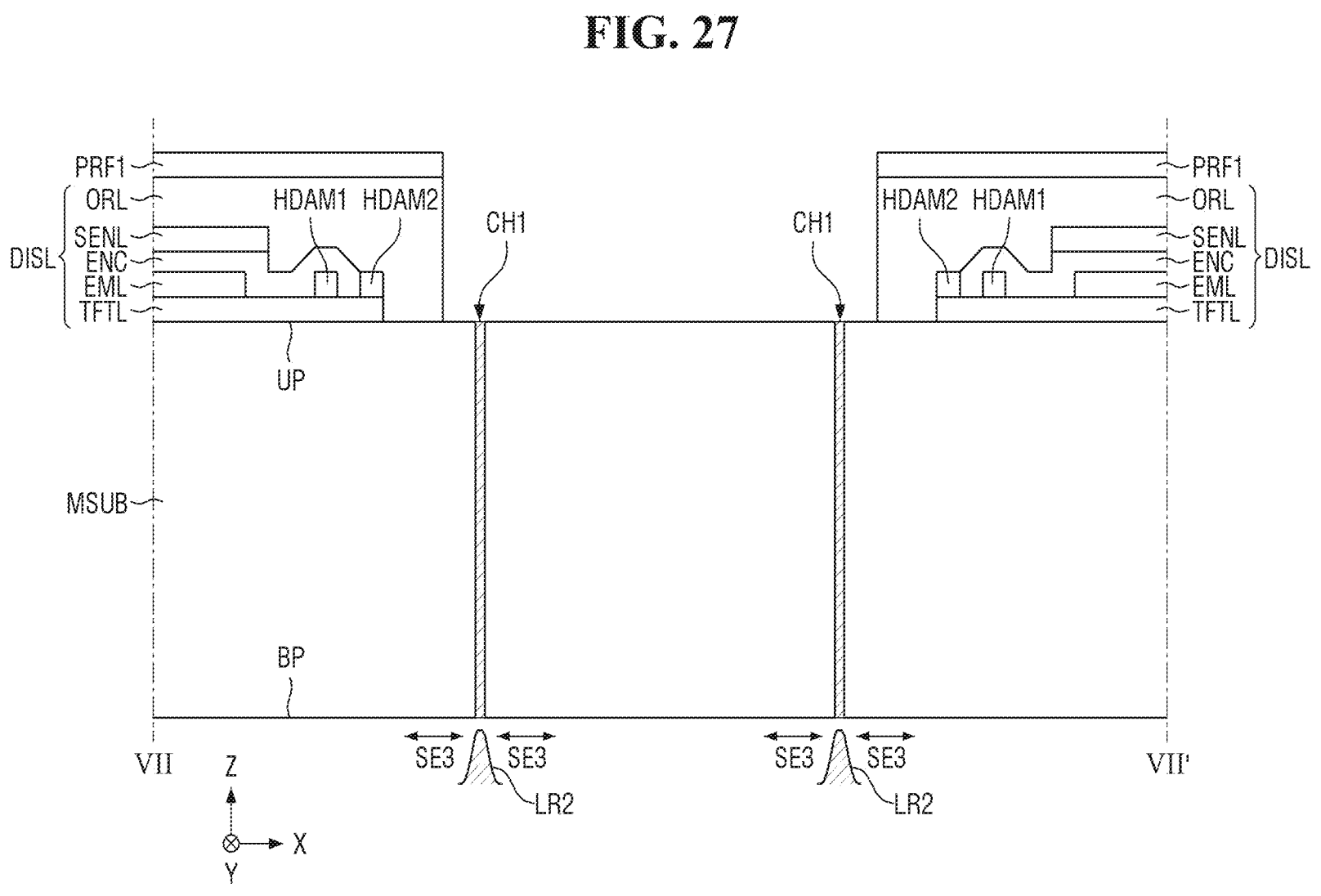

Fourth, as shown in FIGS. 26 and 27, a plurality of first laser irradiation areas CH1 is formed located along edges of the plurality of display cells DPC by irradiating a second laser LR2 on the second surface of the mother substrate MSUB. (S140 in FIG. 20)

Various lasers may be used as a second laser LR2 according to one or more embodiments, but it is exemplified that the second laser LR2 is an infrared beam Bessel beam having a wavelength of about 1030 nm in the present specification.

A first cutting line CL1 may be defined as a virtual line connecting the plurality of first laser irradiation areas CH1. The first cutting line CL1 may be formed by irradiating the second laser LR2 to form the plurality of first laser irradiation areas CH1 along the edges of the plurality of display cells DPC.

Figure 28:
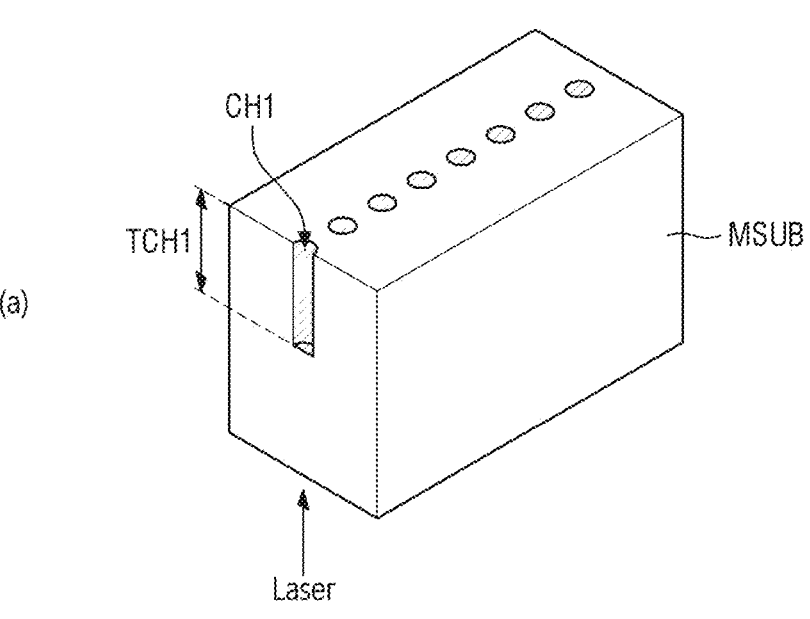
Figure 28:
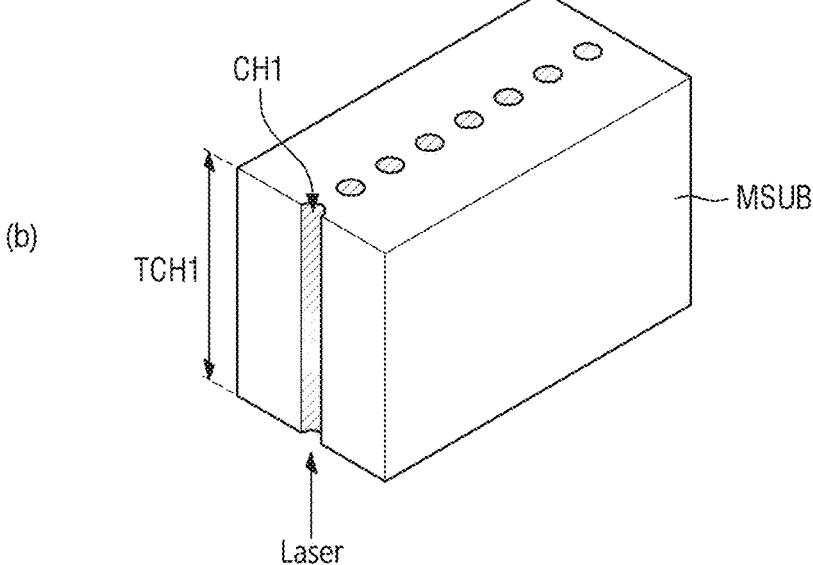

When the second laser LR2 is irradiated on the second surface of the mother substrate MSUB, the depth TCH1 (or sketch length) of each of the plurality of first laser irradiation areas CH1 formed by the second laser LR2 may be adjusted as shown in FIG. 28 by adjusting a repetition rate, a processing speed, and a pulse energy. For example, the depth TCH1 of each of the plurality of first laser irradiation areas CH1 may be at least about 200 μm from the first surface of the mother substrate MSUB as shown in FIG. 28(*a*). In addition, because the thickness of the mother substrate MSUB is about 500 μm, the depth TCH1 of each of the plurality of first laser irradiation areas CH1 may be up to about 500 μm as shown in FIG. 28(*b*). That is, the depth TCH1 of each of the plurality of first laser irradiation areas CH1 may be about 225 μm to about 500 μm from the first surface of the mother substrate MSUB. In the presently described embodiments, it will be described as an example that the depth TCH1 of the first laser irradiation areas CH1 is equal to the thickness of the mother substrate MSUB.

The second laser LR2 for forming the first laser irradiation areas CH1 may be irradiated with the repetition rate of 10 about kHz to about 250 kHz, the processing speed of about 10 mm/s to about 250 mm/s, and the pulse energy of about 10 uJ to about 300 uJ. However, it may be suitable to irradiate with the repetition rate of about 17.5 kHz to about 125 kHz, the processing speed of about 17.5 mm/s to about 125 mm/s, and the pulse energy of about 25 uJ to about 178 uJ in order for the second laser LR2 to have a depth of about 225 μm from the first surface of the mother substrate MSUB.

Figure 29:
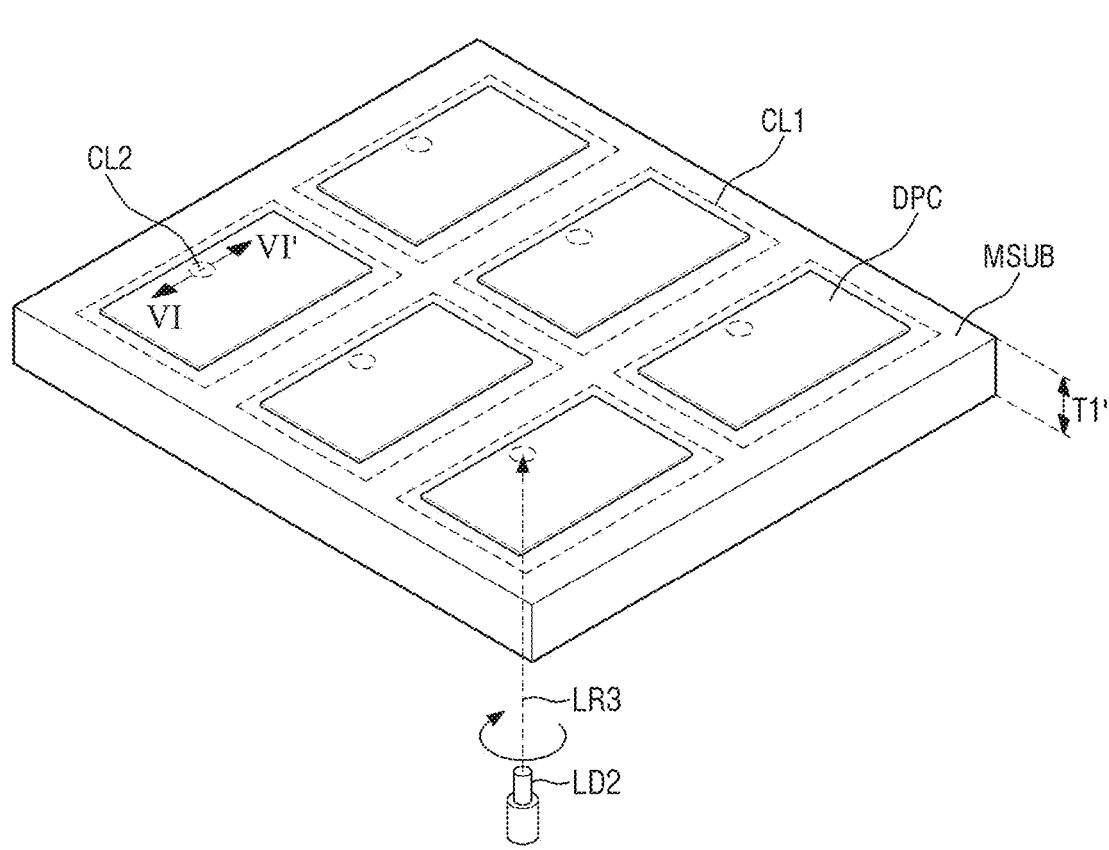
Figure 30:
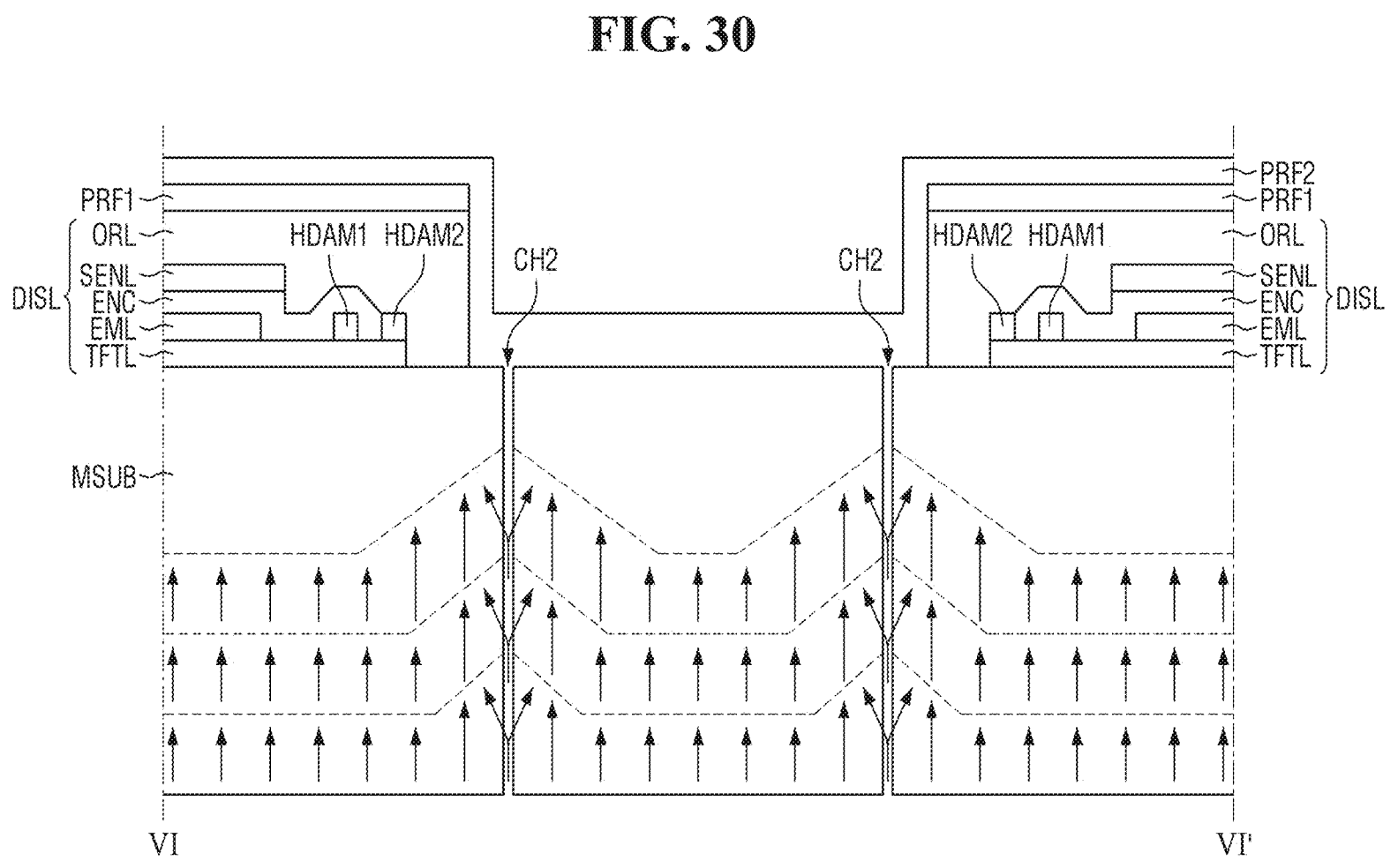

Fifth, as shown in FIGS. 29 and 30, a plurality of second laser irradiation areas CH2 for forming the through hole in each of the plurality of display cells is formed by irradiating a third laser LR3 on the second side of the mother substrate MSUB (S150 in FIG. 20).

FIG. 29 illustrates that step S150 is performed after step S140 is performed, although the present disclosure is not limited thereto. Steps S140 and S150 may be concurrently or substantially simultaneously performed through a plurality of laser modules to shorten the process time.

A second cutting line CL2 may be defined as a virtual line connecting the plurality of second laser irradiation areas CH2. The second cutting line CL2 may be formed by irradiating the second laser LR2 to form the plurality of second laser irradiation areas CH2 along the edge of the through hole TH. The second cutting line CL2 may depend on the shape of the through hole. For example, when the through hole TH has a circular planar shape, the second cutting line CL2 may be formed in a circular shape.

Various lasers may be used as the second laser LR2 and the third laser LR3 according to one or more embodiments, but the second laser LR2 and the third laser LR3 are the infrared beam Bessel beam having a wavelength of about 1030 nm in the present specification.

The depth of each of the plurality of first laser irradiation areas CH1 formed by the second laser LR2, and the depth (or sketch length) of each of the plurality of second laser irradiation areas CH2 formed by the third laser LR3, may be the same as each other, or different from each other. The depth of the first laser irradiation area CH1 may be defined as the depth (or sketch length) of the first laser irradiation area CH1, and the depth of the second laser irradiation area CH2 may be defined as the depth (or sketch length) of the second laser irradiation area CH2.

Each of the plurality of first laser irradiation areas CH1 may have the depth of about 225 μm or more from the first surface of the mother substrate MSUB. Because the thickness of the mother substrate MSUB is about 500 μm, each of the plurality of first laser irradiation areas CH1 may have the depth of about 200 μm to about 500 μm from the first surface of the mother substrate MSUB. Each of the plurality of second laser irradiation areas CH2 may have the depth of about 200 μm to about 500 μm from the first surface of the mother substrate MSUB.

As shown in FIG. 28, the depth (or sketch length) of the laser irradiation area may be adjusted according to the repetition rate, the processing speed, and the pulse energy of the second laser LR2 and the third laser LR3. When the depth (or sketch length) of the first laser irradiation area CH1 formed by the second laser LR2, and the depth (or sketch length) of the second laser irradiation area CH2 formed by the third laser LR3, are different, the second laser LR2 and the third laser LR3 may have differences in repetition rate, processing speed, pulse energy, and the like.

For example, the second laser LR2 may be irradiated with the repetition rate of about 10 kHz to about 250 kHz, the processing speed of about 10 mm/s to about 250 mm/s, and the pulse energy of about 10 uJ to about 300 uJ. However, it may be suitable to irradiate with the repetition rate of about 17.5 kHz to about 125 kHz, the processing speed of about 17.5 mm/s to about 125 mm/s, and the pulse energy of about 25 uJ to about 178 uJ in order for the second laser LR2 to have the depth of about 225 μm or more from the first surface of the mother substrate MSUB.

In addition, the third laser LR3 may be irradiated with the repetition rate of about 1 kHz to about 50 kHz, the processing speed of about 1 mm/s to about 50 mm/s, and the pulse energy of about 10 uJ to about 300 uJ. However, it may be suitable to irradiate with the repetition rate of about 10 kHz, the processing speed of about 10 mm/s, and the pulse energy of about 60 uJ to about 178 uJ for the third laser LR3 to have the depth of about 400 μm to amount 500 μm from the first surface of the mother substrate MSUB. For example, the third laser LR3 forms the circular second cutting line CL2, while the second laser LR2 forms the first cutting line CL1 along the edges of each of the plurality of display cells DPC. Therefore, the processing speed of the second laser LR2 may be greater than that of the third laser LR3.

Sixth, as shown in FIG. 30, a second protective film PRF2 is attached on the plurality of first protective films PRF1. (S160 of FIG. 20)

The second protective film PRF2 may be attached on the exposed mother substrate MSUB without being covered by the plurality of first protective films PRF1. The second protective film PRF2 may cover the plurality of first laser irradiation areas CH1 and the plurality of second laser irradiation areas CH2. The second protective film PRF2 may be an acid-resistant film for protecting the plurality of display cells DPC from the etchant in the etching process of the mother substrate MSUB to be performed in the next step.

Seventh, as shown in FIGS. 30, 31, 32, 33, and 34, the thickness of the mother substrate MSUB is reduced by spraying the etchant on the second surface of the mother substrate MSUB without a separate mask, at the same time, the mother substrate is cut along the plurality of first laser irradiation areas CH1 and second laser irradiation areas CH2, and the second protective film PRF2 is detached. (S170 of FIG. 20)

Figure 31:
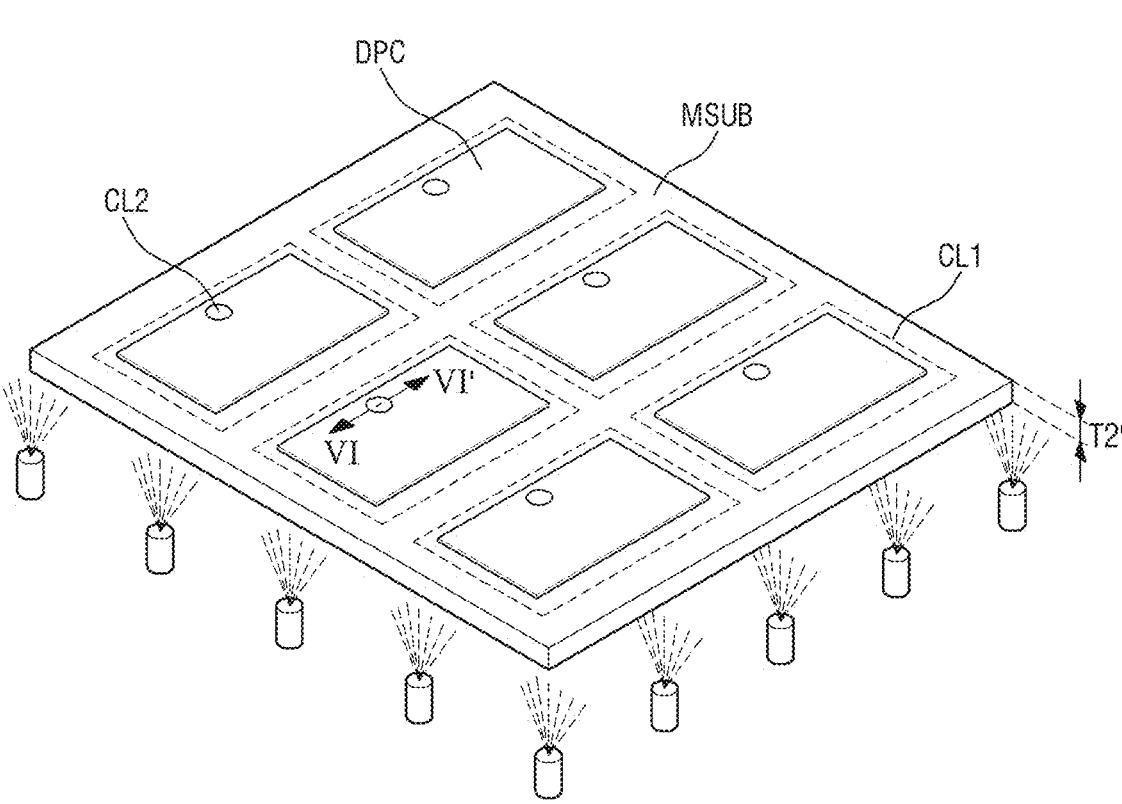
Figure 32:
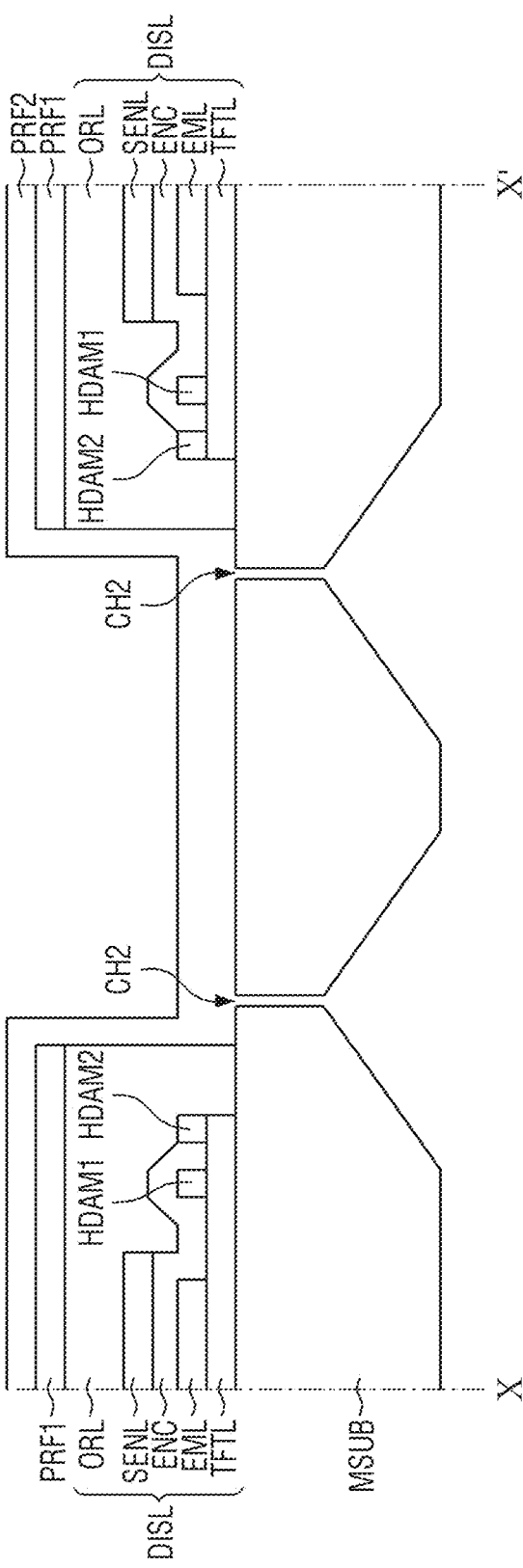
Figure 33:
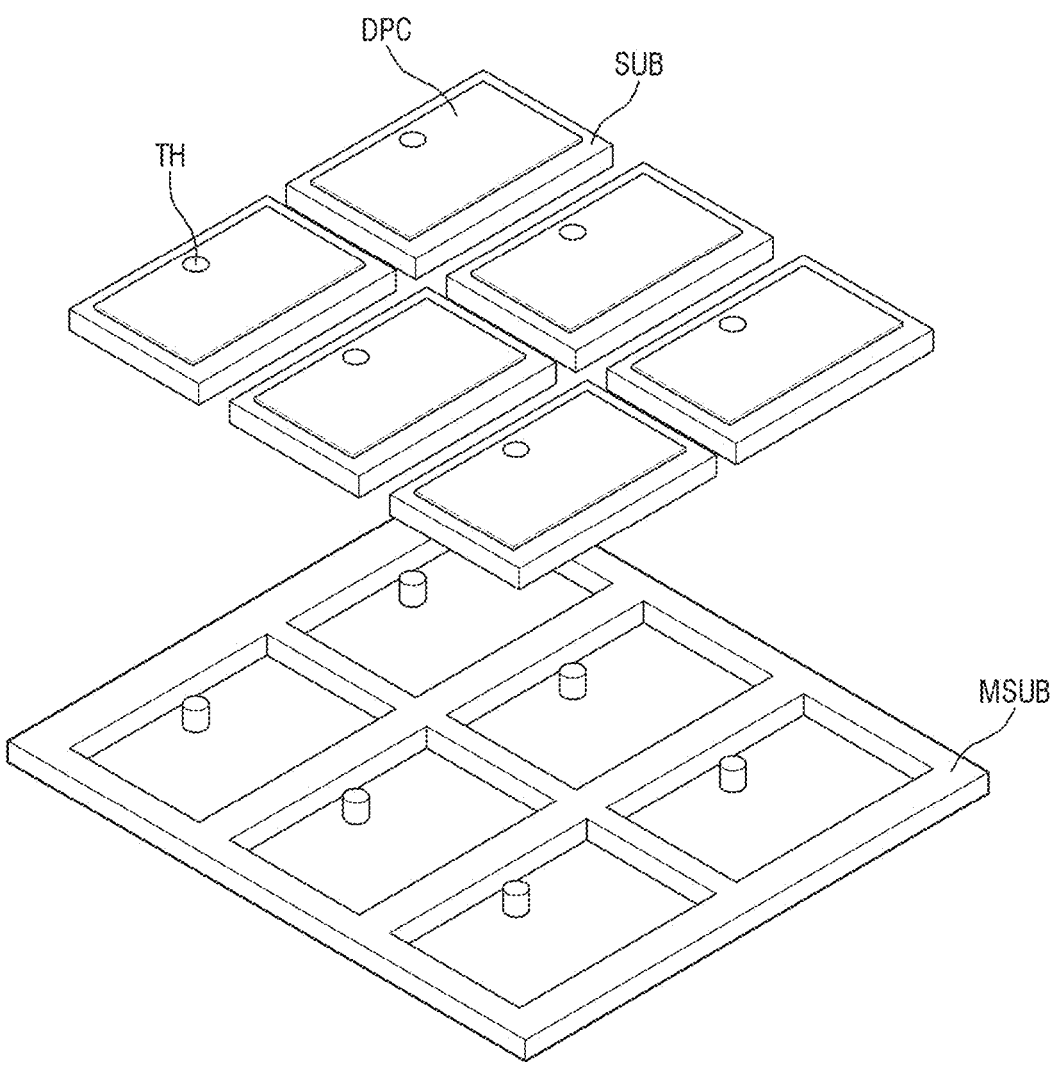

When the etchant is sprayed on the second surface of the mother substrate MSUB, the mother substrate MSUB may be reduced from a first thickness T1' (FIG. 29) to a second thickness T2' (FIG. 31). Because the mother substrate MSUB is etched without the separate mask, the mother substrate MSUB may be etched uniformly over the entire area of the second surface.

Each of the plurality of first laser irradiation areas CH1 may include a physical hole formed by the second laser LR2, and an area in which physical properties are changed by the laser as a periphery of the physical hole. Alternatively, each of the plurality of first laser irradiation areas CH1 may be an area whose physical properties are changed by the second laser LR2 without the physical hole. For this reason, the etch rate in each of the plurality of first laser irradiation areas CH1 by the etchant may be greater than the etch rate in other areas of the mother substrate MSUB to which the laser is not irradiated.

Each of the plurality of second laser irradiation areas CH2 may include the physical hole formed by the third laser LR3 and an area in which physical properties are changed by the laser as the periphery of the physical hole. Alternatively, each of the plurality of second laser irradiation areas CH2 may be an area whose physical properties are changed by the third laser LR3 without the physical hole. For this reason, the etch rate in each of the plurality of second laser irradiation areas CH2 by the etchant may be greater than the etch rate in other areas of the mother substrate MSUB to which the laser is not irradiated.

When the thickness of the mother substrate MSUB is reduced by the etchant and the etchant penetrates the plurality of first laser irradiation areas CH1 and the plurality of second laser irradiation areas CH2 formed by the second laser LR2 and the third laser LR3, a difference in etch rate may occur in an area in which the plurality of first laser irradiation areas CH1 and the plurality of second laser irradiation areas CH2 are not formed. For this reason, as shown in FIG. 16, the substrate SUB separated from the mother substrate MSUB may include the inclined surface IP1_4 located between the side surface SS_4 and the bottom surface BS.

In addition, as the etchant penetrates the plurality of first laser irradiation areas CH1 and the plurality of second laser irradiation areas CH2 formed by the second laser LR2 and the third laser LR3, the mother substrate MUSB may be separated along the first and second cutting lines CL1 and CL2. That is, each of the plurality of display cells DPC may be separated from the mother substrate MSUB.

Because the etchant does not penetrate the first surface of the substrate SUB separated from the mother substrate MSUB by the second protective film, while the second surface of the substrate SUB is etched by the etchant, differences may occur between the first surface and the second surface of the substrate SUB in roughness, hardness, light transmittance, light reflectance, local density, surface chemical structure, and the like.

After the etching process is completed, the second protective film PRF2 may be detached.

Figure 34:
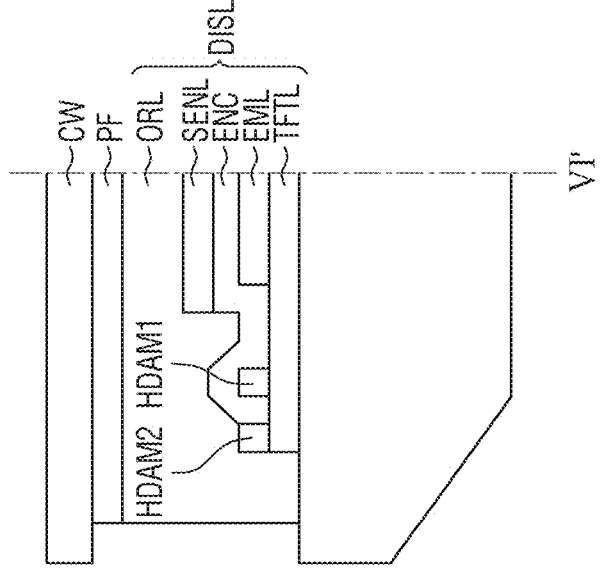
Figure 34:
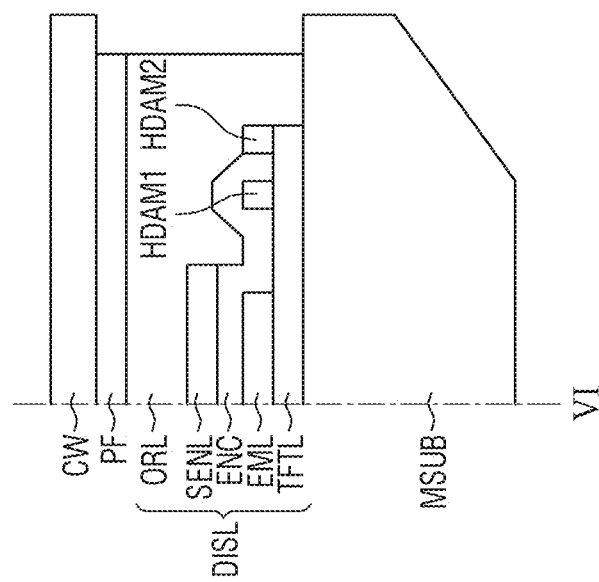

Eighth, as shown in FIGS. 34 and 35, the driving IC 200 and the circuit board 300 are attached to each of the plurality of display cells DPC, and the polarizing film PF and the cover window CW are attached after detaching the first protective film PRF1 from each of the plurality of display cells DPC. (S180 of FIG. 20)

As described above, because the thickness of the mother substrate MSUB may be reduced by using the etching process, the substrate SUB of each of the plurality of display cells DPC may be separated from the mother substrate MSUB, and the through hole TH may be formed, it is possible to increase the efficiency of the manufacturing process.

In addition, it is possible to reduce or prevent the generation of foreign substances due to the organic planarization layer ORL, and to reduce or prevent deformation of the organic planarization layer ORL by removing the organic planarization layer ORL at the edge of the substrate SUB and the through hole area through laser ablation. In addition, the transmittance of the substrate SUB is increased by removing the organic planarization layer ORL and the machinability may be improved by increasing the absorption rate of the laser in the laser-cutting process after laser ablation.

Meanwhile, in the above-described embodiments, the laser ablation process for removing the organic planarization layer ORL is first performed and then the display cells DPC are separated from the mother substrate MSUB, but the present disclosure is not limited thereto. The laser ablation process may be performed after the display cells DPC are separated from the mother substrate MSUB. For example, the organic planarization layer ORL located on the through hole TH may be removed through the laser-hole-cutting process. The inorganic layers of the first encapsulating inorganic layer TFE1, the second encapsulating inorganic layer TFE3, and the thin film transistor layer TFTL located on the through hole TH may be removed together with the organic planarization layer ORL. In this case, as shown in FIGS. 18 and 19, the organic planarization layer ORL may protrude further toward the through hole TH than the substrate SUB.

Figure 36:
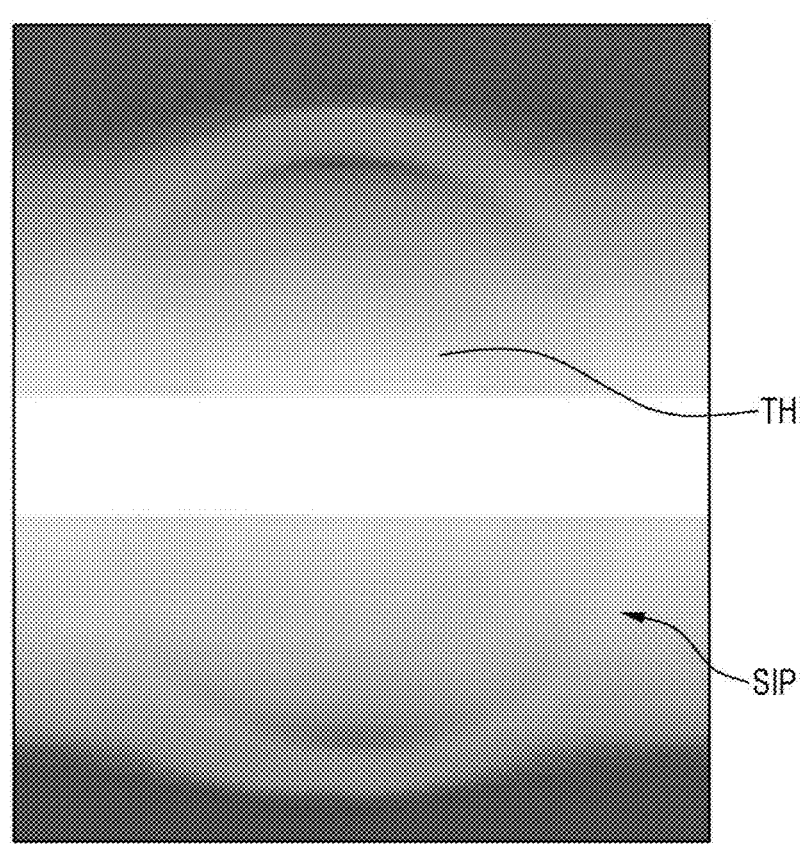
FIG. 36 is an image illustrating a through hole of a display device according to a comparative example.
Figure 37:
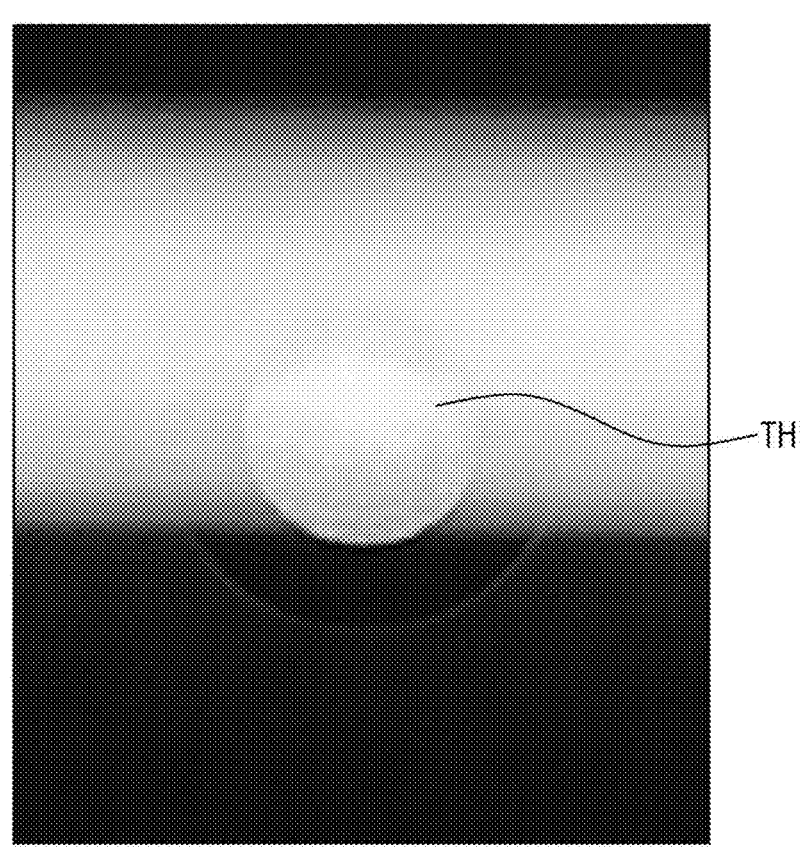
FIG. 37 is an image illustrating a through hole of a display device according to one or more embodiments.

FIG. 36 is an image illustrating a through hole of a display device according to a comparative example. FIG. 37 is an image illustrating a through hole of a display device according to one or more embodiments.

FIG. 36 illustrates the through hole of the display device in which the organic planarization layer ORL is not formed. FIG. 37 shows the through hole of the display device manufactured by removing the organic planarization layer ORL in the through hole TH area using the laser ablation process and performing the cutting process of the substrate SUB after forming the organic planarization layer ORL.

As shown in FIG. 36, a pattern SIP generated by reflection of external light by the inclined surface of the polarizing film in the peripheral area of the through hole TH appeared in the display device according to the comparative example. On the other hand, as shown in FIG. 37, a pattern did not appear in the display device according to the embodiments.

Accordingly, the display device according to embodiments of the present disclosure may reduce or prevent reflection of external light by forming the polarizing film flat without the inclined surface by forming the organic planarization layer.

In concluding the detailed description, those skilled in the art will appreciate that many variations and modifications can be made to the disclosed embodiments without substantially departing from the aspects of the present disclosure. Therefore, the disclosed embodiments are used in a generic and descriptive sense only and not for purposes of limitation.

What is claimed is:

1. A display device comprising:
    a substrate comprising a first surface, a second surface opposite to the first surface, a lateral side meeting the first surface, and an inclined surface between the lateral side and the second surface;
    a light-emitting element layer above the first surface of the substrate;
    dams surrounding the light-emitting element layer in plan view;
    an encapsulating layer covering the light-emitting element layer and the dams; and
    an organic planarization layer above the encapsulating layer, covering the encapsulating layer and the dams, extending to be adjacent to an edge of the substrate, and having a lateral side that forms an inclination, and that is spaced inwardly from the lateral side of the substrate, wherein a distance between the lateral side of the organic planarization layer and the lateral side of the substrate is less than a planar width of the inclined surface of the substrate.

2. The display device of claim 1, wherein the substrate comprises a display area in which the light-emitting element layer is located, a through hole in the display area, and a non-display area around the display area, and wherein the edge of the substrate is at the non-display area or the through hole.

3. The display device of claim 1, wherein the encapsulating layer comprises a first encapsulating inorganic film above the light-emitting element layer and the dams, an encapsulation organic layer above the first encapsulating inorganic layer, and a second encapsulating inorganic layer above the encapsulating organic layer.

4. The display device of claim 3, wherein the organic planarization layer directly contacts an upper surface of the second encapsulating inorganic layer, and wherein an angle between a side of the organic planarization layer and the upper surface of the second encapsulating inorganic layer is about 90 degrees or less.

5. The display device of claim 1, wherein a planar width of the lateral side of the organic planarization layer is in a range of about 10 μm to about 150 μm.

6. The display device of claim 1, wherein a distance between a point of the lateral side of the organic planarization layer and the lateral side of the substrate is about 50 μm or less.

7. The display device of claim 1, further comprising a polarizing film above the organic planarization layer, and directly attached to an upper surface of the organic planarization layer.

8. The display device of claim 1, wherein a distance between a point of the lateral side of the organic planarization layer and the lateral side of the substrate is less than a distance between the lateral side of the substrate and one of the dams that is adjacent to the lateral side of the substrate.

9. The display device of claim 1, further comprising a crack dam between the dams and the lateral side of the substrate, and covered by the organic planarization layer.

10. The display device of claim 9, wherein a distance between a point of the lateral side of the organic planarization layer and the lateral side of the substrate is less than a distance between the crack dam and the lateral side of the substrate.

11. A display device comprising:
a substrate defining a through hole;

a light-emitting element layer above the substrate;
dams surrounding the light-emitting element layer in plan view;
an encapsulating layer covering the light-emitting element layer and the dams; and
an organic planarization layer above the encapsulating layer, and protruding further than a lateral side of the substrate in the through hole.

12. The display device of claim 11, wherein the encapsulating layer comprises a first encapsulating inorganic layer above the light-emitting element layer and the dams, an encapsulation organic layer above the first encapsulating inorganic layer, and a second encapsulating inorganic layer above the encapsulating organic layer, and wherein the organic planarization layer directly contacts an upper surface of the second encapsulating inorganic layer.

13. The display device of claim 12, wherein a lateral side of the organic planarization layer is inclined, and wherein an angle between the lateral side of the organic planarization layer and a top surface of the second inorganic encapsulating layer is about 90 degrees or less.

14. The display device of claim 12, wherein a lateral side of the first encapsulating inorganic layer and a lateral side of the second encapsulating inorganic layer protrude outward from the lateral side of the substrate.

15. The display device of claim 14, wherein a lateral side of the organic planarization layer and the lateral side of the second encapsulating inorganic layer meet each other.

16. A display device comprising:
a substrate defining a through hole;
a light-emitting element layer above the substrate;
dams surrounding the light-emitting element layer in plan view;
an encapsulating layer covering the light-emitting element layer and the dams;
an organic planarization layer above the encapsulating layer, and protruding further than a lateral side of the substrate in the through hole; and
a thin film transistor layer between the substrate and the light-emitting element layer, and comprising:
a first buffer layer;
a gate insulating layer;
a first interlayer insulating layer; and
a second interlayer insulating layer,
wherein lateral sides of the first buffer layer, the gate insulating layer, the first interlayer insulating layer, and the second interlayer insulating layer protrude outwardly from the lateral side of the substrate.

* * * * *